(12) United States Patent
Willard

(10) Patent No.: US 12,205,954 B2
(45) Date of Patent: Jan. 21, 2025

(54) BUTTED BODY CONTACT FOR SOI TRANSISTOR AND AMPLIFIER CIRCUIT

(71) Applicant: pSemi Corporation, San Diego, CA (US)

(72) Inventor: Simon Edward Willard, Irvine, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 18/484,149

(22) Filed: Oct. 10, 2023

(65) Prior Publication Data

US 2024/0113126 A1 Apr. 4, 2024

Related U.S. Application Data

(63) Continuation of application No. 17/230,846, filed on Apr. 14, 2021, now Pat. No. 11,791,340, which is a
(Continued)

(51) Int. Cl.
| | |
|---|---|
| *H01L 27/12* | (2006.01) |
| *H01L 27/02* | (2006.01) |
| *H01L 29/06* | (2006.01) |
| *H01L 29/08* | (2006.01) |
| *H01L 29/10* | (2006.01) |

(Continued)

(52) U.S. Cl.
CPC ...... *H01L 27/1203* (2013.01); *H01L 27/0207* (2013.01); *H01L 29/0649* (2013.01); *H01L 29/0847* (2013.01); *H01L 29/1095* (2013.01); *H01L 29/42384* (2013.01); *H01L 29/4916* (2013.01); *H01L 29/78615* (2013.01);
(Continued)

(58) Field of Classification Search
CPC ............ H01L 27/1203; H01L 27/0207; H01L 29/0649; H01L 29/0847; H01L 29/1095; H01L 29/42384; H01L 29/4916; H03F 3/195
USPC ........................................................ 257/347
See application file for complete search history.

(56) References Cited

U.S. PATENT DOCUMENTS

| | | |
|---|---|---|
| 4,980,799 A | 12/1990 | Tobita |
| 5,479,034 A | 12/1995 | Hashimoto et al. |
| | (Continued) | |

FOREIGN PATENT DOCUMENTS

| | | |
|---|---|---|
| FR | 3005787 | 11/2014 |
| WO | 0148828 | 7/2001 |
| | (Continued) | |

OTHER PUBLICATIONS

Stowe, Scott C., Office Action received from the USPTO dated Jul. 9, 2019 for U.S. Appl. No. 15/483,923, 41 pgs.
(Continued)

*Primary Examiner* — Phuc T Dang
(74) *Attorney, Agent, or Firm* — Steinfl + Bruno LLP

(57) ABSTRACT

Systems, methods, and apparatus for an improved body tie construction are described. The improved body tie construction is configured to have a lower resistance body tie exists when the transistor is "off" (Vg approximately 0 volts). When the transistor is "on" (Vg>Vt), the resistance to the body tie is much higher, reducing the loss of performance associated with presence of body tie. Space efficient Body tie constructions adapted for cascode configurations are also described.

24 Claims, 48 Drawing Sheets

Related U.S. Application Data continuation of application No. 16/821,112, filed on Mar. 17, 2020, now Pat. No. 10,985,183, which is a continuation of application No. 16/239,446, filed on Jan. 3, 2019, now Pat. No. 10,629,621, which is a continuation of application No. 15/824,932, filed on Nov. 28, 2017, now Pat. No. 10,192,884, which is a continuation of application No. 15/078,930, filed on Mar. 23, 2016, now Pat. No. 9,842,858, which is a continuation-in-part of application No. 14/945,323, filed on Nov. 18, 2015, now abandoned.

(51) Int. Cl.
| | |
|---|---|
| H01L 29/423 | (2006.01) |
| H01L 29/49 | (2006.01) |
| H01L 29/786 | (2006.01) |
| H03F 3/195 | (2006.01) |
| H03F 3/213 | (2006.01) |
| H03F 3/217 | (2006.01) |

(52) U.S. Cl.
CPC ............ *H03F 3/195* (2013.01); *H03F 3/213* (2013.01); *H03F 3/2171* (2013.01); *H03F 2200/451* (2013.01)

(56) References Cited

U.S. PATENT DOCUMENTS

| | | | |
|---|---|---|---|
| 5,489,792 | A | 2/1996 | Hu et al. |
| 5,637,899 | A | 6/1997 | Eimori |
| 5,925,913 | A | 7/1999 | Draper |
| 6,225,665 | B1 | 5/2001 | Hirano |
| 6,294,817 | B1 | 9/2001 | Srinivasan et al. |
| 6,307,237 | B1 | 10/2001 | Erstad |
| 6,624,459 | B1 | 9/2003 | Dachtera et al. |
| 8,643,107 | B2 | 2/2014 | Sleight et al. |
| 9,842,858 | B2 | 12/2017 | Willard |
| 10,192,884 | B2 | 1/2019 | Willard |
| 10,629,621 | B2 | 4/2020 | Willard |
| 10,985,183 | B2 | 4/2021 | Willard |
| 11,791,340 | B2 | 10/2023 | Willard |
| 2004/0245577 | A1 | 12/2004 | Bhattacharyya |
| 2004/0256692 | A1* | 12/2004 | Kunz ............... H01L 27/088 257/E29.054 |
| 2006/0237726 | A1 | 10/2006 | Iwamatsu et al. |
| 2007/0241402 | A1 | 10/2007 | Hirano |
| 2008/0076196 | A1* | 3/2008 | Yamaguchi ....... H01L 29/78615 257/E29.281 |
| 2008/0237713 | A1 | 10/2008 | Doumae |
| 2010/0081239 | A1 | 4/2010 | Min et al. |
| 2013/0168769 | A1 | 7/2013 | Park |
| 2013/0208527 | A1 | 8/2013 | Peters et al. |
| 2013/0249006 | A1 | 9/2013 | Khakifirooz et al. |
| 2014/0070311 | A1 | 3/2014 | Yang |
| 2014/0070315 | A1 | 3/2014 | Levy et al. |
| 2014/0252472 | A1 | 9/2014 | Chen |
| 2014/0346601 | A1 | 11/2014 | Sugiura |
| 2017/0141126 | A1 | 5/2017 | Willard |
| 2017/0141134 | A1 | 5/2017 | Willard |
| 2017/0338251 | A1 | 11/2017 | Willard |
| 2018/0211973 | A1 | 7/2018 | Willard |
| 2019/0198531 | A1 | 6/2019 | Willard |
| 2020/0303419 | A1 | 9/2020 | Willard |
| 2021/0305279 | A1 | 9/2021 | Willard |

FOREIGN PATENT DOCUMENTS

| | | |
|---|---|---|
| WO | 2017087035 | 5/2017 |
| WO | 2017164904 | 9/2017 |

OTHER PUBLICATIONS

MIT Lincoln Laboratory, "MITLL Low-Power FDSOI CMOS Process" Application Notes, Jun. 2006, 40 pgs.
Ren, John Z., "Low Voltage SOI MOSFET with Suppressed Floating Body Effects", Department of Electrical and Computer Engineering, University of Toronto, 1999, 81 pgs.
Bernstein, et al., "SOI Circuit Design Concepts", Kluwer Academic Publishers, 2000, pp. 22-23.
Meierewert, Klaus, International Search Report and Written Opinion received from the EPO dated Sep. 8, 2016 for appln. No. PCT/US2016/040193, 12 pgs.
Meierewert, Klaus, International Search Report and Written Opinion received from the EPO dated Sep. 8, 2016 for appln. No. PCT/US2016/039894, 11 pgs.
Stowe, Scott C., Office Action received from the USPTO dated Sep. 13, 2016 for U.S. Appl. No. 14/945,323, 9 pgs.
Stowe, Scott C., Office Action received from the USPTO dated Feb. 21, 2017 for U.S. Appl. No. 14/945,323, 29 pgs.
Willard, Simon, Response filed in the USPTO dated Nov. 3, 2016 for U.S. Appl. No. 14/945,323, 4 pgs.
Dang, Phuc T., Office Action received from the USPTO dated Apr. 27, 2017 for U.S. Appl. No. 15/078,931, 6 pgs.
Peregrine Semiconductor Corporation, Demand and Amendment filed in the EPO dated Apr. 26, 2017 for appln. No. PCT/2016/039894, 30 pgs.
Willard, Simon, Response filed in the USPTO dated Jun. 21, 2017 for U.S. Appl. No. 15/078,930, 4 pgs.
Dang, Phuc T., Office Action received from the USPTO dated Jul. 20, 2017 for U.S. Appl. No. 15/078,931, 16 pgs.
Peregrine Semiconductor Corporation, Demand and Amendment filed in the EPO dated Jul. 3, 2017 for appln. No. PCT/US2016/040193, 38 pgs.
Willard, Simon, Response filed in the USPTO dated Aug. 14, 2017 for U.S. Appl. No. 15/078,930, 6 pgs.
Dang, Phuc T., Notice of Allowance received from the USPTO dated Sep. 22, 2017 for U.S. Appl. No. 15/078,930, 5 pgs.
Juhl, Andreas, Written Opinion received from the EPO dated Oct. 24, 2017 for appln. No. PCT/US2016/039894, 6 pgs.
Juhl, Andreas, Written Opinion received fromt he EPO dated Feb. 26, 2018 for appln. No. PCT/US2016/040193, 6 pgs.
Flohr, Chantal, International Preliminary Report on Patentability received from the EPO dated Mar. 27, 2018 for appln. No. PCT/US2016/039894, 24 pgs.
Juhl, Andreas, International Preliminary Report on Patentability received from the EPO dated Jun. 26, 2018 for appln. No. PCT/US2016/040193, 6 pgs.
Dang, Phuc T., Office Action received from the USPTO dated Jul. 10, 2018 for U.S. Appl. No. 15/824,932, 6 pgs.
Stowe, Scott C., Office Action received from the USPTO dated Nov. 2, 2018 for U.S. Appl. No. 15/483,923, 10 pgs.
PSemi Corporation, Response filed in the USPTO dated Jan. 18, 2019 for U.S. Appl. No. 15/483,923, 13 pgs.
Dang, Phuc T., Notice of Allowance received from the USPTO dated Nov. 21, 2018 for U.S. Appl. No. 15/824,932, 9 pgs.
PSEMI Corporation, Response filed in the USPTO dated Aug. 22, 2018 for U.S. Appl. No. 15/824,932, 10 pgs.
Dang, Phuc T., Office Action received from the USPTO dated Jul. 1, 2019 for U.S. Appl. No. 16/239,446, 12 pgs.
Dang, Phuc T., Notice of Allowance received from the USPTO dated Dec. 10, 2019 for U.S. Appl. No. 16/239,446, 10 pgs.
PSEMI Corporation, Response filed in the USPTO dated Aug. 30, 2019 for U.S. Appl. No. 16/239,446, 4 pgs.
PSEMI Corporation, Preliminary Amendment filed in the USPTO dated Aug. 30, 2019 for U.S. Appl. No. 16/239,446, 5 pgs.
Willard, Simon, Patent Application filed in the USPTO entitled "Butted Bod Contact for SOI Transistor", U.S. Appl. No. 14/945,323, filed Nov. 18, 2015, 85 pgs.
Dang, Phuc T., Office Action received from the USPTO dated Jul. 28, 2020 for U.S. Appl. No. 16/821,112, 15 pgs.
Dang, Phuc T., Notice of Allowance received from the USPTO dated Dec. 15, 2020 for U.S. Appl. No. 16/821,112, 8 pgs.

(56) References Cited

OTHER PUBLICATIONS

Yang, et al., English translation of Office Action received from the CNIPA dated Apr. 16, 2021 for appln. No. 1021041302562250, 8 pgs.
Dang, Phuc T., Office Action received from the USPTO dated Jan. 11, 2023 for U.S. Appl. No. 17/230,846, 23 pgs.
Dang, Phuc T., Notice of Allowance received from the USPTO dated Jun. 12, 2023 for U.S. Appl. No. 17/230,846, 8 pgs.

* cited by examiner

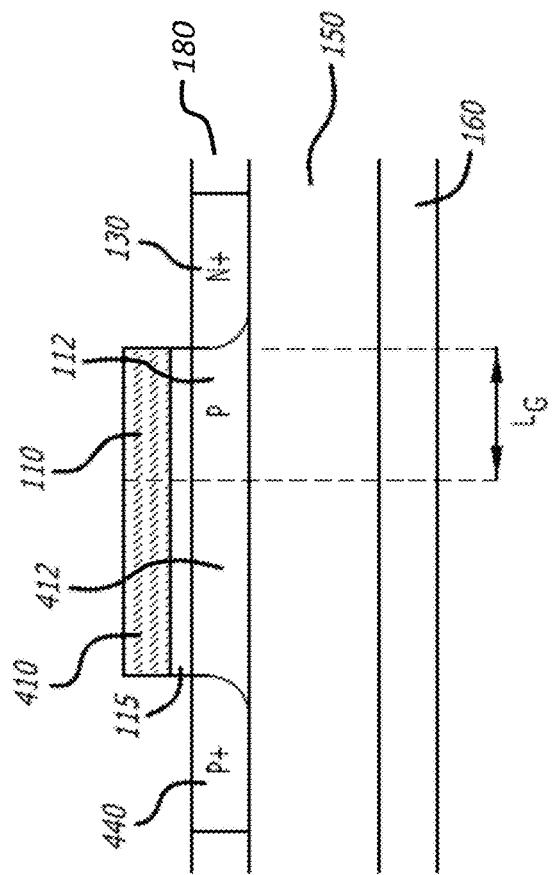
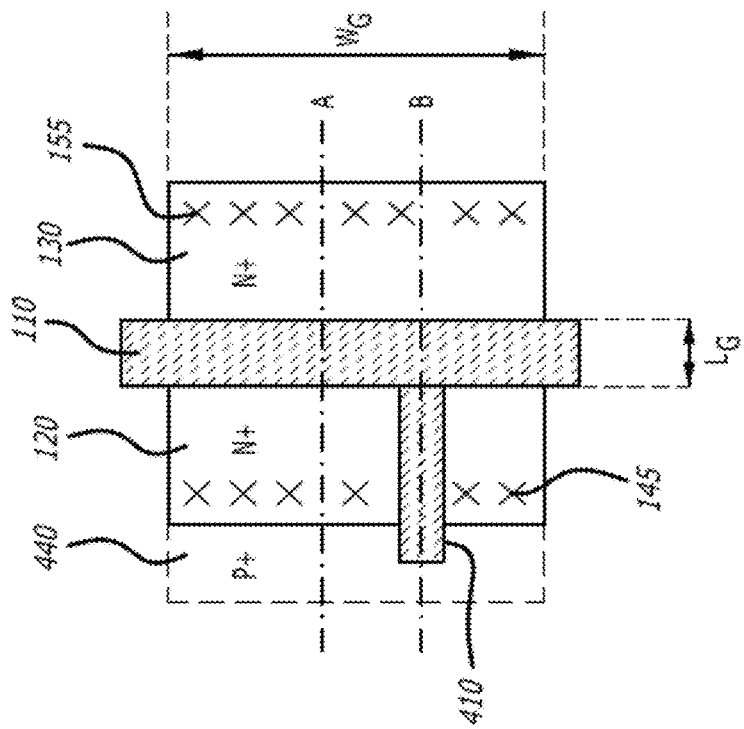
FIG. 4B
FIG. 4A

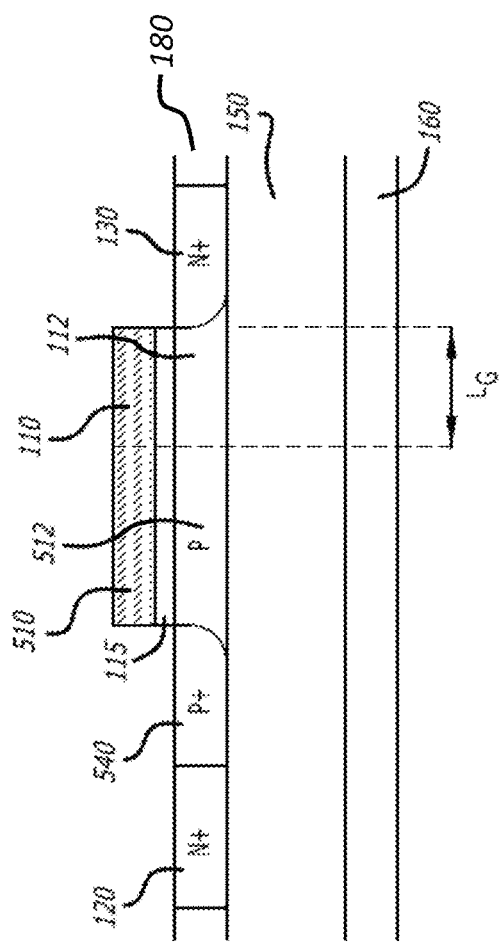
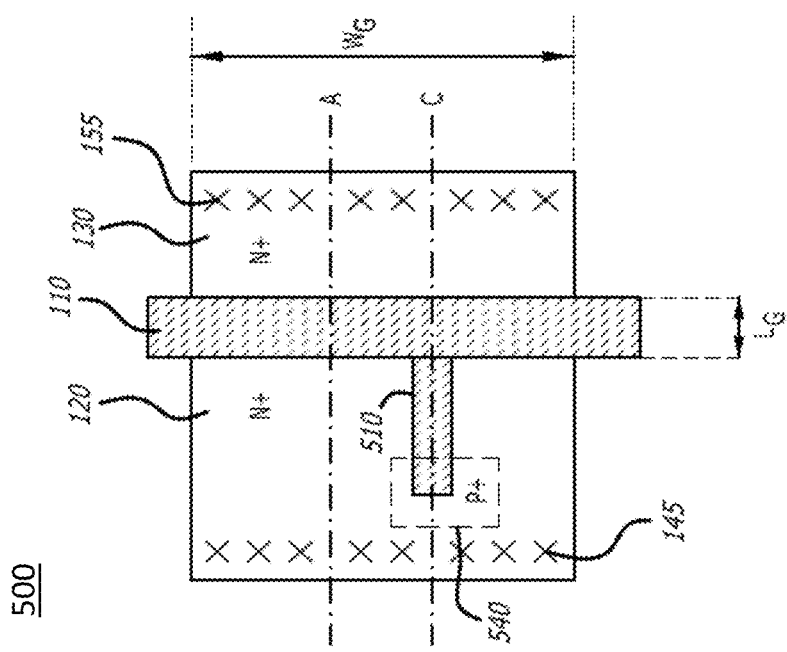
FIG. 5B
FIG. 5A

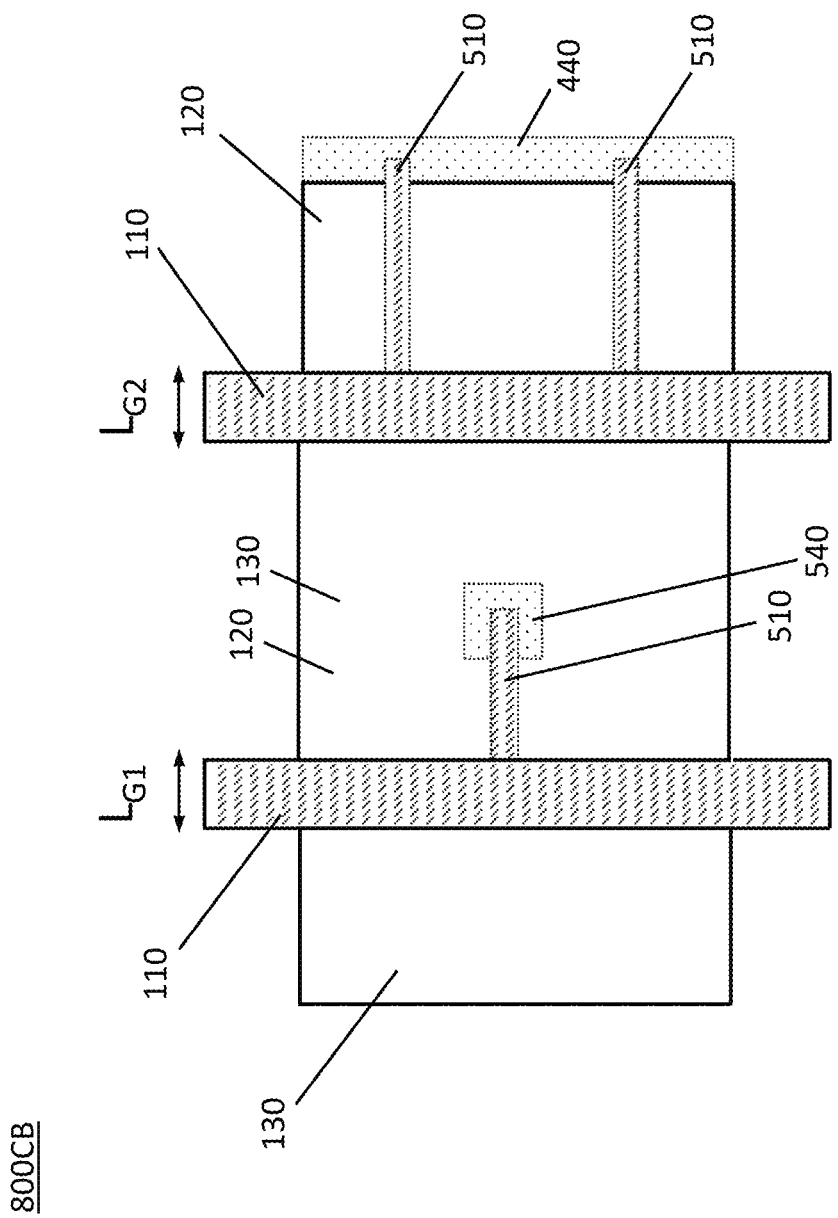

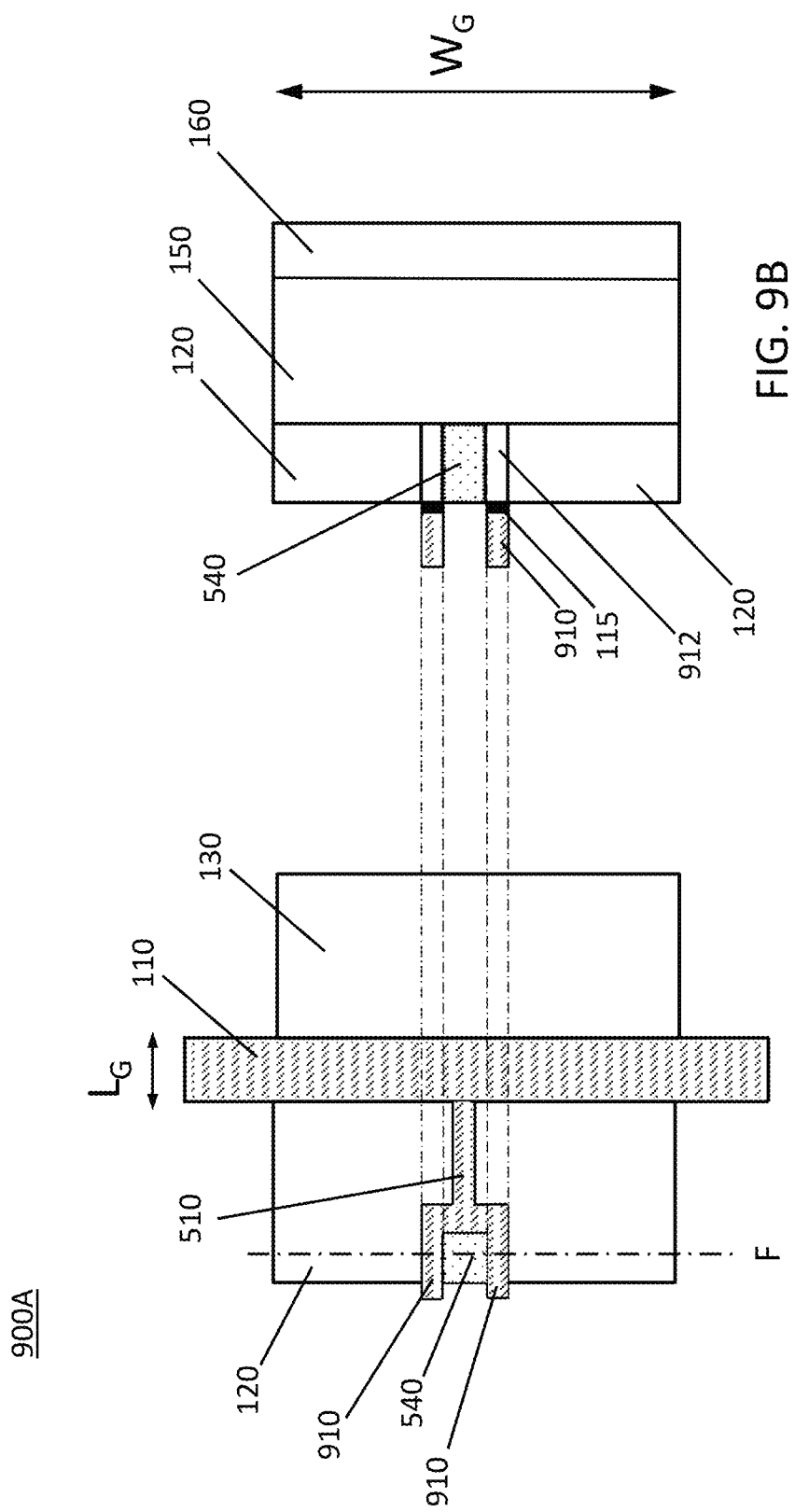

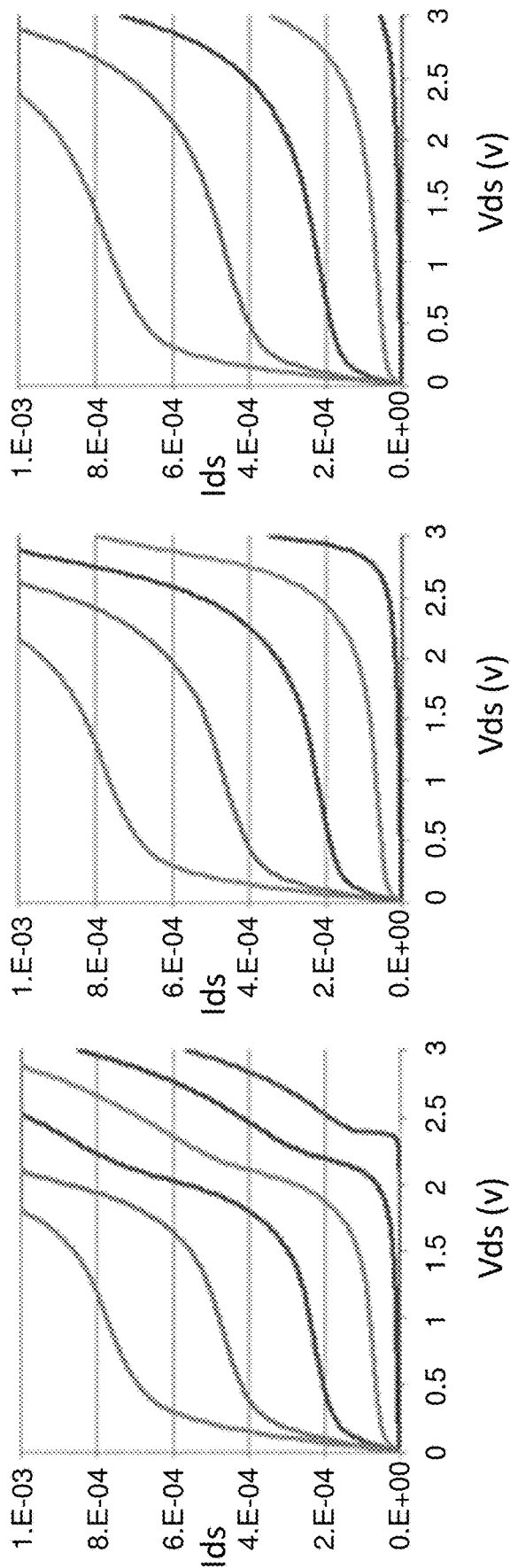

BUTTED BODY CONTACT FOR SOI TRANSISTOR AND AMPLIFIER CIRCUIT

CROSS REFERENCE TO RELATED APPLICATIONS CLAIMS OF PRIORITY

The present application is a continuation of U.S. application Ser. No. 17/230,846 filed on Apr. 14, 2021, now U.S. Pat. No. 11,791,340, issued Oct. 17, 2023; which is a continuation of U.S. application Ser. No. 16/821,112 filed on Mar. 17, 2020, issued on Apr. 20, 2021 as U.S. Pat. No. 10,985,183; which is continuation of U.S. application Ser. No. 16/239,446 filed on Jan. 3, 2019, now U.S. Pat. No. 10,629,621 issued Apr. 21, 2020; which is a continuation of U.S. application Ser. No. 15/824,932 filed on Nov. 28, 2017, now U.S. Pat. No. 10,192,884 issued on Jan. 29, 2019; which is a continuation of U.S. application Ser. No. 15/078,930 filed on Mar. 23, 2016, now U.S. Pat. No. 9,842,858 issued Dec. 12, 2017; which is a continuation in part of U.S. application Ser. No. 14/945,323 filed on Nov. 18, 2015, abandoned, and the disclosures of which are incorporated herein by reference in their entirety.

TECHNICAL FIELD

Various embodiments described herein relate generally to systems, methods, and apparatus for suppressing floating body effects in semiconductor devices.

BACKGROUND

Floating body silicon-on-insulator (SW) transistors are limited in operating voltage and power due to accumulated hot carriers which can increase the electrical potential of the body region of the SOI transistors. Body tied SOI transistors have been shown to extend voltage and power handling capabilities when compared to floating body SOI transistors.

Floating body SOI transistors have shown non-conducting hot carrier drift (e.g. magnitude of threshold voltage to decrease and the drain current to increase when in the non-conducting state) for drain to source voltage (Vds) larger than about 3.2 volts. Body tied devices have been shown to not suffer from this mechanism.

When a floating body transistor is conducting, a corresponding floating body effect can cause abrupt reduction of output impedance of the transistor under moderate bias at various levels of drain to source voltage of the transistor, which in turn can reduce analog gain of the transistor and increase complexity of a corresponding device modeling. Body tied devices (transistors) suppress the reduction of the output impedance and extend the range of higher output impedance to higher drain to source voltages.

Body ties on wide (large gate width) transistors with conventional (H-gate, T-gate) body tie structures become less effective in suppressing device degradations due to high resistance and increased parasitic capacitance which mitigate the ability to control the floating body effects. In particular, conventional body tied devices (e.g. H-gate, T-gate) are less effective in suppressing such degradations for large transistor width and the added drain to gate capacitance associated with conventional body tied devices can degrade performance in applications where such transistors are used, such as, for example, radio frequency (RF) amplifier applications.

Although body ties can improve transistor voltage capability, the on state conduction performance of the transistor can be degraded.

SUMMARY

It may be desirable to extend voltage and power handling capabilities for semiconductor devices, such as RF integrated circuits (ICs), by providing an improved body tie construction. Such semiconductor devices can include metal-oxide-semiconductor (MOS) field effect transistors (FETs), complementary metal-oxide-semiconductor (CMOS) FETs, and particularly to MOSFETs and CMOS-FETs fabricated on silicon-on-insulator (SOI) and silicon-on-sapphire (SOS) substrates. Such semiconductor devices fitted with the improved body tie construction according to the various teachings of the present disclosure can be used, for example, in radio frequency (RF) amplifiers, including, but not limited to, RF power amplifiers and cellular RF power amplifiers operating at various classes of operation, including, but not limited to, switching class D, E and F, saturated class B and C, and linear class A and A/B.

According to a first aspect of the present disclosure, a semiconductor structure is presented, the semiconductor structure comprising: a first gate polysilicon structure defining a first body region, the first body region having a first conductivity type; a second gate polysilicon structure defining a second body region, the second body region having the first conductivity type; a first drain region adjacent to the first body region having a second conductivity type; a first source region adjacent to the first body region having the second conductivity type; a second source region adjacent to the second body region having the second conductivity type; a second drain region adjacent to the second body region having the second conductivity type, the first source region and the second drain region defining a first common source/drain region having the second conductivity type; a first non-conductive isolation region configured to form an interruption in the second body region to divide the second body region in two separate second body regions; at least one first body contact region of the first conductivity type formed within the first common source/drain region separate from the first and the second body regions and abutting the first non-conductive isolation region; and at least one first body tab of the first conductivity type extending across the first common source/drain region in contact with the first body region and the at least one first body contact region, wherein the first non-conductive isolation region, the at least one first body contact region and the at least one first body tab define a first butted body tie structure.

According to a second aspect of the present disclosure, a semiconductor structure comprising a plurality of transistors is described, the semiconductor structure comprising: an insulating layer; a silicon layer overlying the insulating layer; active regions formed in the silicon layer, the active regions extending through the silicon layer to contact the insulating layer, the active regions comprising body regions, source regions and drain regions of one or more fingers of each transistor of the plurality of transistors configured as a cascode stack arranged from top to bottom, wherein for each two consecutive transistors of the cascode stack, a source region of a finger of a top transistor and the drain region of a finger of a bottom transistor of the each two consecutive transistors are formed in a common source/drain region of the silicon layer; and at least one butted body tie structure associated to the top finger, comprising: i) a non-conductive isolation region; ii) a body contact region formed within the common source/drain region of the fingers of two consecutive transistors separate from the body regions of the fingers and abutting an isolation region of the non-conductive isolation region; and iii) a body tab region formed in the silicon layer in contact with the body region of the finger of the top transistor and the body contact region, wherein the at least one non-conductive isolation region is configured to: form an interruption in a region of the silicon layer which defines the body region of the finger of the bottom transistor to divide said body region in separate body regions, and extend the interruption in a region of the silicon layer which defines body regions and common source/drain regions of fingers of one or more consecutive transistors adjacent to the bottom transistor to divide said regions in separate regions.

According to a third aspect of the present disclosure, a method for providing a body tie to transistors arranged in a cascode configuration is provided, the cascode configuration comprising: a first gate polysilicon structure defining a first body region, the first body region having a first conductivity type; a second gate polysilicon structure defining a second body region, the second body region having the first conductivity type; a first drain region adjacent to the first body region having a second conductivity type; a first source region adjacent to the first body region having the second conductivity type; a second source region adjacent to the second body region having the second conductivity type; a second drain region adjacent to the second body region having the second conductivity type, and the first source region and the second drain region defining a first common source/drain region having the second conductivity type; the method comprising: forming, by way of a first non-conductive isolation region, an interruption in the second body region to divide the second body region in two separate second body regions; forming at least one first body contact region of the first conductivity type within the first common source/drain region separate from the first and the second body regions and abutting the first non-conductive isolation region; and forming at least one first body tab of the first conductivity type extending across the first common source/drain region in contact with the first body region and the at least one first body contact region, wherein the first non-conductive isolation region, the at least one first body contact region and the at least one first body tab define a first butted body tie structure.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1A.

FIG. 3A.

FIG. 4B shows a cross-sectional view along line B of the transistor device in FIG. 4A.

FIG. 5A shows a top view of an N-type MOSFET transistor with a butted body contact according to an alternate embodiment of the present disclosure.

FIG. 5B shows a cross-sectional view along line C of the transistor device in FIG. 5A.

FIGS. 8C-8H show top views of stacked transistors with butted body contacts according to various embodiments of the present disclosure.

FIG. 9A shows a top view of a transistor with an isolated butted body contact.

FIG. 9B shows a cross-sectional view along line F of the transistor device in FIG. 9A.

FIGS. 12A-12C show graphs representing the impact of number of body tabs of a butted body tied transistor according to the present invention on drain to source current versus drain to source voltage response of a an identical transistor device.

FIG. 22 shows such space efficient butted body tie provided to each finger of the top transistor $T_B$.

FIG. 23 shows such space efficient butted body tie provided to each finger of the top transistor $T_E$.

DETAILED DESCRIPTION

Figure 1B:
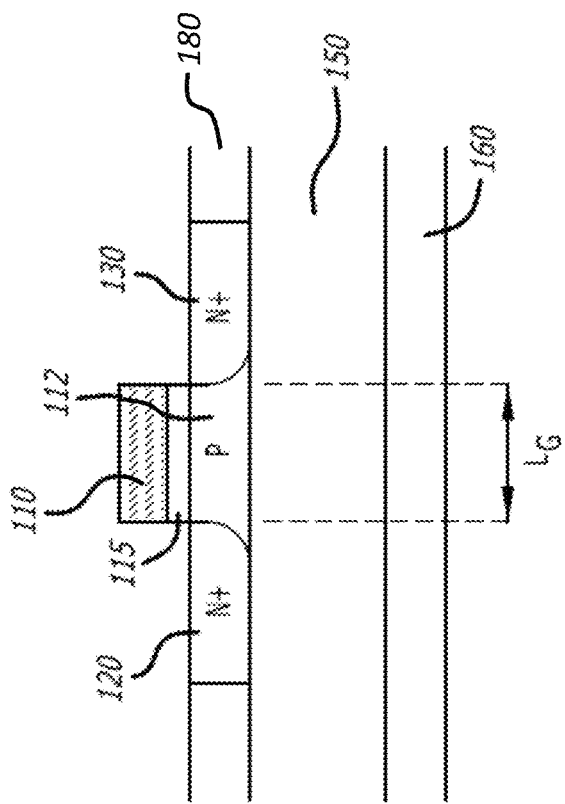
FIG. 1B shows a cross-sectional view along line A of the transistor device in FIG. 1A.

Throughout this description, embodiments and variations are described for the purpose of illustrating uses and implementations of the inventive concept. The illustrative description should be understood as presenting examples of the inventive concept, rather than as limiting the scope of the concept as disclosed herein.

Apparatus that provides all the benefits of conventional body tied semiconductor devices, such as H-gate and T-gate MOSFET devices, without the limitations and degradations associated with those constructions are described in the present disclosure. Methods for making and using such apparatus are also described.

A butted body contact in a semiconductor device, as per the various embodiments of the present disclosure, can improve operating performance of the semiconductor device. As used herein, the expressions "butted body contact", "butted body tie", and "butted body tied" are equivalent, and refer to the various methods and apparatuses according to the present disclosure, described in the following paragraphs with support from the various corresponding figures, for providing a body tie to a semiconductor device. In an exemplary case of a transistor device, such butted body tie can be provided by "tying", via a conduction path of a desired conductivity (e.g. resistivity), a body region of the transistor device to a source region of the transistor device. Alternatively, the butted body tie can be provided as an open contact for tying the body region of the transistor device to any desired external potential provided at the open contact, the open contact being resistively connected to the body region of the transistor device via a conduction path of a desired conductivity.

A butted body tie according to the various embodiments of the present disclosure can be implemented via provision of some additional structures to the semiconductor device, such as a "body tab" exemplified by item (512) of FIG. 5B, a "polysilicon tab" exemplified by item (510) of FIG. 5A, and a "body contact region" exemplified by item (540) of FIGS. 5A and 5B. Such structures and any other related to the implementation of the butted body tie according to the present disclosure will be further described in the following paragraphs.

As used herein, a body tab (e.g. item (512) of FIG. 5B) is a region of a same type doping as a body region (e.g. item (112) of FIG. 5B) under a gate polysilicon structure (e.g. item (110) of FIGS. 5A-5B) of a semiconductor device (i.e. transistor body, transistor channel, transistor conduction channel) which branches out from, and is contiguous with, the body region under the gate polysilicon structure of the semiconductor device, and extends to or through a source region (e.g. item (120) of FIGS. 5A-5B) or a drain region of the semiconductor device. In one exemplary embodiment of the present disclosure, such body tab can be created with a corresponding polysilicon tab (e.g. item (510) of FIG. 5A) branching out from the gate polysilicon structure of the device, and therefore can be an integral part of the gate polysilicon structure. The polysilicon tab is used as a mask to prevent doping of a semiconductor region underneath the polysilicon tab and therefore creating the body tab.

Figure 5C:
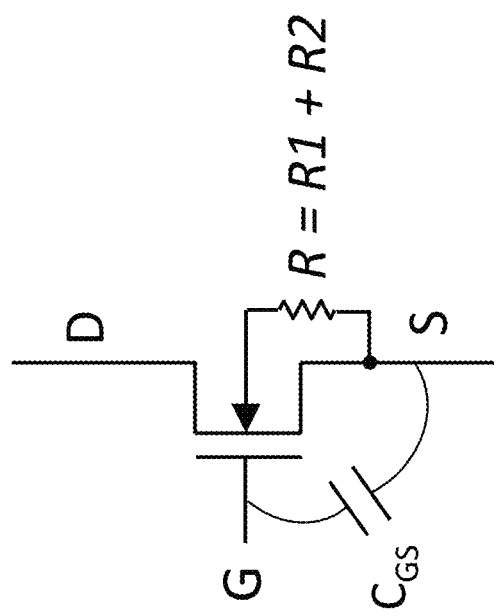
FIG. 5C shows a schematic representation of the transistor device of FIGS. 4A and 5A.

As used herein, a body contact region (e.g. item (540) of FIGS. 5A-5B) is a region of a same type doping as the body region (e.g. item (112) of FIG. 5B) which is used to provide a low resistivity conduction path to a desired potential to be applied to the body region of the device. Therefore, the body tab (e.g. item (512) of FIG. 5B) provides a conduction path between the body region and the body contact region of a first resistivity (e.g. R1 of FIG. 5C), and the body contact region provides a conduction path to a desired body tie potential of a second resistivity (e.g. R2 of FIG. 5C).

As presented in the following sections of the present disclosure, a butted body contact according to the various embodiments of the present disclosure can be provided by connecting one or more body tabs to a body region of the device. According to various embodiments of the present disclosure later described, such body tab makes contact with a body contact region which has a same type doping as the body region under the gate polysilicon structure. According to various embodiments of the present disclosure, doping of the body contact region can have an associated concentration similar to, less than or more than, an associated doping concentration of the body region. According to various embodiments of the present disclosure later described, the body contact region can be created within the source region neighboring the gate polysilicon structure, or can be created in regions adjacent to the source region neighboring the gate polysilicon structure. Alternate implementations where the body contact region is within a drain region of the semiconductor device are also possible.

The embodiments as described herein are exemplified by an N-type MOSFET device. A person of ordinary skill in the art will readily apply the inventive concepts as disclosed herein to other types of semiconductor devices, such as a P-type MOSFET device, by applying different types of doping schemes as appropriate. The embodiments according to the present invention can also be applied to extended drain devices, such as laterally diffused metal oxide semiconductor (LDMOS) devices, and other gated transistors or devices.

Semiconductor devices with a butted body contact, according to the various embodiments of the present disclosure, may include semiconductor devices formed on silicon-on-insulators (SOI), including field effect transistors (FET). The FET devices may include complementary metal-oxide-semiconductor (CMOS), metal-oxide-semiconductor field-effect transistor (MOSFET), and other type field-effect transistor (FET) devices. The silicon-on-insulator (SOI) may include silicon-on-sapphire (SOS) in an embodiment.

As used herein, MOSFET P-body (e.g. item (112) of FIG. 5B), P-body, P− body region and body region, refer to the P-doped silicon under the gate polysilicon structure (e.g. item (110) of FIGS. 5A-5B), which during operation, provides a conduction channel to the MOSFET. The body region and the body tab (e.g. item (512) of FIG. 5B) create a contiguous P-doped region under the gate polysilicon structure and the polysilicon tab (e.g. item (510) of FIGS. 5A-5B).

In one embodiment according to the present disclosure, the P-doped silicon under a distal terminal of the polysilicon tab (body away from the gate polysilicon structure) is in contact with a P+ doped region of the semiconductor device (the body contact region). As mentioned above, such P+ doped region which defines the body contact region is a region of a same type doping as the body region under the gate polysilicon structure and can have any doping concentration, not limited to a P+ doping.

In one exemplary embodiment according to the present disclosure, the body contact region can be in a square or rectangular shape. As will be described in later sections of the present disclosure, the body contact region can provide a low resistivity conduction path to a desired body tie potential via a metal contact or via a low resistivity layer atop the body contact region, such as a silicide layer. Furthermore, the body contact region can either be in contact with a source region of the semiconductor device to provide a source body tie, or be isolated from any active region (e.g. source/drain regions) of the device such as to allow provision of any potential to the body (decoupled from the source potential).

Figure 7B:
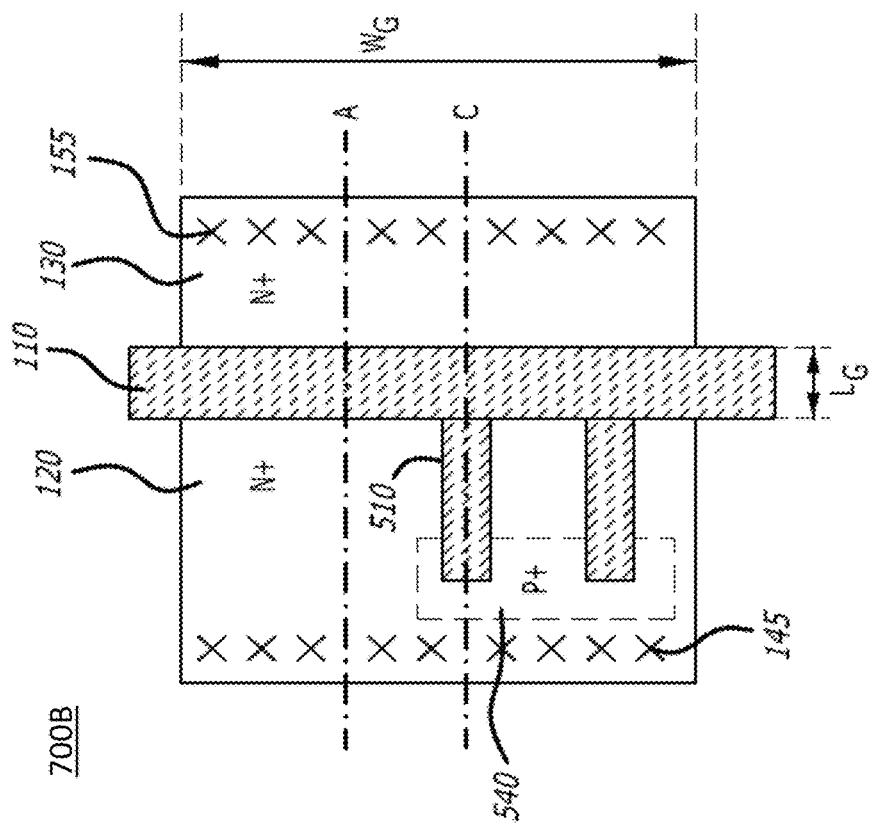
FIGS. 7A and 7B show top views of alternate embodiments of the embodiment shown in FIG. 6.
Figure 7A:
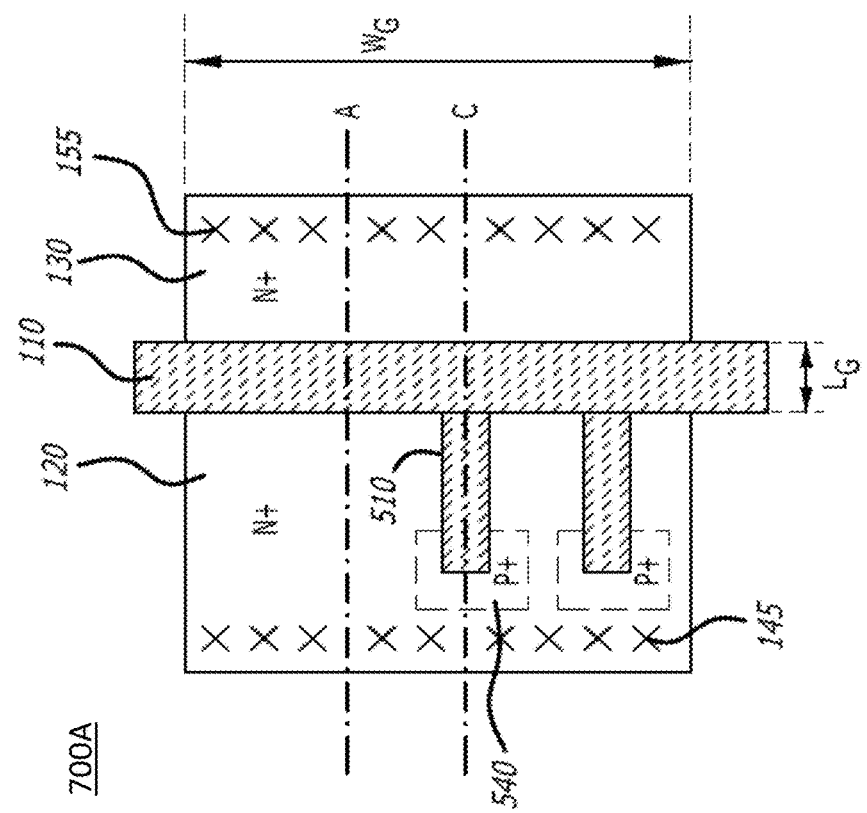

In one embodiment according to the present disclosure, a plurality of polysilicon tabs can be provided for a same gate polysilicon structure (branching out from the gate polysilicon), where a corresponding body tab (P-doped region underneath a polysilicon tab) is connected to a different and separate body contact region (e.g. FIG. 7A later described).

In another embodiment according to the present disclosure, a plurality of polysilicon tabs are provided for a same gate polysilicon and corresponding body tabs can be connected to a same contiguous body contact region (e.g. FIG. 7B later described).

In one embodiment according to the present disclosure, the body tab makes contact with the body contact region at the distal end of the body tab away from the body region of the gate.

In one embodiment according to the present disclosure, the MOSFET transistor comprises a plurality of fingers with associated plurality of gate polysilicon structures, where a corresponding polysilicon tab is connected to each gate polysilicon structure (e.g. FIGS. 8A-8B later described).

In yet another embodiment of the present disclosure, body tabs corresponding to polysilicon gates of neighboring fingers can be connected to a same contiguous P+ doped region (e.g. FIG. 8B later described).

In yet another embodiment of the present disclosure, polysilicon tabs branching out from polysilicon gates of neighboring fingers can be joined (e.g. FIG. 8B later described).

According to some embodiments of the present disclosure, the body contact region connected to the distal end of a body tab (away from the body region) is created inside a source region of the MOSFET transistor, thereby creating a P+ doped region inside the N+ doped source region. According to yet another embodiment of the present disclosure, such body contact region is created in a region adjacent to and in contact with the source region of the MOSFET transistor. It should be noted that although the body contact region is described as a P+ doped region, this should not be considered as limiting the scope of what the inventors consider their invention, as various doping levels of the body contact region, including a doping similar to the doping of the body region, can also be used in the butted body contact invention.

Further clarification of the above embodiments according to the present disclosure will be provided in the ensuing sections of the present disclosure with references to associated figures.

Figure 1A:
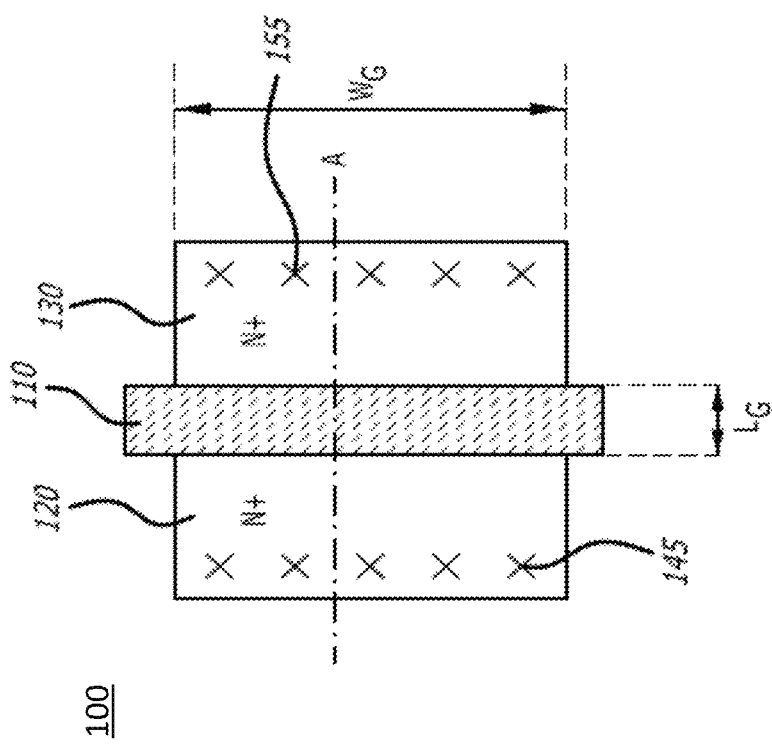
FIG. 1A shows a top view of an N-type MOSFET transistor device.

FIG. 1A shows a top view of an N-type SOI MOSFET device (100). A gate finger (110) is shown to be located between a source region (120) and a drain region (130). The gate finger (110) has a length of L G and a width of $W_G$. In one aspect, the gate finger can be made via a gate polysilicon structure (110) which can block implantation of dopant ions used to dope the neighboring source and drain regions of the MOSFET. A person of ordinary skill in the art readily knows that a multi-finger SOI device can have a plurality of such fingers, where each finger can comprise a corresponding gate polysilicon structure (110), a drain region (130) with corresponding drain contacts (155) and a source region (120) with corresponding source contacts (145). In some embodiments, neighboring fingers can share a corresponding drain and/or source region.

FIG. 1B shows a cross sectional view of the N-type SOI MOSFET device (100) along line A of FIG. 1A. In one aspect, the gate polysilicon structure (110) is shown to be laid over an insulating gate silicon oxide layer (115). In one aspect, the body region (112) under the gate polysilicon structure (110) is doped with a P-type dopant (P-body), and the source (120) and drain (130) regions are heavily implanted with an N-type dopant (N+). As shown in the cross sectional view of FIG. 1B, regions (112, 120, 130) of the SOI MOSFET device are created atop a buried oxide (BOX) layer (150) formed on a semiconductor substrate (160), and therefore, due to the insulating nature of the BOX layer (150), a conduction path between the regions (112, 120, 130) and the semiconductor substrate (body) is not provided in the SOI MOSFET depicted in FIGS. 1A and 1B. A person skilled in the art readily knows that the regions (112, 120, 130) of the SOI MOSFET device (100) can be formed in a thin layer of silicon (180) which overlies the insulating layer (150), such regions (112, 120, 130) extending through the depth of thin layer of silicon (180) to reach the insulating layer (150). Accordingly, and as known in the art, the SOI MOSFET device (100) can be referred to as a thin-film SOI MOSFET, the thin-film referring to the thin layer of silicon (180). It should be noted that the various embodiments according to the present disclosure which will be described below can be implemented in thin-film SOI MOSFET devices.

Figure 1C:
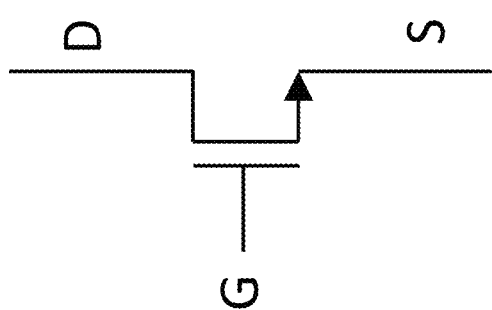
FIG. 1C shows a schematic representation of the transistor device of FIG. 2A shows a top view of an N-type MOSFET transistor device with a T-gate body tie according to a prior art embodiment.

The SOI MOSFET device (100) depicted in FIGS. 1A and 1B does not provide a body tie, which as known to the skilled person is a connection between the P-body and a reference (fixed) potential, such as, for example, the source region of the device. Such an SOI device, schematically represented in FIG. 1C, is a floating body device, and is therefore susceptible to the shortcomings discussed in the above sections of the present disclosure.

Figure 2B:
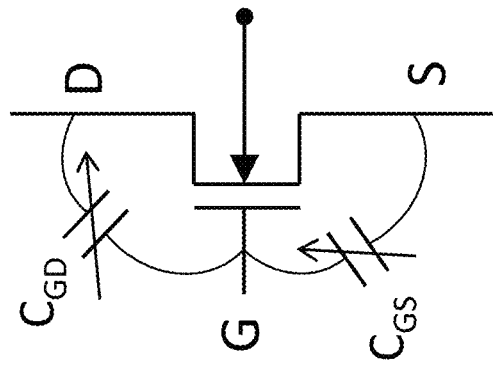
FIG. 2B shows a schematic representation of the transistor device of FIG. 2A.
Figure 2A:
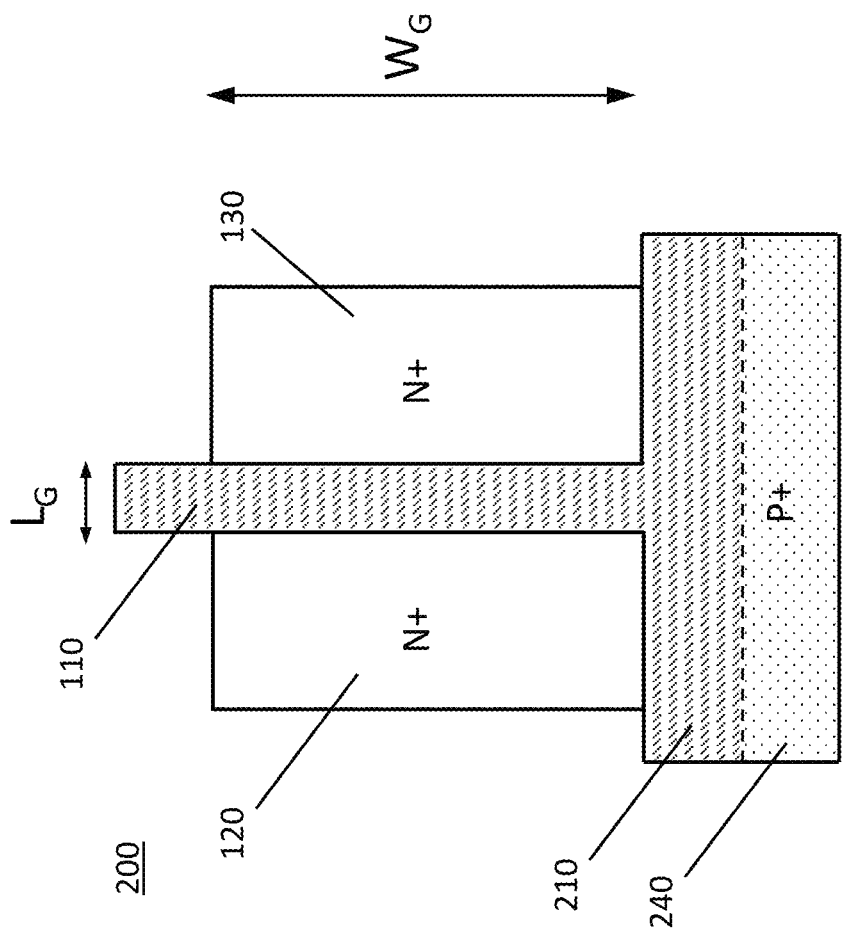
FIG. 2C shows a top view of an N-type MOSFET transistor device with an H-gate body tie according to a prior art embodiment.

FIG. 2A represents a top view of an N-type MOSFET transistor (200) with a T-gate body tie structure according to a prior art embodiment. In the prior art embodiment represented by FIG. 2A, the gate polysilicon structure (110) is extended to include a structure (210) which complements the traditional structure (110) used to create a conduction channel (i.e. body region, channel region) of the device (200). Accordingly, the T-shaped polysilicon structure (110, 210) allows formation of a corresponding P-body region underneath the polysilicon which is in contact with a P+ region (240), latter P+ region (240) allowing a low resistance contact to the P-region under the polysilicon extension region (210) and thus to the transistor body under the polysilicon region (110). The P-body region underneath the polysilicon region (210) also allows for isolation of the source (120) and the drain (130) regions with respect to the highly doped region (240). The skilled person will understand that the T-gate body tie structure of the prior art body tied transistor (200) allows the P+ region (240) to be in electrical contact with a constant voltage node such as to provide a conduction path for a floating charge in the channel region of the transistor (200). According to some implementations, the P+ region (240) can be in contact with an overlying metal layer which can be connected to a constant voltage. Such constant voltage can be a voltage applied to a source terminal of the transistor, or a reference potential such as ground or a fixed (negative) voltage. The person skilled in the art will understand that the top view depicted in FIG. 2A is a simplified top view of the transistor (200), as only the relevant structures/elements to the description of the (prior art) embodiment are shown. The person skilled in the art will understand that other structures/elements, such as drain/source contacts, are omitted from such figure so as to allow for more clarity. In general, same approach is taken in the rendering of the various figures which make part of the present disclosure.

The T-gate body tie structure used in the N-type transistor (200) can reduce the floating body effects present in the transistor (100) of FIG. 1A. However, the T-gate body tie, via the extended polysilicon structure (210) neighboring the drain and source regions (130, 120), provides for added parasitic capacitance ($C_{SG}$) between the gate and the source of the transistor (200), as well as added parasitic capacitance ($C_{DG}$) between the gate and the drain of the transistor (200). Such parasitic capacitances ($C_{SG}$, $C_{DG}$) are not of a constant capacitance value as their value can change as a function of the voltage applied to the transistor terminals. Latter parasitic capacitances ($C_{SG}$, $C_{DG}$) are shown in FIG. 2B (as variable capacitances), which schematically represents transistor (200), including the body contact which provides for a connection of a desired potential. The person skilled in the art readily knows the ill effects of such parasitic capacitances in the performance of the transistor (200), which, amongst others, can reduce a switching speed of the transistor as well as reduce characteristic operating frequencies $f_T$ and $f_{max}$ of the transistor (200) using the T-gate body tie. Due to the non-constant nature of the parasitic capacitances ($C_{SG}$, $C_{DG}$), such capacitances can also negatively affect linearity of the prior art transistor (200).

Figure 2C:
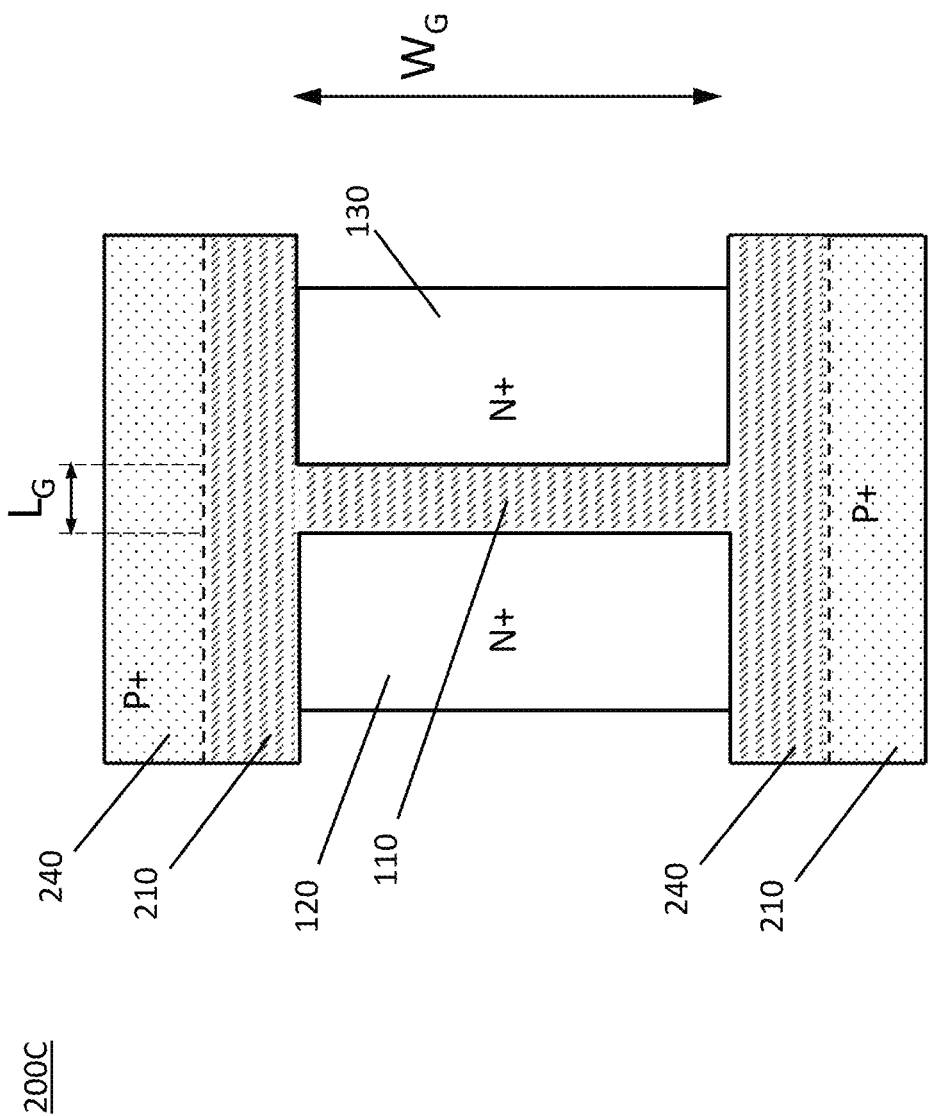

Alternative implementations of the T-gate body tie known to the person skilled in the art, such as, for example, the H-gate body tie depicted in FIG. 2C, also provide the benefit of reducing floating body effects but at a cost of adding parasitic capacitances which can degrade RF performance of the device (e.g. lower $f_T$ and $f_{max}$). The prior art embodiment of the H-gate body tie depicted in FIG. 2C has the advantage of providing a more efficient (e.g. symmetrical) body tie in cases where the transistor has a large width ($W_G$) at a cost of added parasitic capacitances ($C_{SG}$, $C_{DG}$) and related negative affect as discussed for the case of the T-gate body tie. However, for large transistor widths, either the H-gate or the T-gate cannot provide efficient body tie to the transistor, since providing body ties at the distal ends of the transistor channel will result in higher resistance to the middle of the channel width.

Figure 3B:
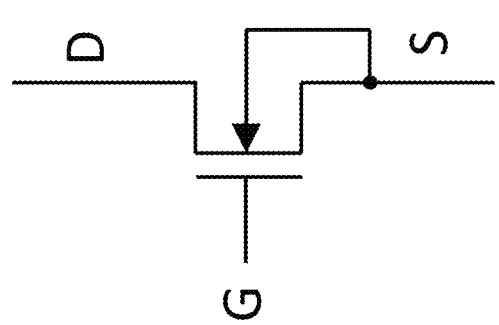
FIG. 3B shows a schematic representation of the transistor device of FIG. 4A shows a top view of an N-type MOSFET transistor with a butted body contact according to an embodiment of the present disclosure.
Figure 3A:
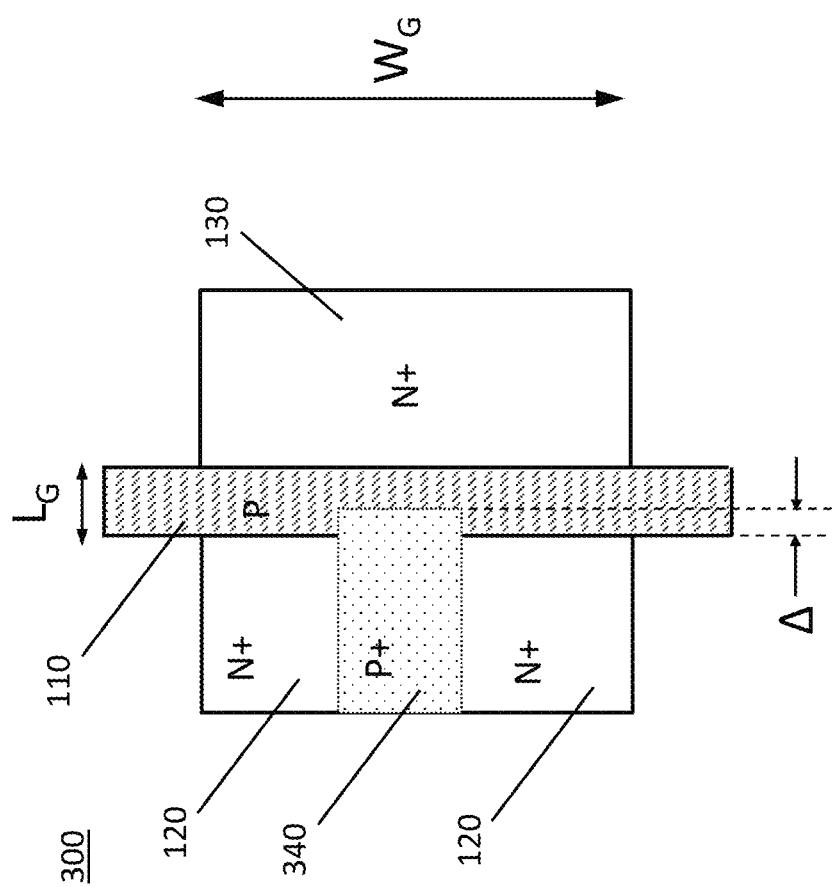
FIG. 3A shows a top view of an N-type MOSFET transistor device with a source body tie according to a prior art embodiment.

FIG. 3A represents a top view of an N-type MOSFET transistor (300) with a source body tie structure according to a prior art embodiment. In the prior art embodiment represented by FIG. 3A, a body contact region is provided by adding a P+ region (340) in the source region which connects the P-body region under the gate (120) polysilicon structure (110) to the source region (120). In other words, the P+ region (340) provides a low resistance path between the source region (120) and the P-body region under the gate polysilicon structure (110), as it is schematically depicted in FIG. 3B.

As with the case of the T-gate body tie structure of FIG. 2A, the source body tie structure used in the N-type transistor (300) of FIG. 3A can reduce the floating body effects present in the transistor (100) of FIG. 1A. Moreover, by virtue of not extending the gate polysilicon structure (110), such as provided in the T-gate (and H-gate) structure, added parasitic capacitance is not provided by the source body tie structure of FIG. 3A.

P+ Region (340) in FIG. 3A must link the source region (120) to the P-body region associated to the gate polysilicon structure (110), and therefore, the P+ region (340) must have a non-zero overlap (A) with said P-body region (see the document entitled "MITTL LOW-Power FDSOI CMOS Process", Revision 2006:1 of June 2006, by MIT Lincoln Laboratory, which is incorporated herein by reference in its entirety). Such overlap can locally change the characteristics of the conduction channel of the transistor (300) in the region where the overlap occurs and therefore can negatively impact performance of the transistor, such as, for example, cause non-linear response (e.g. I-V characteristic curve) of the transistor (300).

Construction of the source body tie as provided by the prior art embodiment of FIG. 3A can also pose added manufacturing complexity, including aligning the P+ region (340) with respect to the gate polysilicon region (110). A precision associated to the latter step of alignment can directly impact linearity of the transistor as well as consistency in I-V characteristic curve of the transistor as a result of any variations in alignment and also affect cost and yield of manufacturing such transistor.

FIG. 4A represents a top view of an N-type MOSFET transistor (400) with a butted body contact according to an embodiment of the present disclosure. According to an embodiment of the present disclosure, the MOSFET transistor device (400) can be a thin-film SOI device, comprising active regions (e.g. 120, 130) formed in a thin layer of silicon (180 in FIG. 4B) overlying an insulating layer (150 in FIG. 4B), the active regions extending through the depth of the thin layer of silicon to reach the insulating layer. Transistor (400) comprises a polysilicon tab (410) which branches out from the gate polysilicon structure (110) through the source region (120), and extends beyond the source region (120) to a body contact region (440) adjacent to the source region (120). By virtue of the polysilicon tab (410) being a contiguous structure to the gate polysilicon structure (110) (e.g. forming a single structure), a corresponding body tab is created underneath the polysilicon tab (410) which is of same type (doping) as the P-body region underneath the gate polysilicon structure (110) (as the polysilicon tab (410) prevents the implantation of N+ into the P-body during an implantation phase associated with, for example, doping of the neighboring drain (130) and source (120) regions). As seen in FIG. 4B, such body tab connects the P-body region underneath the gate polysilicon structure (110) to the body contact region (440) (shown as a P+ region in FIGS. 4A-4B) adjacent to the source region (120). According to various embodiments of the present disclosure, the body contact region has a same type doping as the P-body region, which can be of a same concentration (e.g. P−) or higher concentration (e.g. P+) concentration compared to the concentration of the P-body region.

With further reference to FIGS. 4A-4B, during operation of the transistor (400), the body contact region (440) and the body tab (412) can provide a conduction path for carriers between the transistor body (112) and the N+ source region (120) which provides the final extraction node for the floating charge formerly contained in the transistor body (112).

FIG. 4B shows a cross sectional view of the N-type MOSFET transistor (device) (400) with butted body contact according to the embodiment of the present disclosure shown in FIG. 4A, along line B of FIG. 4A. As seen in the cross sectional view of FIG. 4B, the transistor body region (112) underneath the gate polysilicon structure (110) is contiguous with the P-body region (412), referred to herein as the body tab, formed underneath the polysilicon tab (410). A cross sectional view of the transistor (400) along line A of FIG. 4A can be seen in FIG. 1B previously discussed.

FIG. 5A shows a top view of an N-type MOSFET transistor (500) with a butted body contact according to a further embodiment of the present disclosure. Transistor (500) comprises a polysilicon tab (510) which branches out from the gate polysilicon structure (110) into the source region (120), and extends to a P+ region (540), the body contact region, created into the source region (120). By virtue of the polysilicon tab (510) being a contiguous structure to the gate polysilicon structure (110), a corresponding body tab is created underneath the polysilicon tab (510) which is of same type (doping) as the P-body region underneath the gate polysilicon structure (110). As seen in FIG. 4B, such body tab connects the P-body region underneath the gate polysilicon structure (110) to the body contact region (540) formed inside the source region (120).

FIG. 5B shows a cross sectional view of the N-type MOSFET transistor (device) with butted body contact according to the embodiment of the present disclosure shown in FIG. 5A, along line C of FIG. 5A. As seen in the cross sectional view of FIG. 5B, the body region (112) underneath the gate polysilicon structure (110) is contiguous with the P-body region (512) (body tab) formed underneath the polysilicon tab (510). Furthermore, the body tab (512) makes contact, at a distal terminal of the body tab (512), to the body contact region (540) created inside the source region (120). A cross sectional view of the transistor (500) along line A of FIG. 5A can be seen in FIG. 1B previously discussed.

As is known by a person skilled in the art, a low resistivity layer, such as, for example, a silicide layer can exist on top of exposed silicon regions of a semiconductor device. Such low resistivity layer can provide a low resistance conduction path between all points of the underlying silicon region. For example, with reference to FIG. 5B, a continuous silicide layer (not shown) deposited on top of regions (120) and (540), can provide a low resistivity conduction path between any point of the two adjacent regions (120) and (540).

With further reference to FIGS. 4A-5B, the body tab (412, 512) of transistors (400, 500) according to the embodiments of the present disclosure depicted in FIGS. 4A and 5A, can provide a first resistive (conduction) path between the body region (112) and the body contact region (440, 540), and a continuous low resistivity layer, such as a silicide layer, deposited atop the body contact region (440, 540) and the source region (120), can provide a second resistive path between the body tab (412, 512) and the source region (120). A person skilled in the art will readily understand that based on the doping type and concentration of these regions, a resistance (R1) associated to the first resistive path can be substantially larger than a resistance (R2) associated to the second resistive path. FIG. 5C is a schematic representation of the N-type MOSFET transistor (400, 500), where the body tab (412, 512) and the body contact region (440, 540) provide a resistive connection (first and second resistive paths, of equivalent resistance R1 and R2 respectively) between the body and the source of the transistor. Such resistive connection is represented by the resistor R (=R1+R2) of FIG. 5C which connects the source S and the body of the transistor.

The second resistive path between the body tab (412, 512) and the source region (120) can be provided via an alternative method to the using of the conductive (silicide layer) discussed above. According to an embodiment of the present disclosure, metal contacts associated to the different regions can be used to provide the second resistive path. For example, a metal contact atop the body contact region (440, 540) can be bridged to a metal contact (145) atop the source region (120) via a metal, thereby creating the second low resistivity path.

With further reference to FIG. 5C, in some cases it can be desirable to provide a different value of the resistance R for a desired effect of the provided body tie. Since the resistance R2 provided by the second resistive path is very small (substantially zero) compared to the resistance R1 provided by the first resistive path, it therefore cannot be used to substantially modify the resistance of resistor R. According to various embodiments of the present disclosure, different values of the resistance of resistor R can be provided by adjusting a value of the resistance R1 via parameters of the body tab (412, 512).

According to an embodiment of the present disclosure, resistance value of resistor R1 in FIG. 5C, thence of resistor R, can be adjusted via the width and/or the length of the polysilicon tab (410, 510) associated to the body tab (412, 512). The person skilled in the art will understand how modifying the width and/or the length of the polysilicon tab (410, 510), which thereby accordingly modifies the width and/or length of the body tab (412, 512), can modify the resistance R1 and therefore the resistivity of the first resistive path (between region (112) and region (440, 540)).

According to a further embodiment of the present disclosure, the number of polysilicon tabs (410, 510) for a given gate polysilicon structure can be more than one, such as two, three, four or more (e.g. FIGS. 6-7B later described). Relative spacing of the polysilicon tabs, in combination with the width and/or length of the polysilicon tabs (410, 510), can be used to adjust the resistance value R1 of the resistive path between the body region (112) and the body contact region (440, 540), and thereby adjust the resistance value of resistor R.

According to a further exemplary embodiment of the present disclosure, the polysilicon tabs (410, 510) can be created during a fabrication step different from one used to fabricate the gate polysilicon structure (110). Although such exemplary embodiment may introduce complexity to the overall fabrication process, it is nonetheless a possible alternative embodiment for providing the butted body contact of the present invention.

With further reference to FIGS. 4A and 5A, the person skilled in the art will appreciate the reduction in parasitic capacitance provided by the embodiments according to the present disclosure as compared to the prior art embodiments of FIG. 2A. In contrast to such prior art embodiment, the embodiments of the current disclosure do not introduce a gate to drain parasitic capacitance $C_{DG}$. Furthermore, by virtue of the relatively reduced dimensions (width and/or length) of the polysilicon tab (410, 510) as compared to the polysilicon region (210) of the prior art embodiment of FIG. 2A, the gate to source parasitic capacitance $C_{SG}$ of the embodiments according to the present disclosure, depicted in FIGS. 4A and 5A, is smaller than the $C_{SG}$ of the prior art embodiment of FIG. 2A.

According to some embodiments of the present disclosure, the polysilicon tab (410, 510) is an integral element of the gate polysilicon structure (110) and created using a same mask. By virtue of being an integral element of the gate polysilicon structure (110), alignment issues creating the polysilicon tab (410, 510) and associated body tabs (412, 512) with respect to the gate polysilicon (110) and associated P-body (112), such as needed for the prior art transistor shown in FIG. 3A, are eliminated. The person skilled in the art will appreciate elimination of such alignment step and the simpler fabrication process that the butted body tie method described herein provides in view of the previously discussed prior art embodiment of FIG. 3A.

As noted in the above paragraphs of the present disclosure, the butted body tie according to the various embodiments of the present disclosure, as depicted, for example, in FIGS. 4A-5C, provides the advantages of a simpler manufacturing process, adjustable body tie impedance (e.g. resistance) and reduced parasitic capacitance when compared to prior art embodiments of a body tie (e.g. FIGS. 2A, 3A). As a result, integrated circuits using transistor devices with the butted body tie according to the present invention can outperform integrated circuits with similar functions using transistor devices with no body tie or body ties according to prior art embodiments. Comparative data graphs showing further performance advantages of the butted body contact (tie) according to the present invention are shown in FIGS. 10A-19 which are later described.

As mentioned in the above paragraphs, according to some embodiments of the present disclosure, the butted body tie can be provided via more than one polysilicon tab to a gate polysilicon of a transistor. Such embodiment according to the present disclosure is depicted in FIG. 6 which is an extension of the embodiment depicted in FIG. 4A. As shown a FIG. 6, a plurality of polysilicon tabs (610) branch out from the gate polysilicon structure (110), to form a single polysilicon structure, through the source region (120), and extend beyond the source region (120) to the body contact region (440), indicated as a P+ region in FIG. 6, adjacent to the source region (120). Such distinct polysilicon tabs (610) in turn allow creation of corresponding distinct body tabs which provide a resistive conduction path between the P-body under the polysilicon gate structure (110) and the body contact region (440), and therefore to the source region (110). Cross sectional view of the N-type MOSFET transistor (600) along the lines A and B shown in FIG. 6 can be found in FIGS. 1B and 4B respectively. In a case where the transistor width $W_G$ is large, multiple polysilicon tabs (610) can be desirable. Although in the exemplary embodiment according to the present disclosure depicted in FIG. 6 the distinct polysilicon tabs reach a common contiguous body contact region (440), according to alternate embodiments of the present disclosure such body contact region can comprise one or more distinct and separate P+ regions, each of such P+ regions being adjacent to the source region (120). The person skilled in the art readily understands how to derive such alternate embodiments based on the exemplary structural layout embodiment depicted in FIG. 6. It should be noted that the position of the polysilicon tabs (610) along the width of the body region (as defined by $W_G$) can be according to desired design goals of the butted body tied transistor (600) of FIG. 6. According to one exemplary embodiment of the present disclosure, the polysilicon tabs (610) are placed symmetrically along the width of the body region, as depicted in FIG. 6, where the polysilicon tabs (610) are placed symmetrically with respect to a center line (denoted B in FIG. 6) of the width of the body region. According to a further exemplary embodiment of the present disclosure, the polysilicon tabs (610) are placed at equidistant positions along the width of the body region, as depicted in FIG. 6, where a distance between any two consecutive polysilicon tabs (610) along the width $W_G$ is constant.

Figure 6:
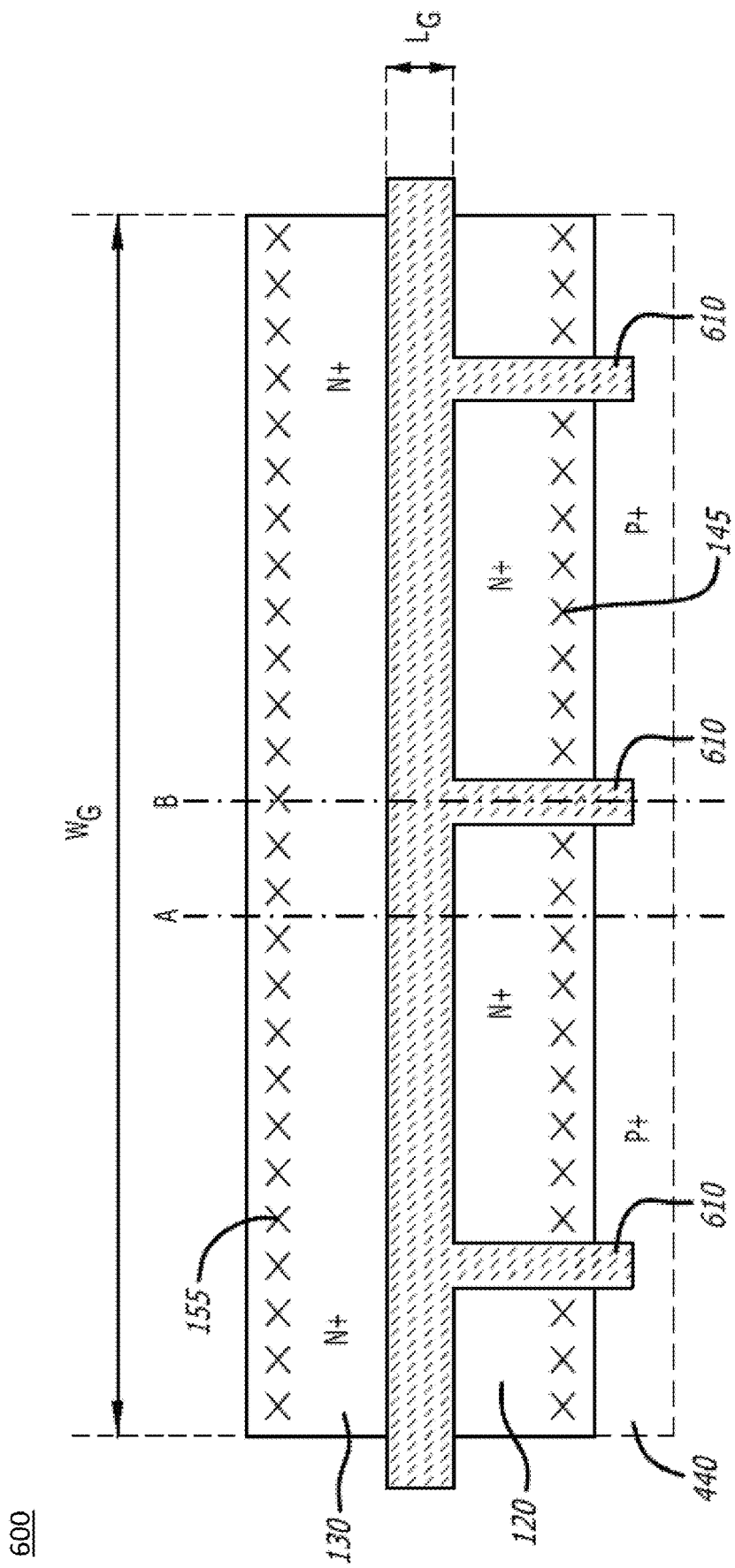
FIG. 6 shows a top view of an N-type MOSFET transistor with a butted body contact according to an alternate embodiment of the present disclosure, where the body contact is provided via a plurality of distinct body tabs.

In a similar manner as provided in the embodiment depicted in FIG. 6, the butted body tie embodiment according to the present disclosure depicted in FIG. 5A can be extended to provide more than one polysilicon tab (510) branching off the gate polysilicon structure (110). As shown in FIG. 7A, each such polysilicon tab (510) can reach an area within the source region (120) containing a P+ region associated to a body contact region (540). According to the exemplary embodiments of the present disclosure as depicted in FIG. 7A, such body contact regions (540) can be distinct and separate and in a one to one relationship with each polysilicon tab (510). According to other embodiments of the present disclosure, the P+ regions associated to the distinct body contact regions (540) can be merged into one or more larger P+ regions (540) which can each be used to as a body contact region to more than one polysilicon tab (510), as depicted in FIG. 7B.

As previously mentioned, the gate polysilicon (110) can be part of a finger of a larger device, where such device can comprise a plurality of such fingers. Each such finger can be part of a separate transistor which, in combination with other transistors, creates the larger device. The larger device can comprise a plurality of transistors connected in series or in parallel, or a combination thereof. As known to the person skilled in the art, in some cases adjacent fingers can share a same contiguous source region. According to an embodiment of the present disclosure, one, more than one, or all of the fingers of the larger device can have a butted body tie structure per the structural layout provided in FIGS. 4A-7B.

Figure 8A:
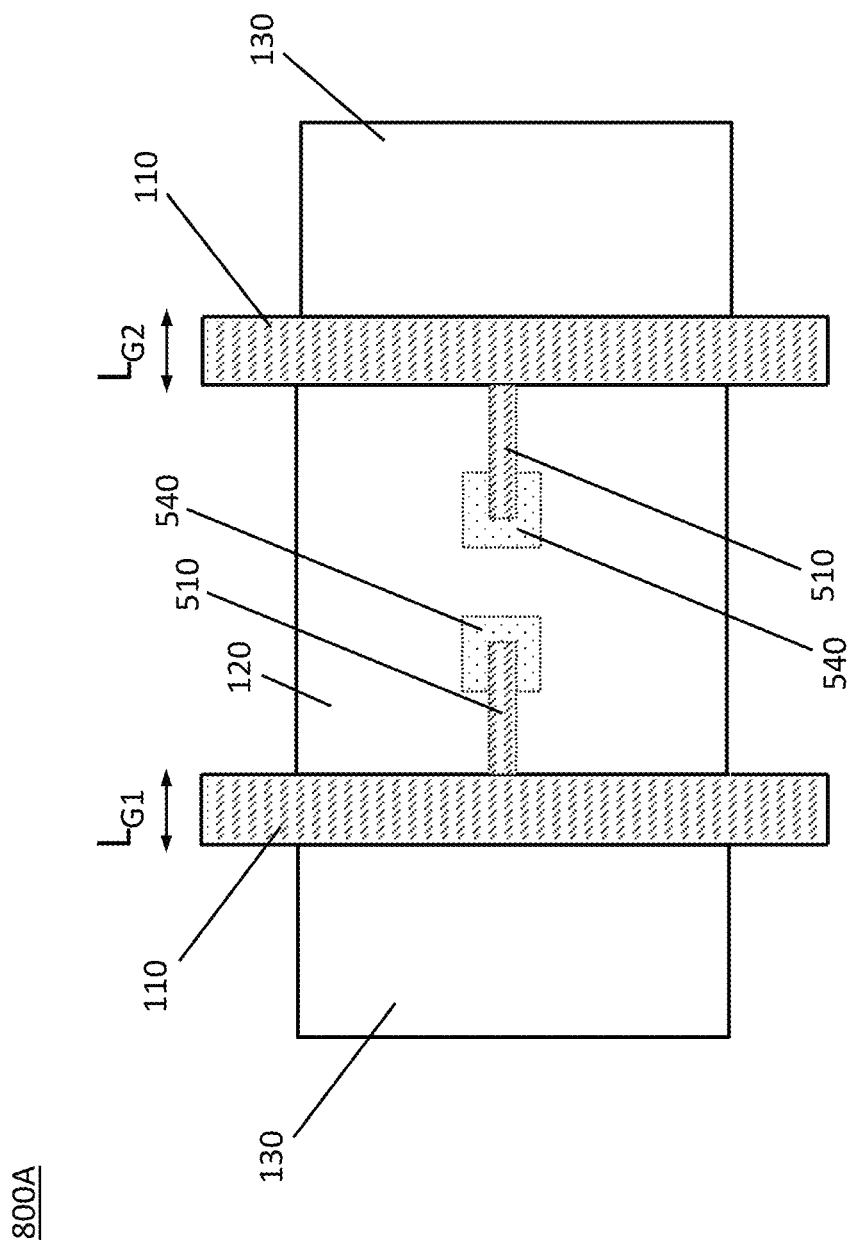
FIG. 8A shows a top view of two adjacent fingers of a transistor device with a butted body contact according to an embodiment of the present disclosure where corresponding polysilicon tabs are created within a common source region.

FIG. 8A shows an embodiment according to the present disclosure where two adjacent fingers of a transistor device share a common source region (120). Each finger has a corresponding gate polysilicon structure (110), with an associated length of $L_{G1}$ and $L_{G2}$ respectively, which in some embodiments can be equal to each other. Each gate polysilicon structure (110) can have a corresponding polysilicon tab (510) which branches out the gate polysilicon structure (110) into the common source region (120) and extending to a body contact region (540), latter body contact region being a P+ region in some exemplary embodiments. The exemplary embodiment according to the present disclosure depicted in FIG. 8A shows one polysilicon tab (510) per gate polysilicon structure (110) merging at a distal end of the polysilicon tab (510) into the body contact region (540). Such limitation should not be considered as limiting what the inventors of the present application regard as their invention, but rather one exemplary embodiment of such invention. As discussed in the above paragraphs and in relation to FIGS. 4A-7B, many different structural layouts for the butted body contact according to the present disclosure are possible and within the reach of the person skilled in the art based on the teachings according to the present disclosure. For example, in one embodiment the body contact regions (540) can be located at a same distance from a corresponding gate polysilicon structure (110). In another embodiment, the body contact regions (540) can be located at different distances with respect to corresponding gate polysilicon structures (110).

It can be desirable to connect the gate polysilicon structures (110) of two adjacent fingers. This is typically performed via extension and joining of the gate polysilicon structures outside the active region of the device (e.g. regions disjoint from the drain and source regions of the device). According to an embodiment of the present disclosure, two adjacent gate polysilicon structures can be joined via a common polysilicon tab between the two adjacent gate polysilicon structures as depicted in FIG. 8B. In the embodiment depicted in FIG. 8B, the two gate polysilicon structures (110), of respective associated gate lengths denoted by $L_{G1}$ and $L_{G2}$, are connected via a polysilicon tab (510) common to both structures (110). This can allow, for example, a gate voltage provided at one gate contact associated to one gate polysilicon structure to be provided to an adjacent gate and therefore allows for a simpler and reduced overall gate polysilicon structure.

Figure 8B:
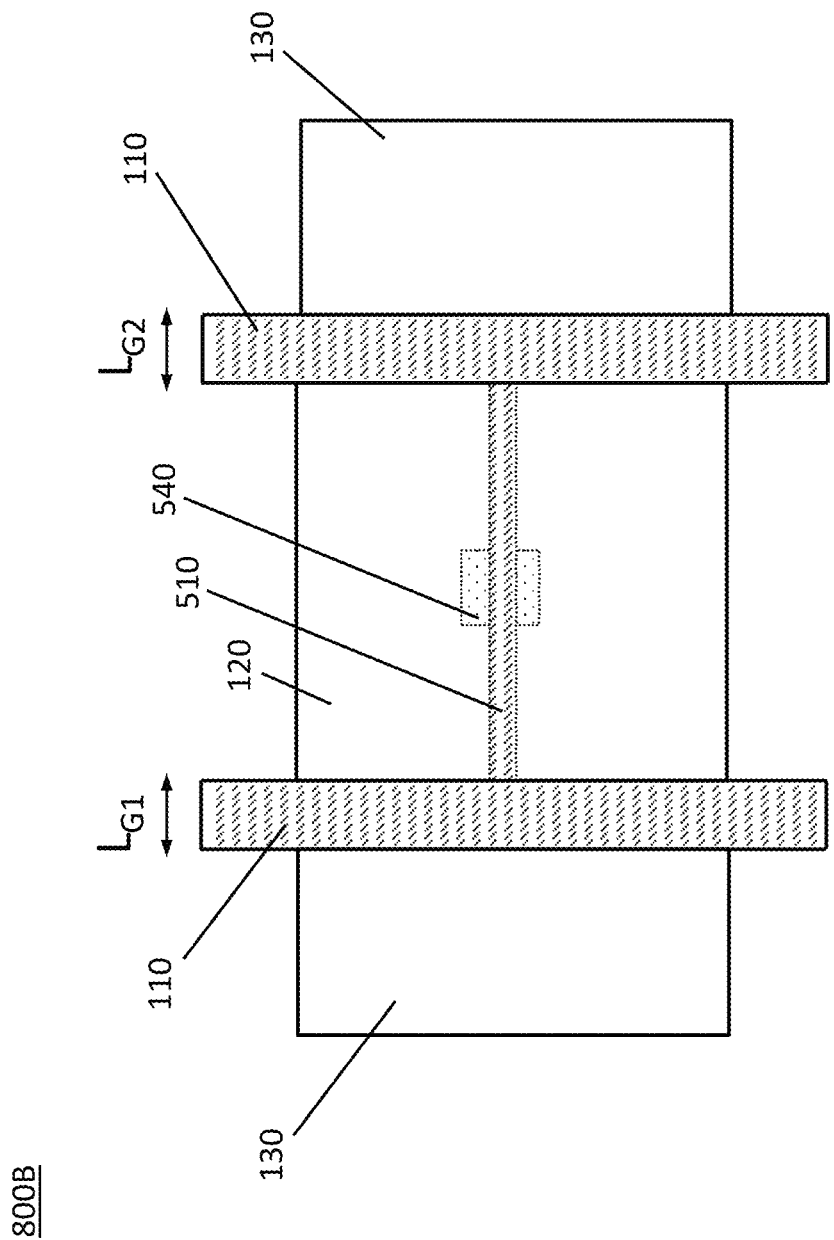
FIG. 8B shows an alternate embodiment of the embodiment shown in FIG. 8A where the corresponding polysilicon tabs are joined.

The common polysilicon tab (510) according to the exemplary embodiment of the present disclosure depicted in FIG. 8B can provide, via its connection to the body contact region (540), a butted body tie to both transistor devices shown in FIG. 8B, while joining the corresponding gate polysilicon structures (110) as described above. Mechanism to provide the butted body tie in the embodiment depicted in FIG. 8B is similar to one described with reference to FIGS. 4A-7B, where a body tab associated to the polysilicon tab (510) resistively connects the P-body region underneath the gate polysilicon to the common source region (120) via the body contact region (540), latter region, as described above, providing a (second) low resistivity conduction path to the source region (540). It should be noted that although the P+ region (540) in FIG. 8B appears to be centrally placed between the two gate polysilicon structures (110), the position of such region can be varied according to a desired body tie performance requirement for each of the two devices depicted in FIG. 8B. Similarly, the width of a segment of the polysilicon tab between the body contact region (540) and associated to one gate polysilicon structure can be different from the width of a segment associated to the other gate polysilicon structure.

In the exemplary embodiment according to the present disclosure depicted in FIGS. 8A-8B, the neighboring fingers with respective associated gate lengths $L_{G1}$ and $L_{G2}$ can be part of a same device or two separate devices. According to a further embodiment of the present disclosure, the neighboring fingers can correspond to fingers of separate devices which are electrically connected in, for example, a cascoded configuration. In such cascoded configuration, as depicted in FIGS. 8C-8K, the source of a first device is electrically connected to the drain of a second (last) device. Although the exemplary configuration according to the present disclosure represented in FIGS. 8C-8E and 8I-8J uses two cascoded transistor devices, the skilled person will understand that stack sizes larger than two, such as three, four, five, . . . , ten or more stacked devices are also possible, as depicted in FIGS. 8F and 8K.

Figure 8C:
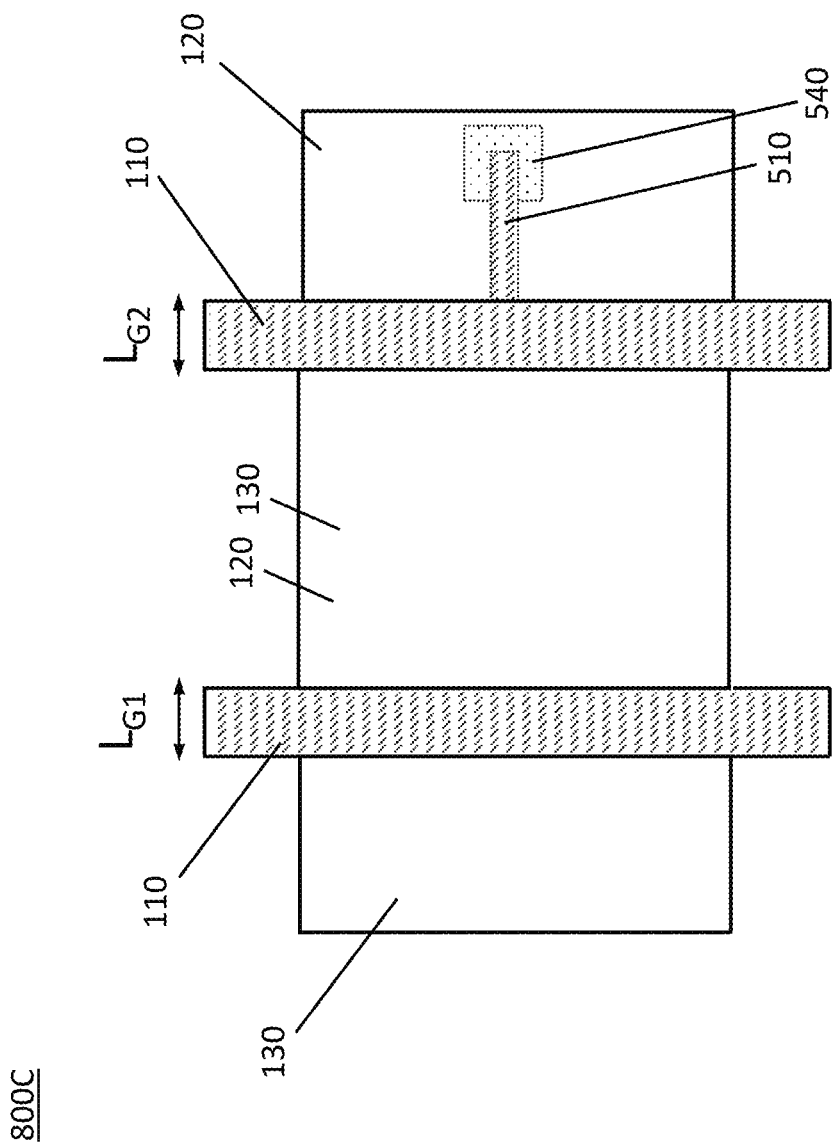
Figure 8D:
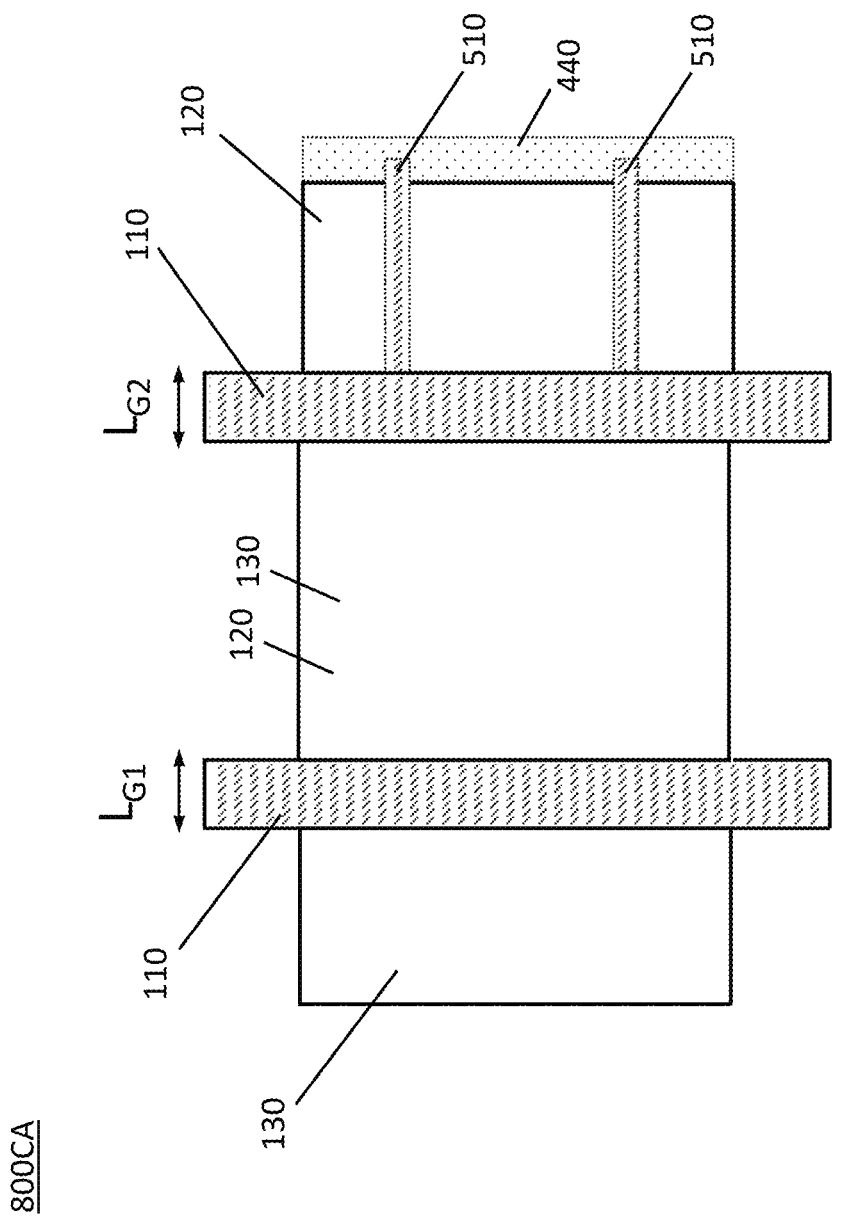
Figure 8F:
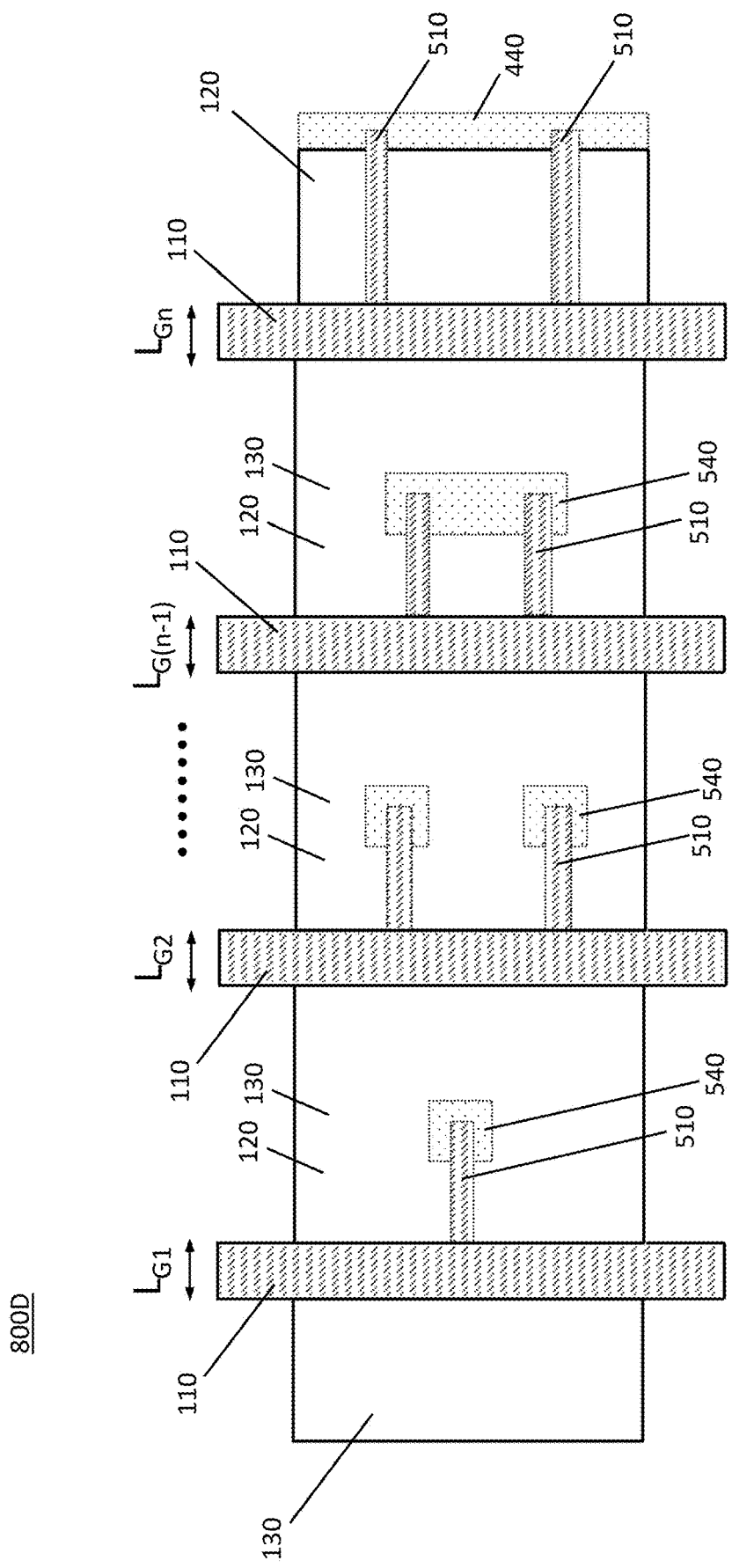
Figure 8G:
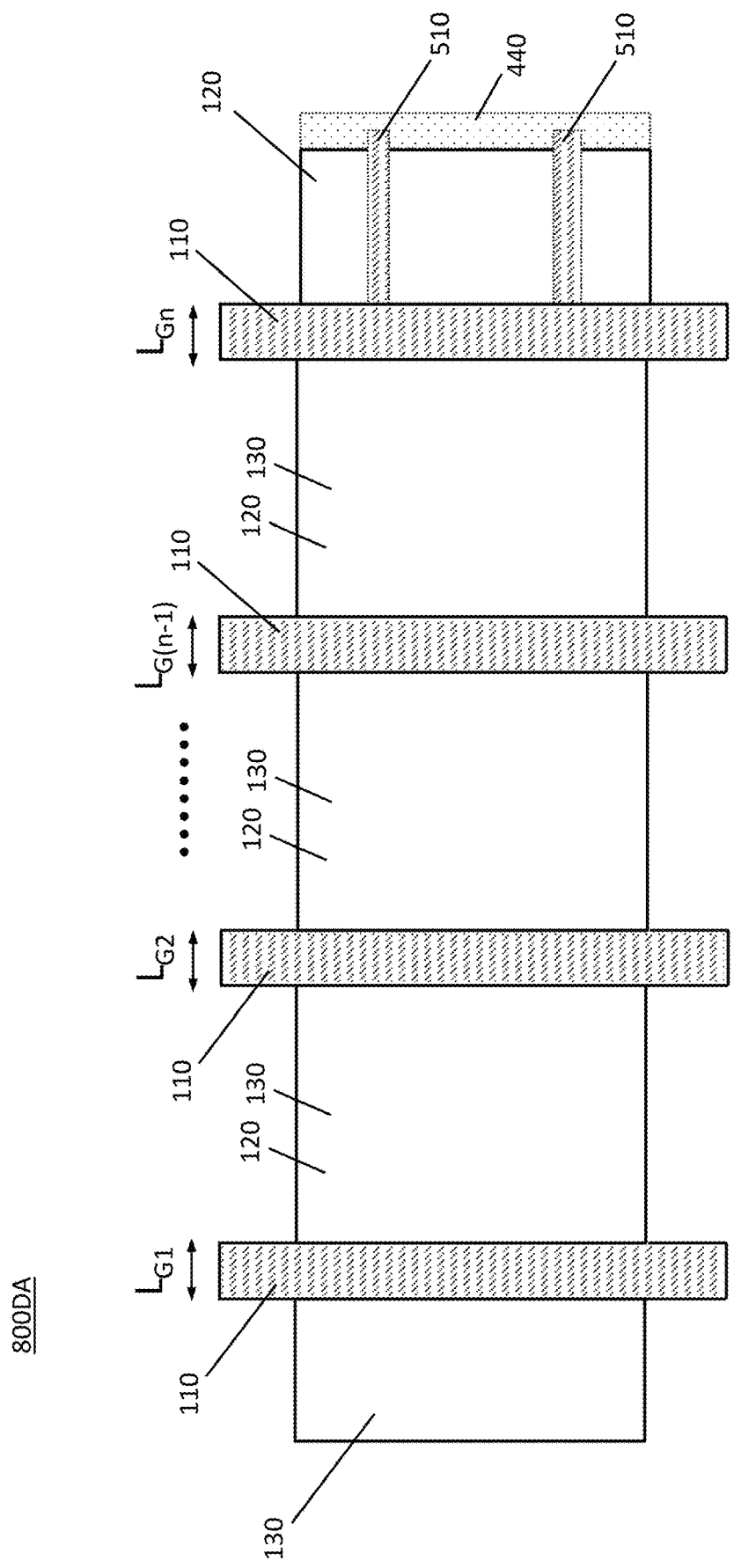
Figure 8H:
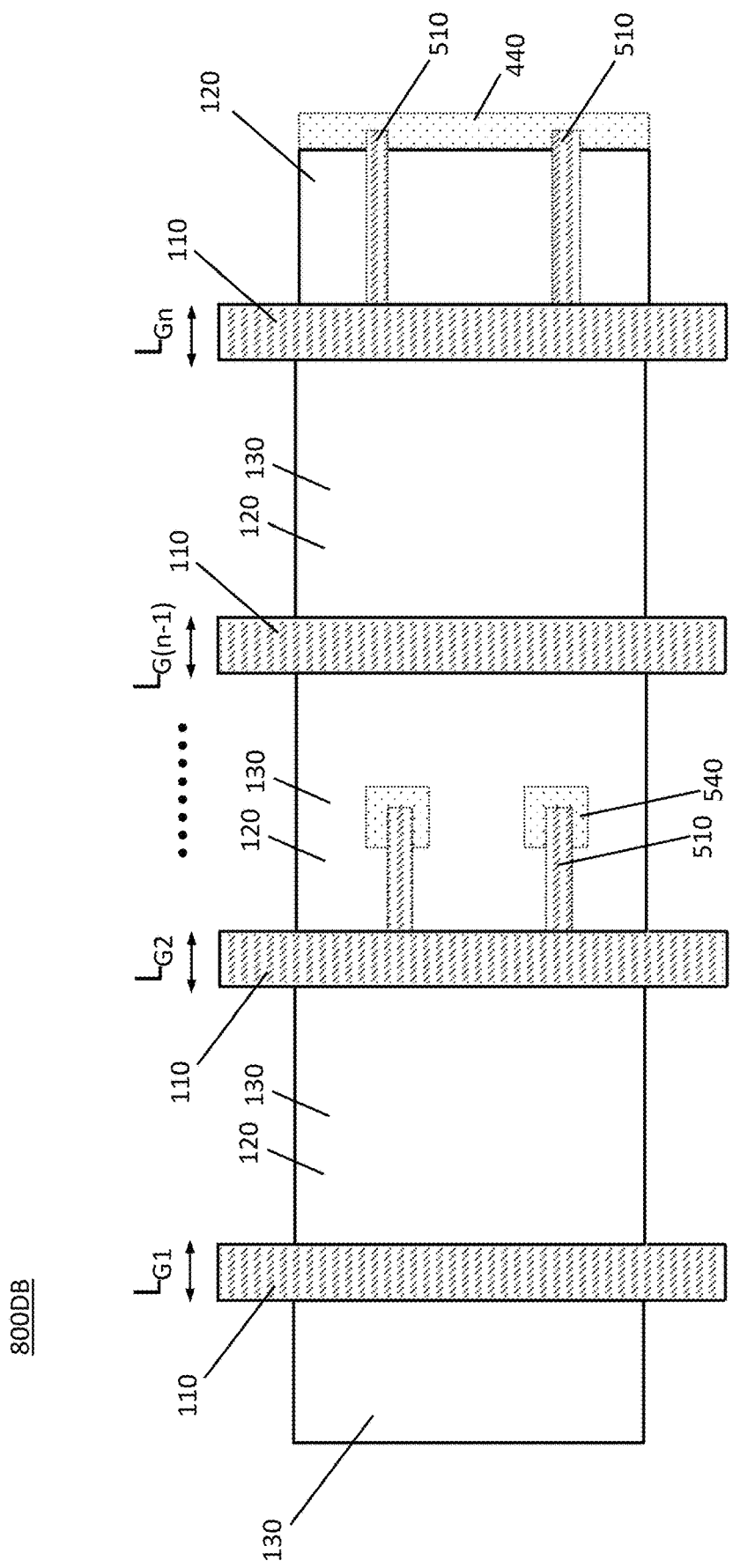
Figure 8K:
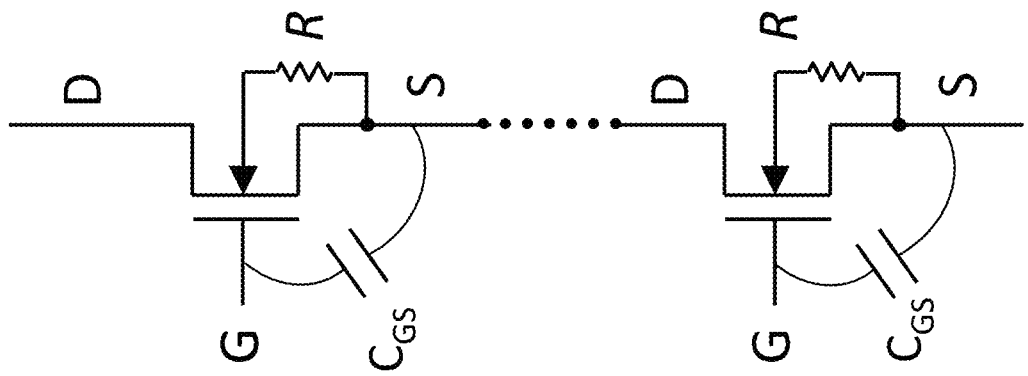
FIG. 8K schematically represents the stacked transistors of FIG. 8F.
Figure 8J:
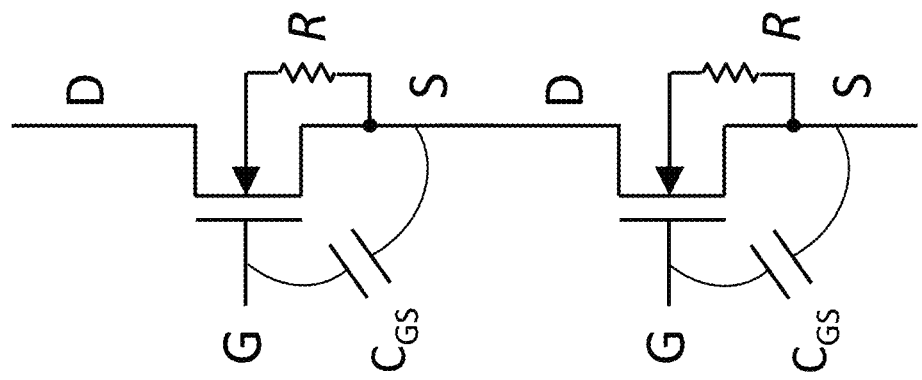
FIG. 8J schematically represents the stacked transistors of FIG. 8E.
Figure 8I:
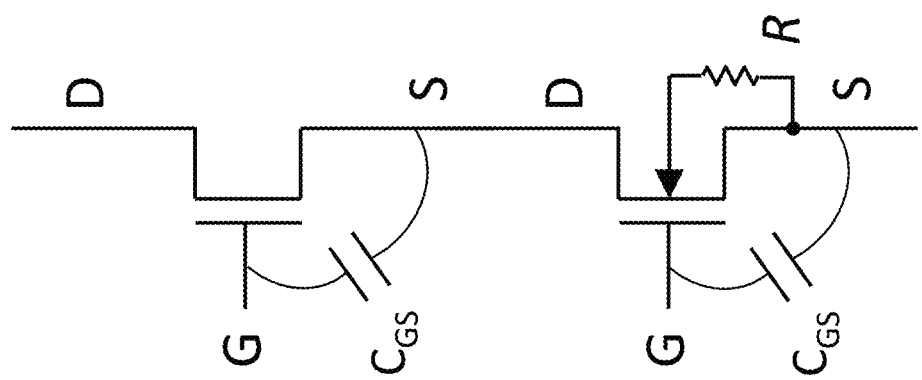
FIG. 8I schematically represents the stacked transistors of FIG. 8C and FIG. 8D.

FIG. 8C shows a top view of the butted body tied cascoded configuration (800C) according to the present disclosure which is schematically represented in FIG. 8I. It should be noted that the top transistor schematically represented in FIG. 8I corresponds to the first device depicted in FIG. 8C and identified by its associated gate length $L_{G1}$, whereas the bottom transistor schematically represented in FIG. 8I corresponds to the second device depicted in FIG. 8C and identified by its associated gate length $L_{G2}$. As seen in FIG. 8C, the source region (120) of the first device represented by the associated gate length $L_{G1}$ is common with the drain region (130) of the second device represented by the associated gate length $L_{G2}$, thereby electrically connecting such source and drain regions.

As shown in FIG. 8C, a butted body tie to the second device can be provided by a polysilicon tab (510) connected to the gate polysilicon structure (110) of the second device (identified by $L_{G2}$), and extending over the source region (120) of the second device to a body contact region (540) (P+ doped, for example) formed within the source region (120) of the second device. As described in connection with FIGS. 4A-7B, such polysilicon tab (510) can be used to create a corresponding body tab underneath the polysilicon tab (510) which can provide an adjustable resistive conduction path between the body region of the second device and the body contact region (540). By virtue of not having a body tie, the first transistor (identified by $L_{G1}$) is a three terminal transistor as shown in FIG. 8I (top transistor in the figure).

According to a further exemplary embodiment of the present disclosure depicted in FIG. 8D, butted body tie to the second device (identified by $L_{G2}$) depicted in FIG. 8D can be provided via two polysilicon tabs (510) connected to the gate polysilicon structure (110) of the second device, and extending over and beyond the source region (120) of the second device to a body contact region (440) (P+ doped, for example) adjacent to the source region (120) of the second device. Such polysilicon tabs (510) can therefore provide corresponding body tabs to resistively connect the body region of the second device to the body contact region (440) as described above. Schematic representation of the butted body tied cascoded configuration of FIG. 8D is also provided by FIG. 8I, where the first transistor (identified by $L_{G1}$) is a three terminal transistor as shown in FIG. 8I (top transistor in the figure).

According to some embodiments of the present disclosure, one or more butted body ties can also be provided to the first device (identified by $L_{G1}$) of FIGS. 8C-8D, as represented in FIG. 8E. As shown in FIG. 8E, a butted body tie to the first device can be provided via a first polysilicon tab (510) connected to the gate polysilicon structure (110) of the first device (identified by $L_{G1}$), and extending over the common drain/source regions (130/120) of the two cascoded devices to a body contact region (540) (P+ doped, for example) formed within the common drain/source regions (130/120). As described in connection with FIGS. 4A-7B, such polysilicon tab (510) can be used to create a corresponding body tab underneath the polysilicon tab (510) which can provide an adjustable resistive conduction path between the body region of the first device and the body contact region (540). Schematic representation of the butted body tied cascoded configuration of FIG. 8E is provided by FIG. 8J, where both transistors (identified by $L_{G1}$ and $L_{G2}$) are four terminal transistors having each a butted body tie.

The person skilled in the art will understand that various combinations of structures described in relation to FIGS. 4A-7B for providing a butted body tie to any of the first and the second device (or more for higher stack sizes) of the cascoded configuration according to the present disclosure discussed above is possible. For example, the first device can be provided with a butted body tie according to any structure represented in FIGS. 4A-5A and 7A-7B, and the second (last) device can be provided, independently of a butted body tie provided to the first device, with a butted body tie according to any structure represented in FIGS. 4A-7B.

FIGS. 8F and 8K represent an extension to the exemplary embodiment according to the present disclosure depicted in FIGS. 8C and 8E, wherein the cascoded configuration comprises n transistor devices electrically connected in series, the source (120) and drain (130) of two neighboring devices being merged as in the case of the embodiment depicted in FIG. 8C. It should be noted that in the cascoded configuration according to the present disclosure and represented in FIGS. 8C-8K, only the last device (e.g. second device of FIG. 8C and $n^{th}$ device of FIG. 8F) may be provided with a butted body tie according to the structure represented in FIG. 6.

According to a further embodiment of the present disclosure, a desired performance of the stack (e.g. FIGS. 8C-8K) can be optimized by providing different or same body tie structures to different devices of the stack, thereby providing different or same value resistances between the body and the contacts for each of the devices of the stack. Single device performances with respect to a body tie structure are represented in FIGS. 10A-19 later described.

According to some embodiments, not all devices of the stack are provided with a butted body tie structure, and therefore the stack can comprise a combination of three terminal and four terminal devices, as depicted, for example, in FIGS. 8C-8D and FIGS. 8I-8J. FIGS. 8G and 8H are further such exemplary embodiments where some devices (four terminal) of the stack are provided with a butted body tie structure according to the present teachings, and other devices (three terminal) are not provided a butted body tie. According to the exemplary cascoded configuration depicted in FIG. 8G, only the last device (identified by $L_{Gn}$) is provided with a butted body tie according to the present teachings, and according to the exemplary cascoded configuration depicted in FIG. 8H, only the second device (identified by $L_{G2}$) and the last device (identified by $L_{Gn}$) are provided with a butted body tie according to the present teachings. It is to be understood that such exemplary embodiments should not be considered as limiting the scope of the present invention, as variations of such embodiments for stacked devices with butted body ties according to the present disclosure are well within the ability of a person skilled in the art in view of the present teachings.

The above embodiments according to the present disclosure of the butted body tie describe electrical connections of the body (channel) region of a transistor device to the corresponding source region, thereby to the potential present at the source terminal of the device. According to further embodiment of the present disclosure a butted body tie connection can be provided which is decoupled from the potential at the corresponding source terminal. Such embodiment allows for coupling of the butted body tie to a potential independent from the potential at the source terminal of the corresponding device. A corresponding structure is depicted in FIG. 9A and FIG. 9B, and a corresponding schematic representation in FIG. 9D.

FIG. 9A depicts a top view of a butted body tie device (900A) according to an embodiment of the present disclosure which can be used to resistively tie the body region of the device to any potential. The transistor device (900A) (e.g. thin-film SOI device) comprises a similar structure for providing the butted body tie as described in relation to FIG. 5A with the difference that the body contact region (540) is now isolated from the source region (120) via an isolation P− region created underneath the polysilicon structure (910)

connected to the polysilicon tab (510). Similar to the polysilicon tab (510), the polysilicon structure (910) can allow creation of a corresponding isolation P– region (912) underneath the polysilicon structure (910) which is contiguous to the body tab created via the polysilicon tab (510) and is therefore electrically connected to the body region underneath the gate polysilicon structure (110). The isolation P– region (912) surrounds the body contact region (540) within the source region (120) such as to not provide any contact between regions (540) and (120) as depicted in the cross sectional view of FIG. 9B. It is noted that like numbers (reference designators) in the figures represent like items, and therefore may be further described in relation to other figures of the present disclosure.

FIG. 9B shows a cross sectional view of the butted body tied device (900A) along line F of FIG. 9A. As can be seen in FIG. 9B, the source region (120) is isolated from the body contact region (540) via the isolation P– region (912) associated to the polysilicon structure (910) and the BOX layer (150) which provides a common base to all active regions of the device, including regions (120, 912, 540) shown in the cross sectional view of FIG. 9B.

The person skilled in the art will understand that by virtue of being isolated from the source region (120), the body contact region (540) can be coupled to any desired potential during operation of the butted body tie device (900A) of the present invention while providing a conduction path with an adjustable resistivity to the body region of the device. Such coupling of the isolated body contact region (540) to a desired potential can be provided, for example, via a metal contact connected atop the body contact region (540).

Figure 9C:
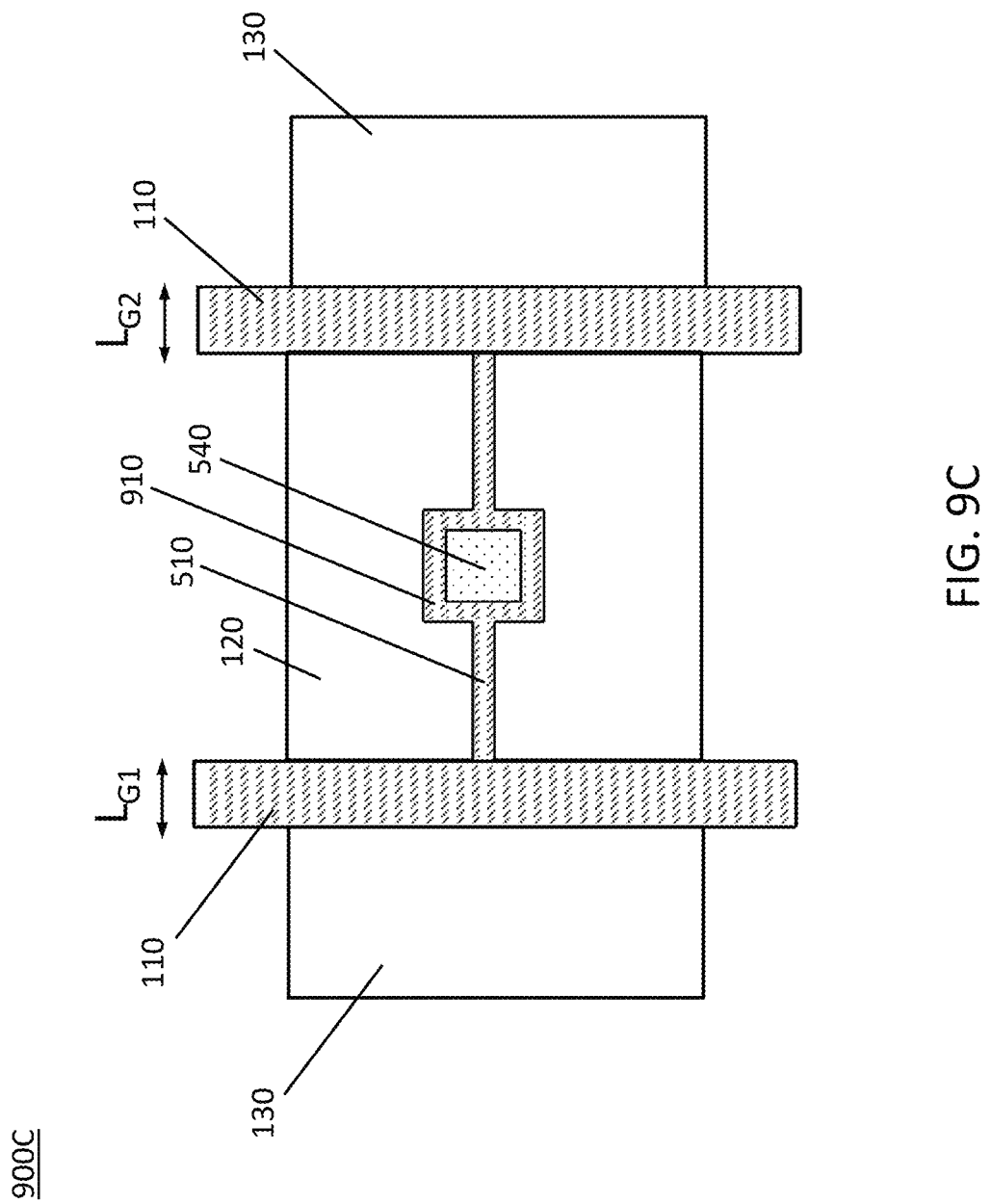
FIG. 9C shows a top view of two adjacent fingers of a transistor device with isolated butted body contacts.
Figure 9D:
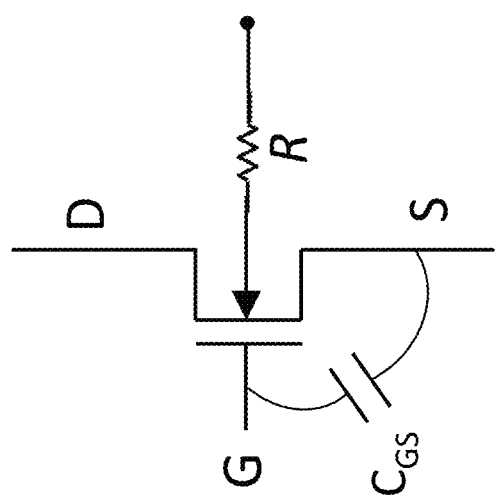
FIG. 9D shows a schematic representation of the transistor device of FIGS. 9A-9B.

According to further embodiments of the present disclosure, the teachings related to FIGS. 9A and 9B can be extended to neighboring fingers, as depicted in FIG. 9C, where fingers identified by ($L_{G1}$, $L_{G2}$) sharing a common source region (120) can be provided an isolated butted body tie, within the common source region (120), to allow a body contact to any desired potential. The person skilled in the art will understand that by virtue of its isolation with respect to the neighboring regions, the body contact region (540) can be provided within any active region of the device (900C) different from the body region, including in the drain region (130).

It should be noted that any of the butted body tie to source configurations according to the present disclosure and depicted in previously described figures (e.g. FIGS. 4A-8H), can be provided with an equivalent isolated butted body tie as exemplified in FIGS. 9A-9D. Accordingly, the stacked transistor structures depicted in FIGS. 8C-8K can also be provided, if desired, with isolated body tie structures. The person skilled in the art can further expand the teachings according to the present disclosure to configurations which comprise a combination of isolated butted body ties and butted body ties to source.

The butted body tie according to the various embodiments presented above can provide a lower resistance (first resistance described above) between the transistor channel and the body contact region (e.g. regions (440, 540)) when the transistor is in a non-conducting state (as opposed to when the transistor is in a conducting state). When the gate voltage Vg of a transistor with the butted body tie according to the various embodiments of the present disclosure is near or below the voltage of the transistor body (threshold voltage Vt), thereby putting the transistor in the off/non-conducting state, the doping in the body tab provides a resistive conduction path from the body contact region to the transistor body region under the gate polysilicon. The body tab is conductive from the surface of the silicon through its entire depth. When the gate voltage Vg of such transistor is near or above the transistor threshold voltage Vt, putting the transistor in the ON/conducting state, a region exists in the body tab that is depleted of mobile charge. This region starts at the top surface of the active silicon layer and extends into the silicon. This depletion region becomes non-conductive and hence decreases the cross section of conductive silicon in the body tab (thereby increasing resistivity). Accordingly, when the transistor is in a conducting state (Vg>Vt), the butted body tie according to the various embodiments of the present disclosure can provide a higher resistance between the transistor channel and the body tie (provided at the body contact region) as compared to the case where the transistor is not conducting. Such higher resistance allows reduction of loss in RF characteristic performance of the transistor due to the provision of the body tie. The person skilled in the art is well aware of loss in RF characteristic performance of a transistor associated with provision of a body tie to the transistor and can therefore appreciate the benefit of the butted body tie according to the present disclosure.

Figure 10A:
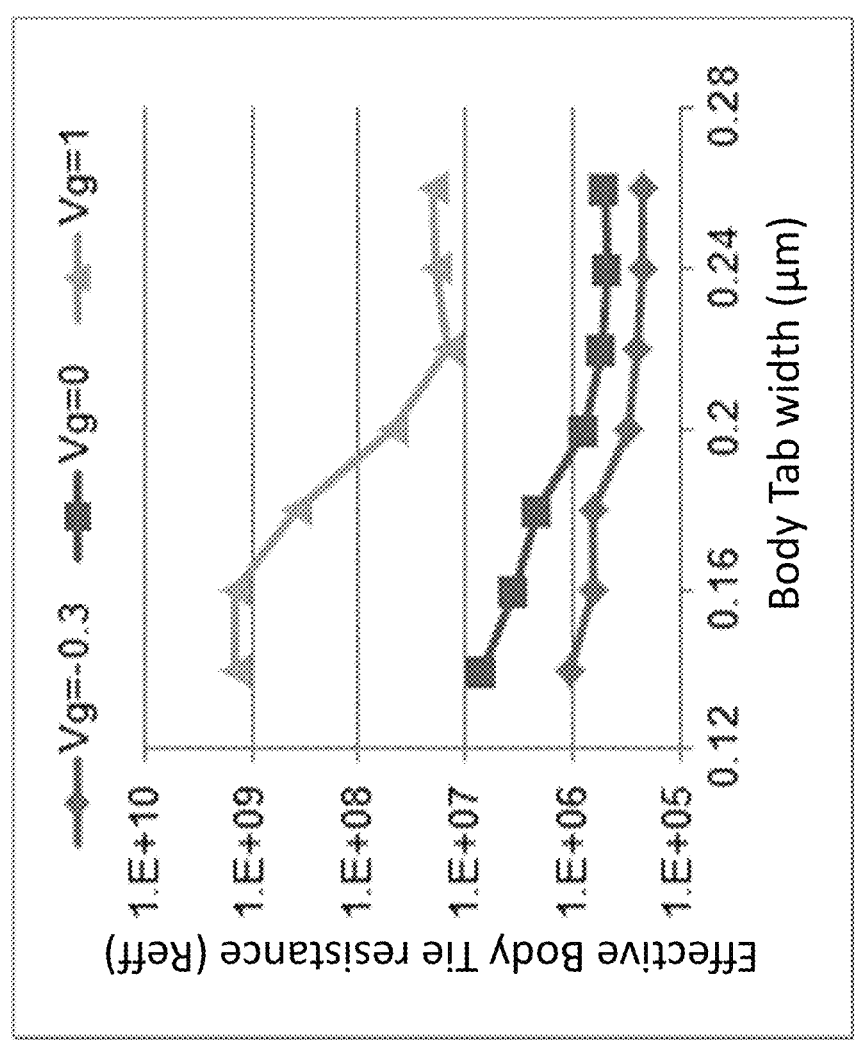
FIG. 10A represents a graph of a butted body tie (contact) resistance versus gate bias voltage and body tab width.

FIG. 10A represents a graph of the (effective) butted body tie resistance Reff versus gate bias voltage Vg and body tab width (in μm). As can be seen from the graph of FIG. 10A, for a given body tab width (width along the gate width), body tie resistance increases as a function of the gate bias voltage Vg. Specifically, for a case where the gate bias voltage Vg=–0.3 V (transistor is not conducting), the effective body tie resistance is 1 MΩ, and for a case where the gate bias voltage Vg=1 V (transistor is conducting), the effective body tie resistance is larger than 1000 MΩ. Also, as can be seen from the graph of FIG. 10A, for a given gate bias voltage Vg, the effective resistance decreases with increase width of the body tab.

A transistor with the butted body tie according to the various embodiments of the present disclosure can exhibit performance advantages when compared to a transistor without a body tie (floating body) or to a transistor with conventional (H-gate, T-gate) body tie. Such performance advantages include, but are not limited to, improved control of majority carriers and electrical potential in the body region of the transistor without the disadvantage of conventional (H-gate, T-gate) body tied transistors.

When compared to a floating body transistor, the butted body tie according to the present invention provides a higher breakdown voltage, lower drain to source current (Ids) in the off state (non-conducting state) at elevated drain to source voltages (Vds), less decrease in output impedance with increased Vds in the on state (conducting state), and improved HCI (hot carrier injection) performance for RF applications.

When compared to a conventional (H-gate, T-gate) body tied transistor, the butted body tie according to the present invention provides less total gate parasitic capacitance (sum of all capacitances attached to the gate), less drain to gate capacitance (no increase over floating body transistor), higher $f_{max}$ (due to reduced drain to gate capacitance), and no limit on channel width to maintain body tied device characteristics. Also, as compared to the prior art source body tie structure represented in FIG. 3A, the present butted body tie invention provides a simpler fabrication process, lower fabrication cost and higher process yield.

The above characteristic benefits of the butted body tie according to the present invention, in addition to all other applications benefiting from improved output impedance and breakdown voltage, enable higher peak power added efficiency (PAE) for RF power amplifier applications.

Figure 10B:
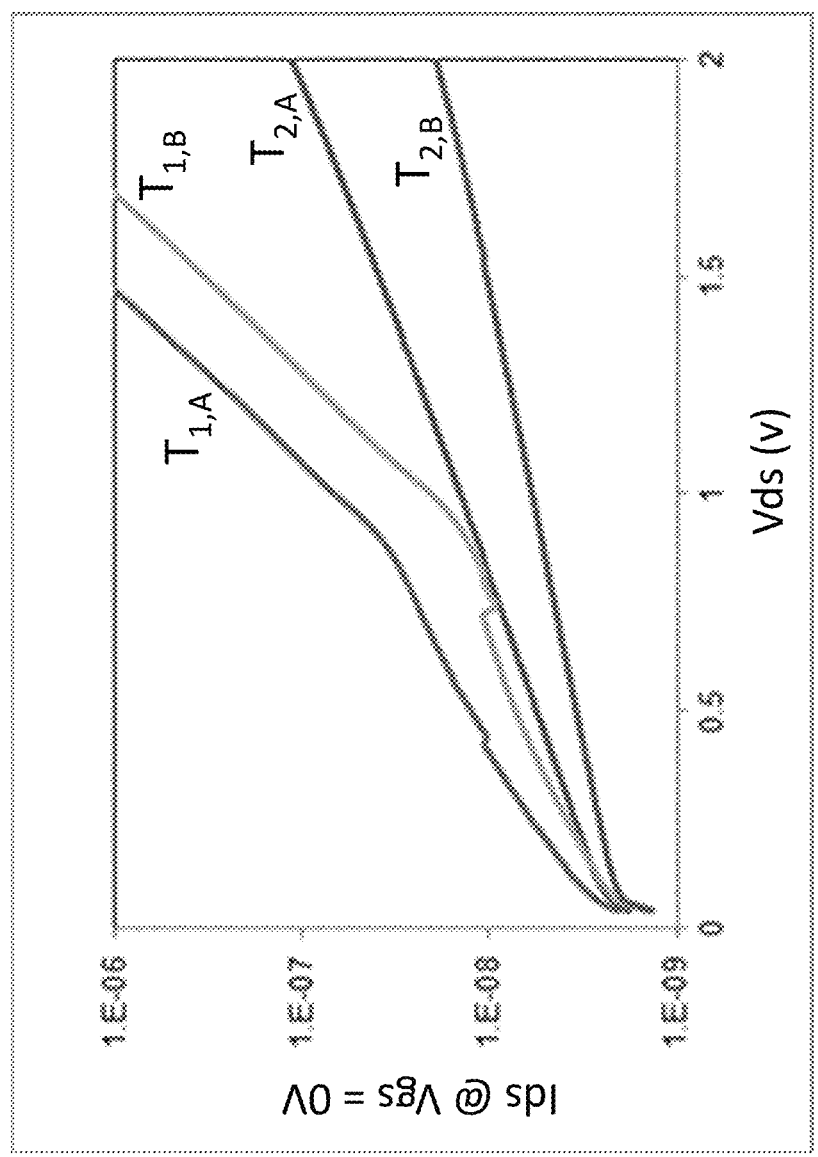
FIG. 10B shows graphs comparing the drain to source current in the off state of two floating body transistors and two transistors with the butted body tie according to the various embodiments of the present disclosure.

FIG. 10B shows graphs comparing the drain to source current (Ids) in the off state (e.g. gate to source voltage Vgs=0) of two floating body transistors ($T_{1A}$, $T_{1B}$) and two transistors with the butted body tie ($T_{2A}$, $T_{2B}$) according to the various embodiments of the present disclosure. Transistor $T_{1A}$ is identical (e.g. same gate length) to transistor $T_{2A}$, and transistor $T_{1B}$ is identical (e.g. same gate length) to transistor $T_{2B}$. The graphs of FIG. 10B clearly show that the off state current Ids (leakage current) at elevated values of the drain to source voltage Vds is lower for the case of the transistors with the butted body tie ($T_{2A}$, $T_{2B}$). Moreover, based on the graphs of FIG. 10B, it is also clear that the effective breakdown voltage (voltage Vds at which the current Ids reaches a certain level) is higher for the case of the transistors with the butted body tie ($T_{2A}$, $T_{2B}$), since at all points of the curves, Ids currents for ($T_{2A}$, $T_{2B}$) are lower than Ids currents for ($T_{1A}$, $T_{1B}$).

Figures 11A, 11B:
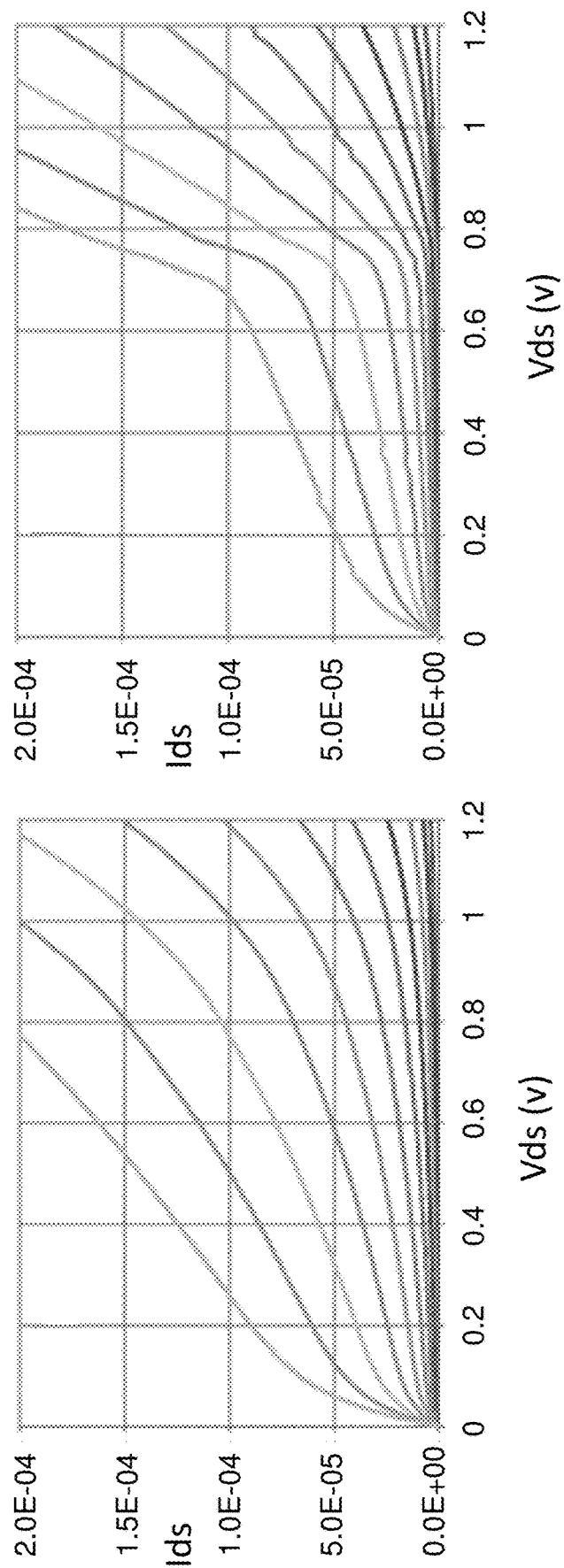
FIGS. 11A and 11B show graphs of drain to source current versus drain to source voltage of otherwise identical transistor devices with the butted body tie according to the embodiments of the present disclosure and without a body tie.

FIGS. 11A and 11B show graphs of Ids versus Vds of identical transistor devices with the butted body tie and without body tie respectively, where the gate to source voltage Vgs is stepped (varied) in steps of 25 mV. As can be seen in these graphs, the transistor with the butted body tie exhibits a smooth Ids versus Vds curve irrespective of the Vgs voltage and does not exhibit the well-known kink which is characteristic of a floating body transistor, as seen in FIG. 11B. The position of the kink seen in FIG. 11B is dependent of the Vgs voltage applied to the floating body transistor. As known to the person skilled in the art, such kink represents an abrupt decrease in output impedance of the transistor (Vds/Ids) and is not desirable in many RF applications as well as in lower frequency analog applications. As can be seen in FIG. 11B, depending on the applied Vgs voltage, the kink occurs at a Vds voltage of 0.6 V to 0.8 V.

Figure 12D:
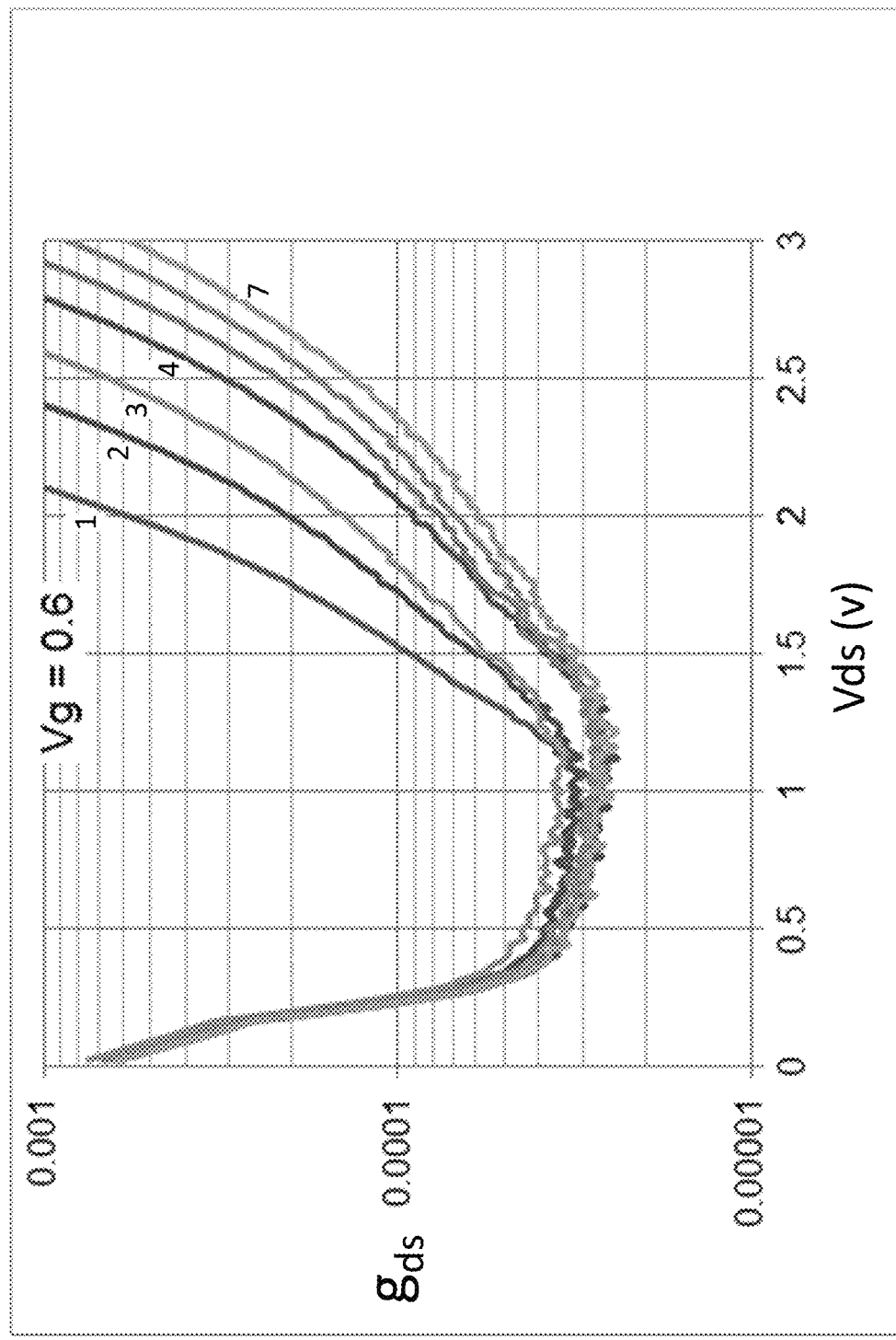
FIG. 12D shows graphs representing the output conductance versus number of body tabs of a butted body tied transistor device according to various embodiments of the present disclosure.

FIGS. 12A-12C show graphs representing the impact of number of body tabs of a butted body tied transistor according to the present invention on Ids versus Vds response of a same transistor device (e.g. same channel length and channel width). The butted body tied device (whose graph is represented) in FIG. 12A has one polysilicon tab (branching out a corresponding gate polysilicon structure), the butted body tied device in FIG. 12B has 4 polysilicon tabs and the butted body tied device in FIG. 12C has 7 polysilicon tabs each connected to a corresponding body contact region. As can be seen in the graphs of FIGS. 12A-12C, the output conductance and breakdown voltage are improved by increased number of polysilicon tabs of the butted body tied device. FIG. 12D shows graphs representative of the output conductance $g_{ds}$ versus number of body tabs of a butted body tied device of a fixed gate width $W_G$ for a fixed gate bias voltage Vg=0.6V.

Figure 14:
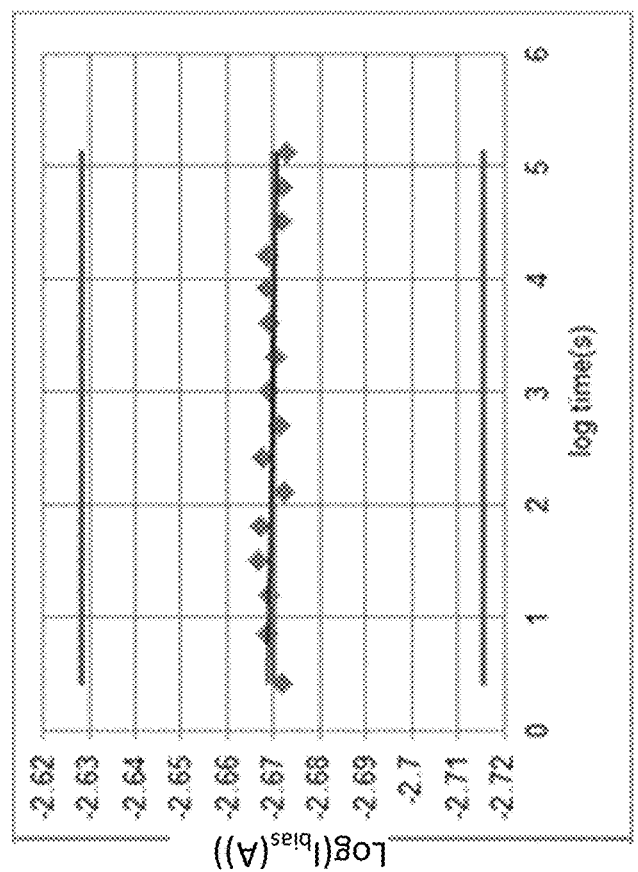
FIG. 14 shows a graph representing the impact of the butted body tie according to the present invention with respect to hot carrier injection.
Figure 13:
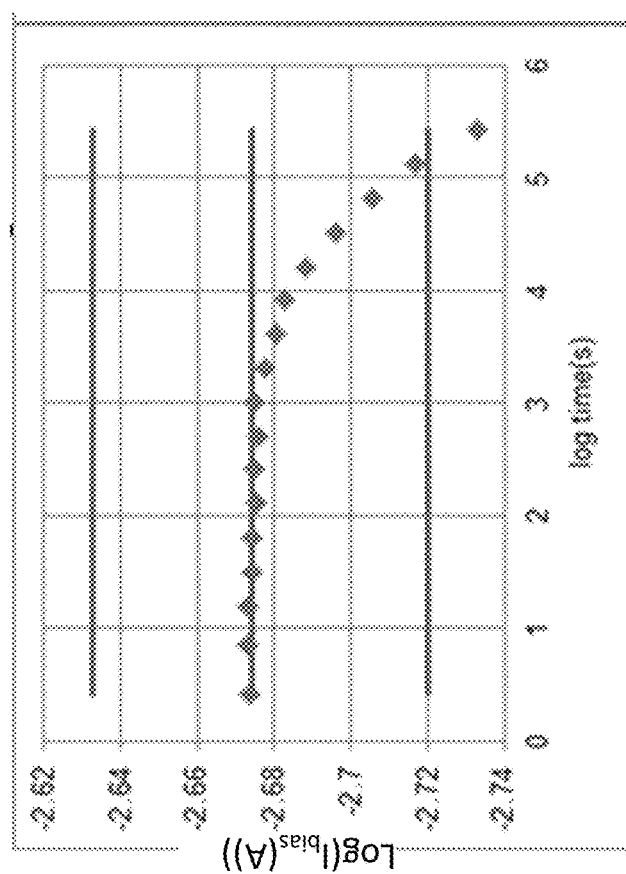
FIG. 13 shows a graph representing the impact of hot carrier injection on a floating body transistor.

FIGS. 13 and 14 show graphs representing the impact of the butted body tie on a same transistor with body tie device with respect to the hot carrier injection during the lifetime of the transistor when used in an RF application. This is measured by monitoring the change in bias current at fixed bias input voltage for identical transistors, with and without the butted body tie, operated as amplifier output transistors under RF power stress. FIG. 13 shows a graph representative of a reduction in bias current over time due to hot carrier injection for the case of the transistor without a body tie (floating transistor). As can be seen in the graph of FIG. 13, hot carrier injection causes the bias current to gradually drift and decrease over time. This can in turn result in undesired performance of the RF amplifier using such transistor device. In contrast, the graph of FIG. 14 shows that the same transistor with body tie (identical transistor) when operated under the same conditions does not exhibit a change in bias current over time. This result shows that the butted body tie of the present invention provides an effective outlet to the minority carrier charges created inside the transistor channel over time due to hot carrier injection phenomenon. A person skilled in the art will appreciate the superior performance of the butted body tie according to the present disclosure as represented in FIG. 14 and will understand the significance of such curve with respect to reliability and design-ability of the butted body tie transistor.

Figure 15A:
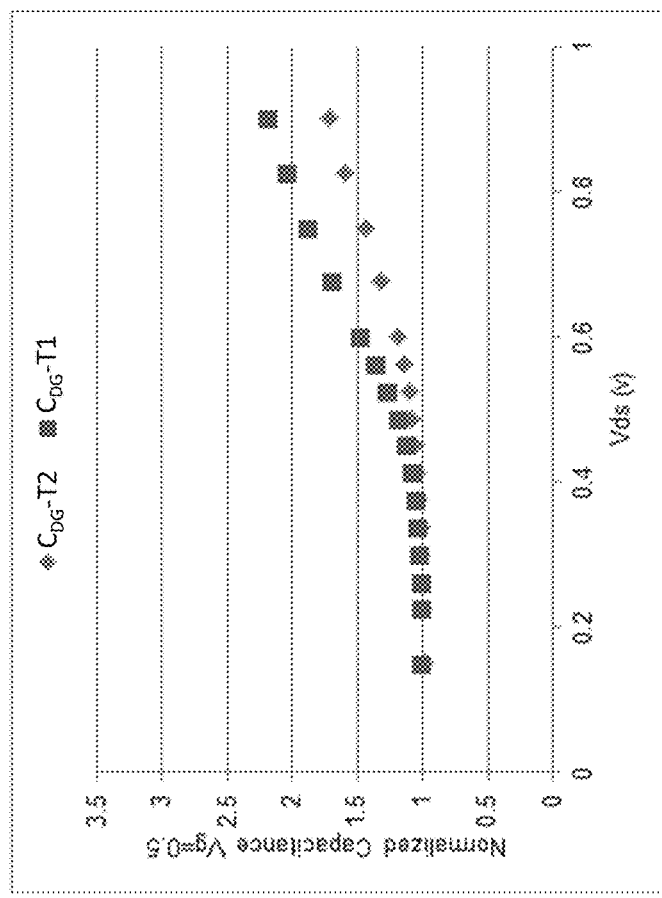
FIGS. 15A and 15B show comparative graphs representing the total gate capacitance and drain to gate capacitance of an identical transistor with various body ties and without a body tie.
Figure 15B:
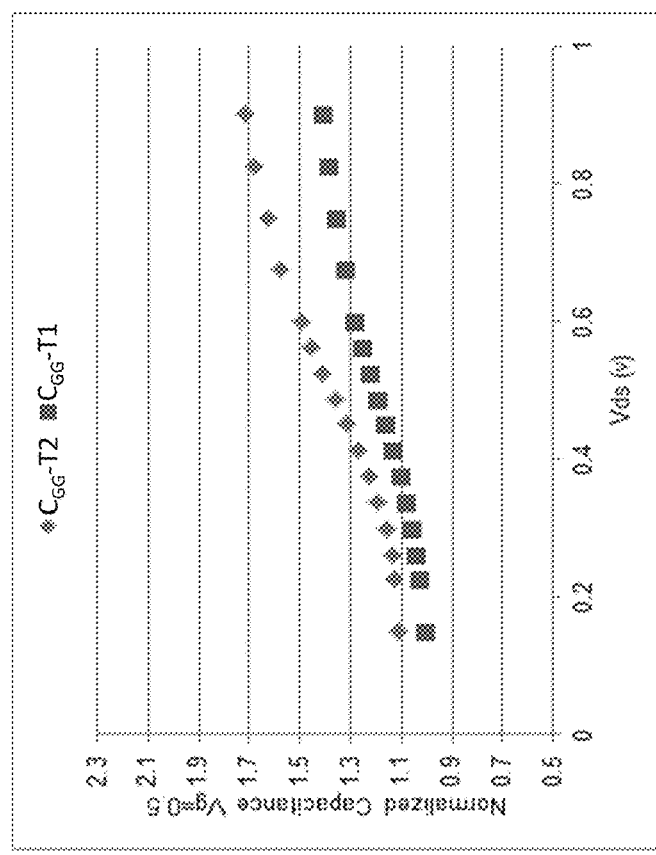

FIG. 15A shows graphs representing measured normalized total gate capacitance Cgg for a butted body tied transistor (T2) versus an identical transistor (T1) without a body tie (floating body) for a gate biasing voltage Vg=0.5 volts, and a transistor width $W_G$=10 µm. FIG. 15B shows graphs representing measured normalized Cdg for same transistors/conditions as in graphs of FIG. 15A. As can be seen in the graphs or FIGS. 15A and 15C, total capacitance is only moderately higher with the addition of the body tie, and the measured Cdg is actually lower.

Figure 16B:
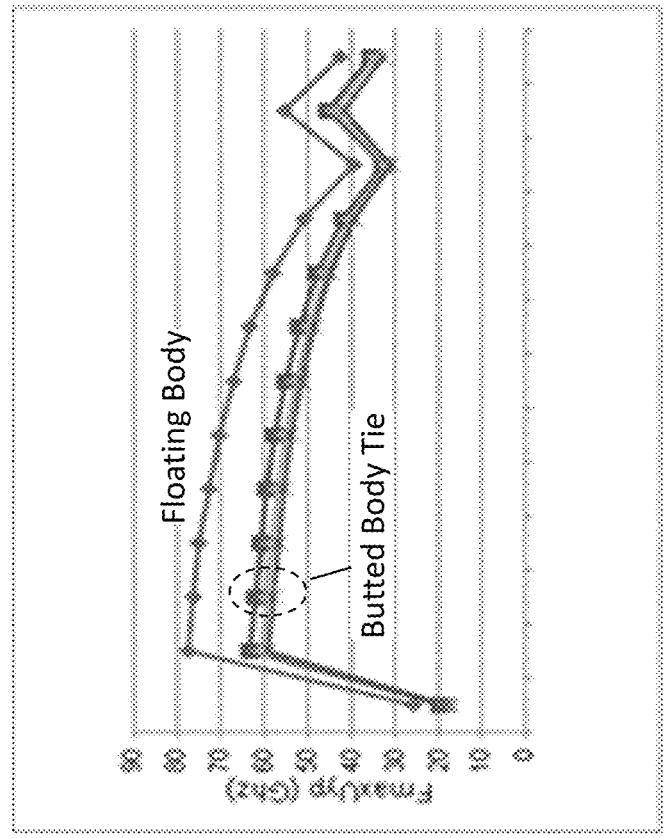
FIGS. 16A-16B show comparative graphs representing impact of the butted body tie according to the present invention on $f_T$ and $f_{max}$ frequencies of a transistor.
Figure 16A:
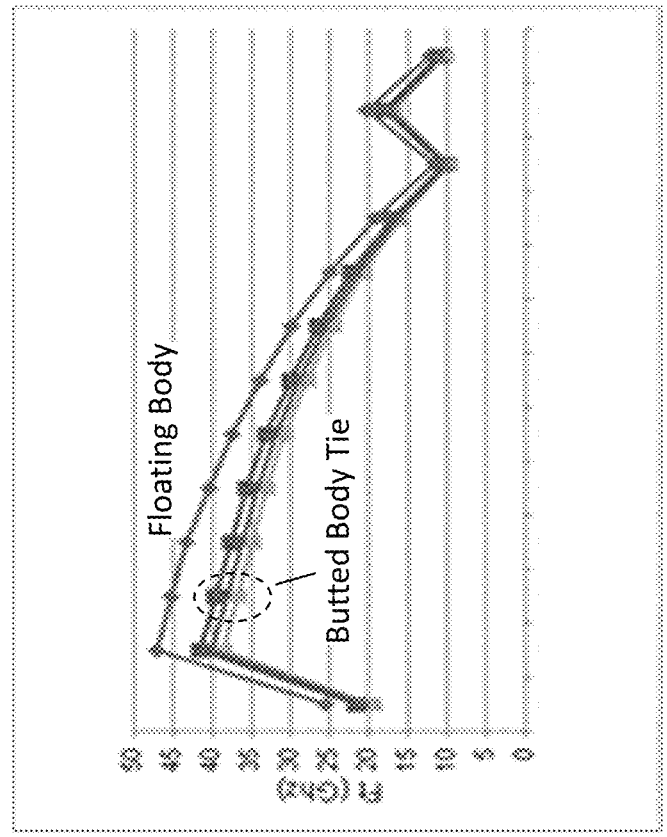

FIGS. 16A-16B show comparative graphs representing impact of the butted body tie according to the present dislcosure on $f_T$ and $f_{max}$ frequencies of a transistor. FIG. 16A shows $f_T$ data graphs for a floating body transistor (top graph) and $f_T$ data graphs for three different configurations of a butted body tied transistor, the floating body and the butted body tied transistors being otherwise identical (e.g. same channel length and width). As can be seen in the graphs of FIG. 16A, moderate decrease in $f_T$ frequency is observed. This can be attributed to the increased $C_{GS}$ capacitance obtained by the butted body tied configuration as seen in FIG. 15D. FIG. 16B shows the $f_{max}$ data graphs corresponding to same transistors/conditions as in the case of data graphs of FIG. 16A. As can be seen in the data graphs of FIG. 16B, $f_{max}$ follows $f_T$ reduction seen in the graphs of FIG. 16A, without further degradation.

Figure 17:
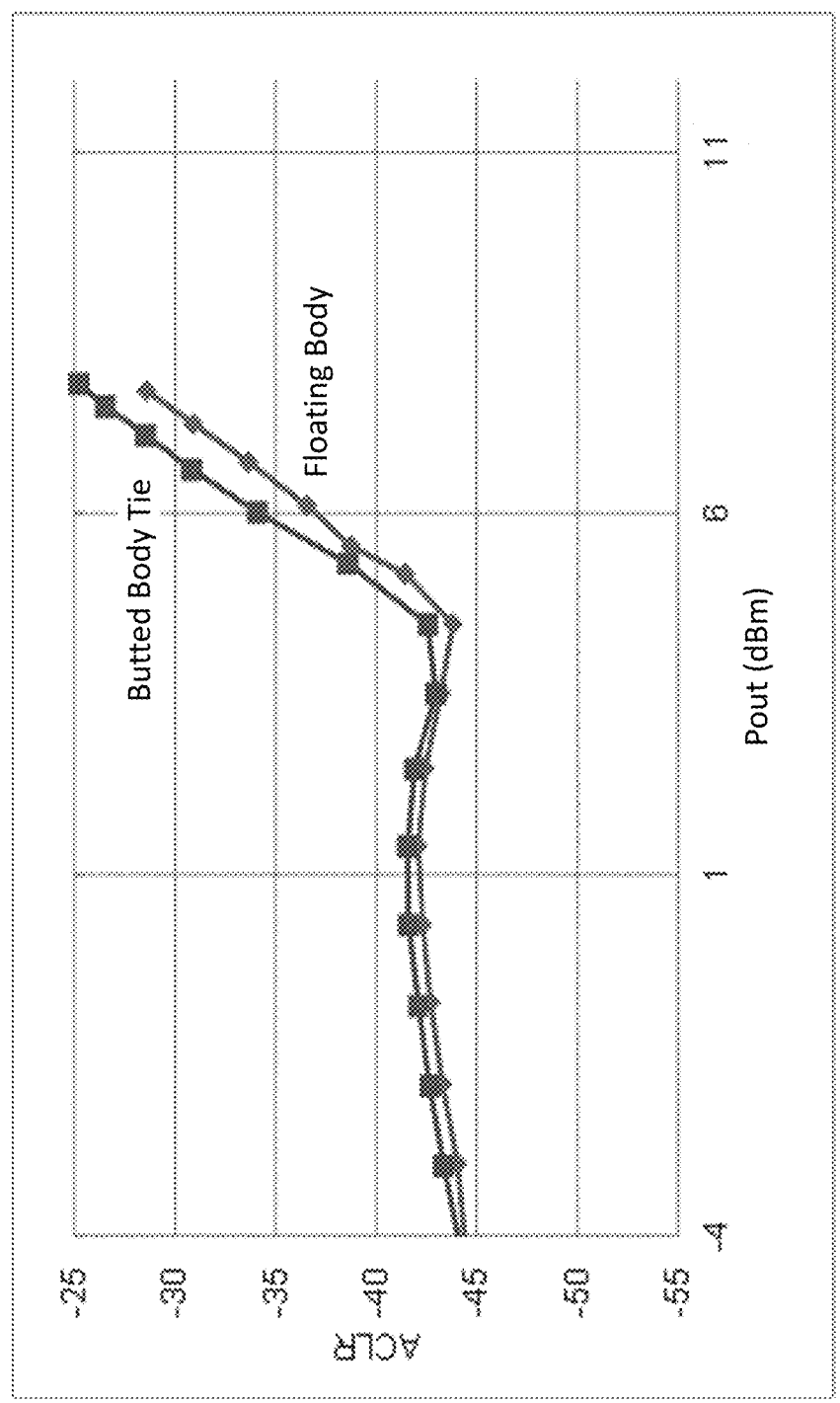
FIG. 17 shows comparative graphs representing impact of the butted body tie according to the present invention on an adjacent channel leakage ratio performance of an RF power amplifier.

FIG. 17 shows comparative graphs representing impact of the butted body tie according to the present invention on RF power amplifier application. As known to the person skilled in the art one figure of merit for RF power amplifiers is peak power added efficiency (PAE) at a given level of adjacent channel power ratio (ACPR) also known as ACLR (adjacent channel leakage ratio). The linearity and frequency requirements in RF applications do not allow the use of conventional T-gate or H-gate transistors. However, the butted body tie configuration according to the present invention can be used because it adds no drain to gate capacitance $C_{DG}$ and also adds less total gate capacitance CGG as seen in the prior graphs. Therefore, as can be seen in the graph of FIG. 17, the ACLR for the transistor with the butted body tie is sufficiently low, prior to the ACLR increasing due to transistor reaching compression. A typical plot of ACLR is shown for identical floating body and butted body tied devices in FIG. 17. Note that both transistors have an ACLR less than −40 dBc until it increases rapidly due to compression. For a wide range of device sizes and bias conditions, both the floating body and the butted body tie configurations provide an ACLR less than −40 dBc (dB relative to a corresponding RF carrier).

Figure 18:
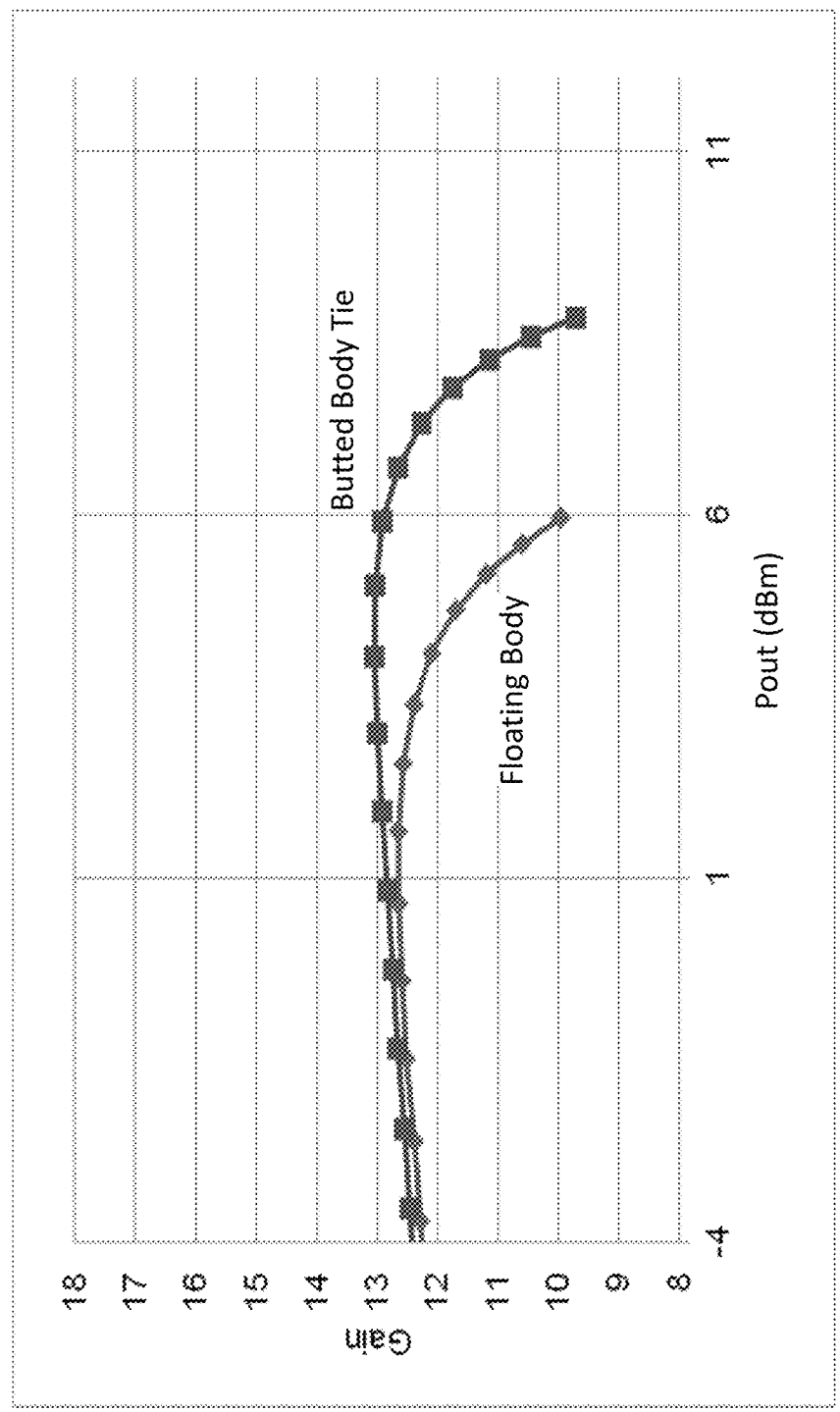
FIG. 18 shows comparative graphs representing impact of the butted body tie according to the present invention on gain versus output power (Pout) for transistors under identical bias, at relatively high voltage bias.

A higher bias voltage can allow a transistor to operate at a higher output power Pout until the transistor reaches compression, so the higher breakdown voltage provided by a butted body tied transistor can enable operation of the transistor at a higher bias voltage and therefore at a higher Pout. FIG. 18 shows data graphs representative of gain versus Pout for identical floating body and butted body tied transistors under identical bias, at relatively high voltage bias. As can be seen in the data graphs of FIG. 18, the butted body tied device can operate at a higher power prior to entering compression, the compression being represented by a reduction (drooping) in gain.

Figure 19:
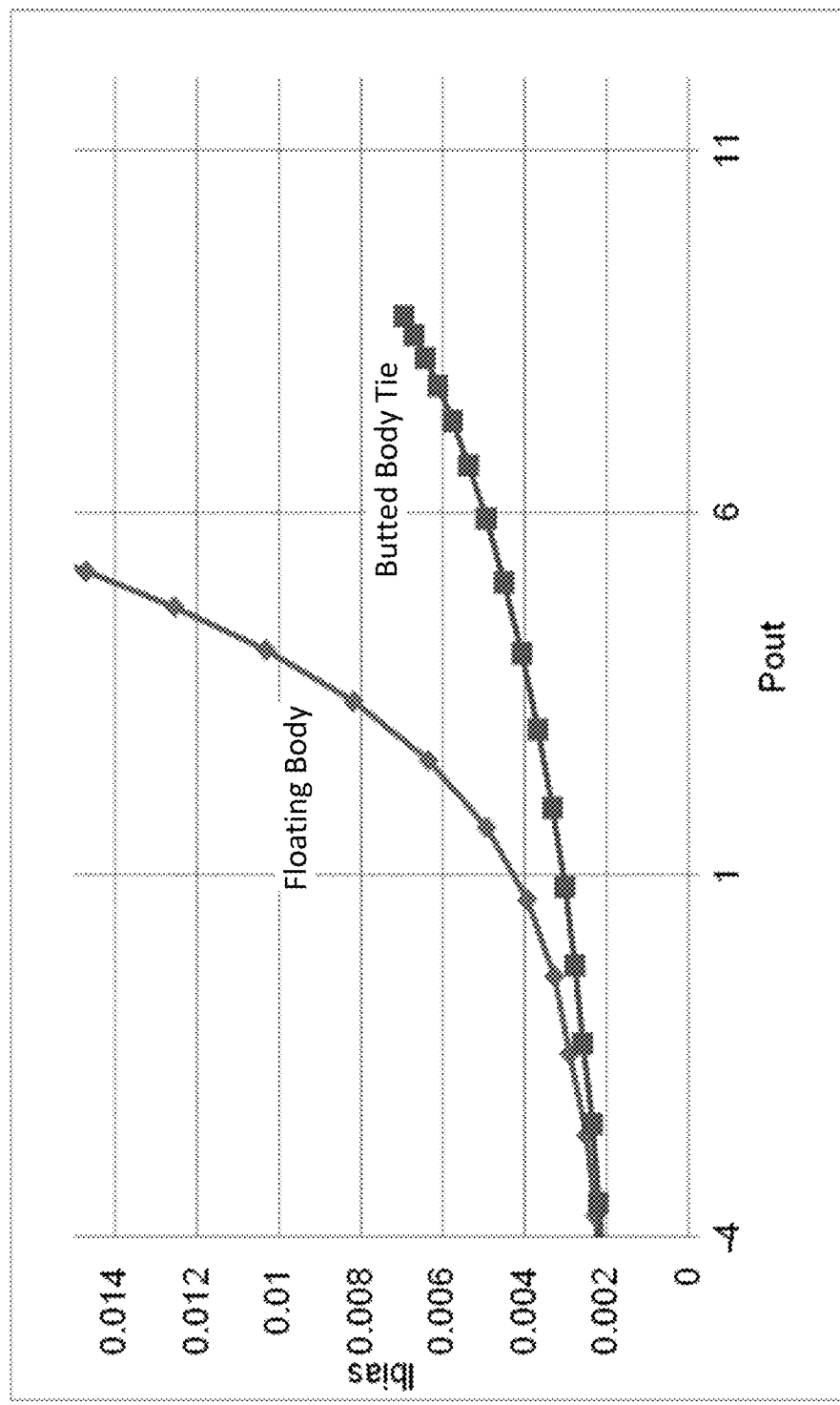
FIG. 19 shows comparative graphs representing impact of the butted body tie according to the present invention on bias current (Ibias) for a given output power of an RF power amplifier.

As is well known to the person skilled in the art, a lower bias current (Ibias) reduces the power lost in a transistor, which is wasted power and therefore lowering efficiency of the transistor. When operating at high bias voltage and high RF power, the voltage of the body region of the transistor can increase due to generated carriers. For a floating body device, body potential increases, as shown by kink in FIG. 11B discussed above. In the case of a butted body tied device per the present invention, these generated carriers are swept out via the provided body tab conduction channel. For RF applications, the bias current can increase with increased power due to the increase in body potential of the floating body transistor, especially for operating conditions that cause transient operation in the regions shown to be affected by increased body potential (kink), while for the butted body tied transistor, bias current remains well behaved. This is shown in FIG. 19.

Exemplary and non-limiting applications for transistor devices using the butted body tie according to the various embodiments of the present disclosure can include general analog circuits with body ties, power amplifiers (PAs), low noise amplifiers (LNAs), analog to digital converters (ADCs), voltage controlled oscillators (VCOs), and voltage reference circuits at frequencies ranging from DC to 100 GHz and beyond.

With the teachings according to the present disclosure, the gate length can be further optimized (gate length can be made shorter). For example, as can be seen in FIG. 10B previously described, a larger breakdown voltage can be obtained with a body tied transistor according to the present disclosure as compared to a floating body transistor. Therefore, the butted body tied transistors ($T_{2,A}$, $T_{2,B}$) of FIG. 10B can safely run at higher $V_{DS}$ voltages as compared to the floating body transistors ($T_{1,A}$, $T_{1,B}$), as the higher Ids currents associated with the latter transistors at higher $V_{DS}$ voltages can break down the transistors. As known to the skilled person, such break down of transistors ($T_{1,A}$, $T_{1,B}$) can be controlled by changing the gate length of the transistors, where larger gate lengths can allow for a higher breakdown voltage and therefore higher operating V D s voltage of the transistor. In other words, a desired breakdown voltage for the floating body transistors ($T_{1,A}$, $T_{1,B}$) is provided via a larger gate length as compared to the butted body tied transistors ($T_{2,A}$, $T_{2,B}$). Also, when compared to the prior art body tie depicted in FIG. 3A, the requirement for the overlap region between regions (110) and (340) can dictate a larger gate length.

Figure 20B:
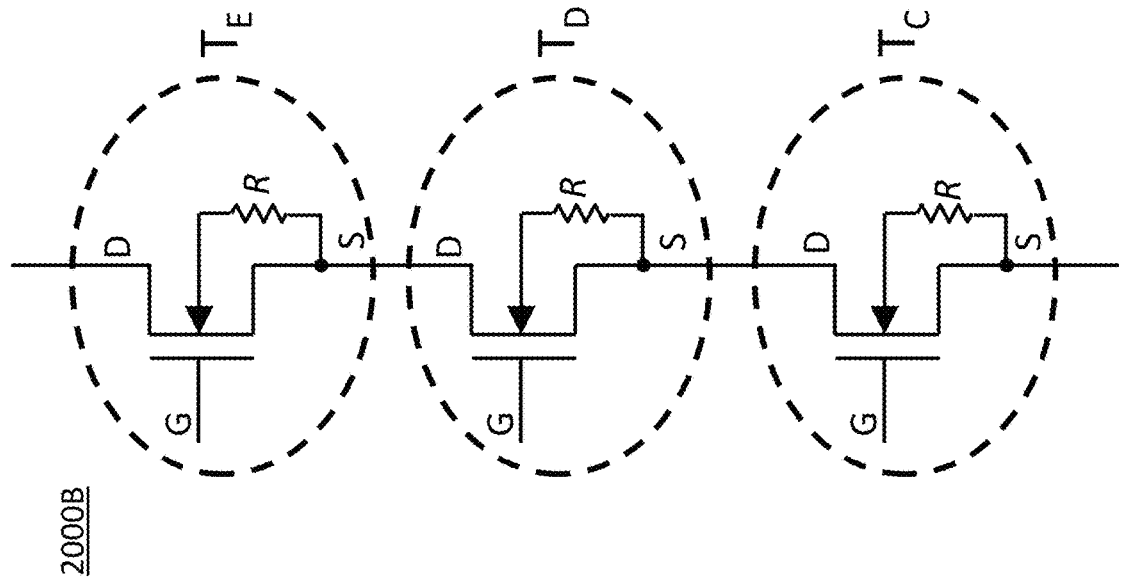
FIG. 20B shows a schematic representation of a cascode configuration comprising three stacked transistors.
Figure 20A:
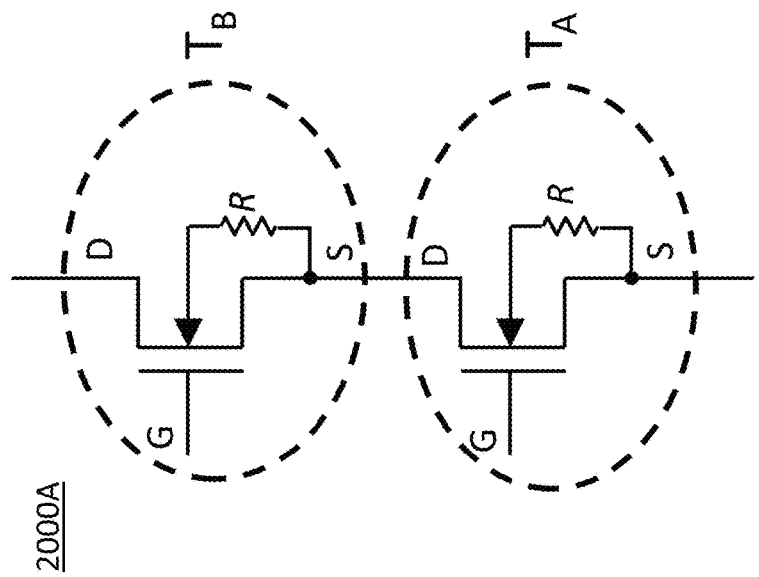
FIG. 20A shows a schematic representation of a cascode configuration comprising two stacked transistors.

As discussed above with respect to FIGS. 8C-8F, the butted body tie of the present invention can be provided to a cascode configuration comprising a plurality of stacked transistors. FIG. 20A schematically represents a cascode configuration (2000A) of two stacked transistors ($T_A$, $T_B$) and FIG. 20B schematically represents a cascode configuration (2000B) of three stacked transistors ($T_C$, $T_D$, $T_E$). As discussed above, a butted body tie to a transistor (e.g. $T_B$, $T_D$, $T_E$) can be provided by a body contact region placed in a source region of the transistor which is common to a drain region of a neighboring transistor of the cascode configuration. Throughout this document, we use these definitions of $T_A$-$T_E$ to mean transistors in the circuital arrangements as shown, for example, in FIGS. 20A and 20B, respectively. This is represented in FIG. 21A which depicts a butted body tie according to the present disclosure to the transistor $T_B$ of FIG. 20A.

Figure 21A:
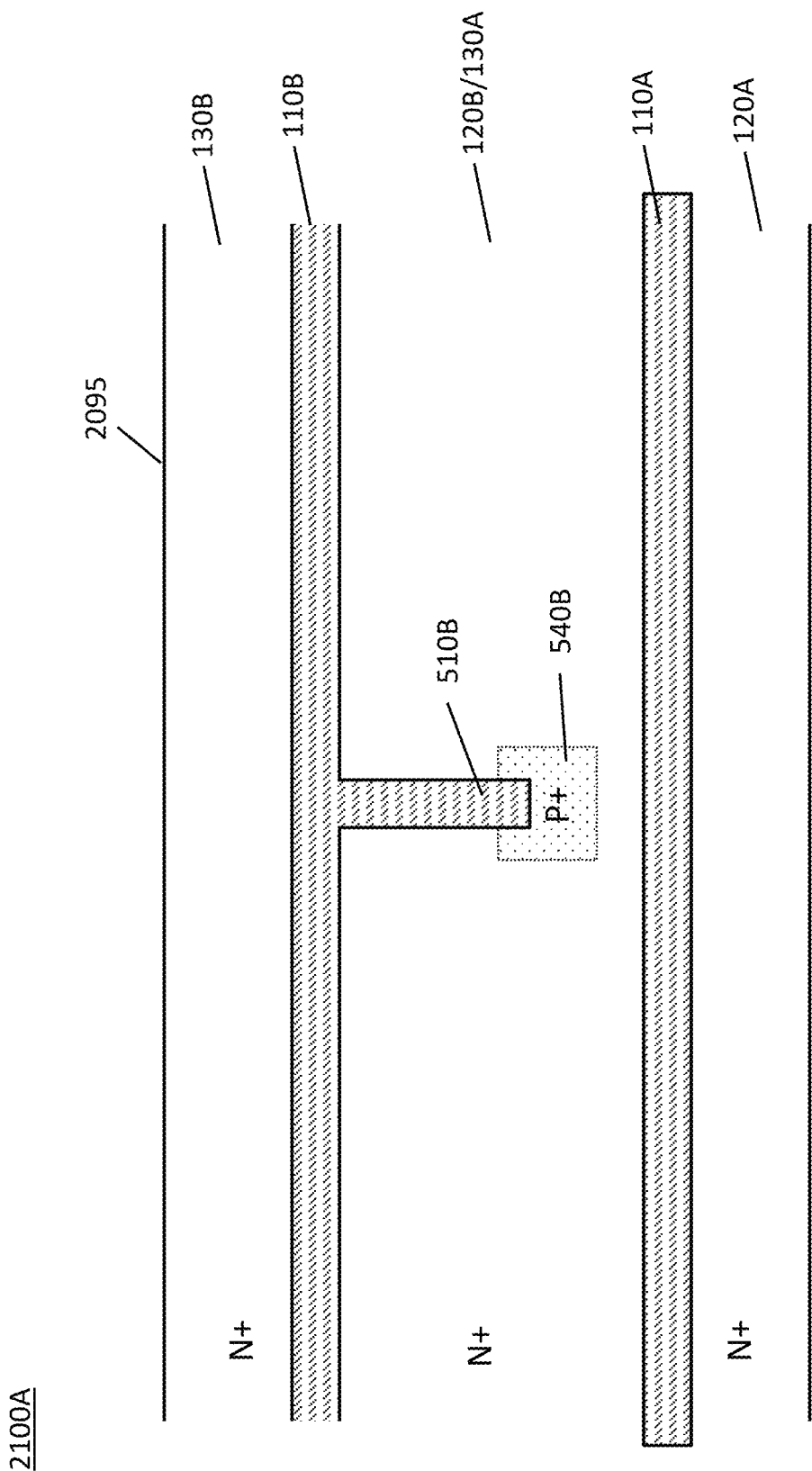
FIG. 21A shows a butted body tie according to an embodiment of the present disclosure provided to a top transistor $T_B$ of the cascode configuration represented by FIG. 20A for a case where the transistors of the cascode configuration have one finger.

As shown in FIG. 21A, a polysilicon tab (510B) connected to the gate polysilicon structure (110B) of the transistor $T_B$ extends over the common source/drain regions (120B/130A) of the transistors ($T_B$, $T_A$) to a body contact region (540B) (P+ doped, for example) formed within the common source/drain regions (120B/130A). In some cases, due to a desired physical size of the polysilicon tab (510B) and of the body contact region (540B), the spacing between corresponding gate polysilicon structures (110A, 110B) of the transistors ($T_A$, $T_B$), and therefore of the corresponding body regions defined by such gate polysilicon structures, can be larger. This is shown in FIG. 21A where the common source/drain regions create a wider common region compared to the drain region (130B) of transistor $T_B$ and the source region of transistor $T_A$, such as to provide spacing for the butted body tie (510B, 540B). Such wider region causes a larger spacing between the gate polysilicon structures (110A, 110B) of the two transistors ($T_A$, $T_B$) which can therefore cause an overall increase in a total physical size of the cascode configuration (2000A) of FIG. 20A. According to an embodiment of the present disclosure the total physical size of the cascode configuration (2000A) can be reduced while providing a butted body tie with the same desired physical size discussed above (e.g. desired physical size of structures (510B, 540B)). It should be noted that in FIG. 21A and the following figures, the various structures used to implement the various butted body ties configurations according to the present disclosure are represented by way of corresponding top view structures, where corresponding alternate views of such various structures can be readily understood by the person skilled in the art in view of the above discussion related to FIGS. 1-9D.

Figure 21B:
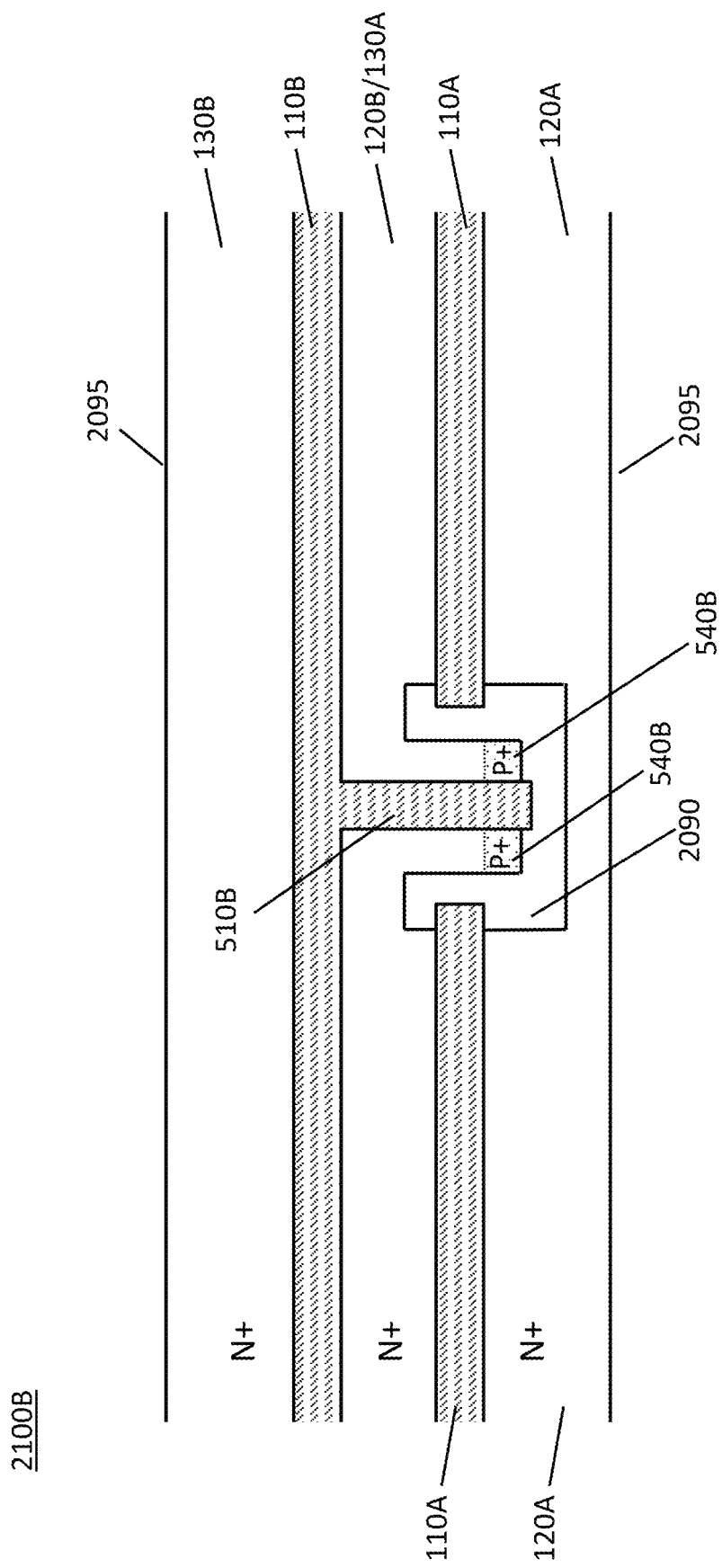
FIGS. 21B and 21D show space efficient butted body ties according to embodiments of the present disclosure provided to the top transistor $T_B$ of the cascode configuration represented by FIG. 20A for the case where the transistors of the cascode configuration each have one finger.

According to an embodiment of the present disclosure, a total physical size of the cascode configuration (2000A) with a butted body tie to the top transistor $T_B$ can be reduced by creating a break region in the gate polysilicon structure (110A) of the bottom transistor $T_A$, as shown in FIG. 21B. In the butted body tie (2100B) of FIG. 21B, presence of the break region allows the polysilicon tab (510B) to extend through the break region beyond an area that would normally contain the gate polysilicon structure (110A) and therefore allows for a smaller spacing between the two gate polysilicon structures (110A) and (110B) while maintaining the desired physical size of the polysilicon tab (510B) and the contact region (540B). In particular, in order to isolate the source region (120A) from the common source/drain regions (120B/130A), an isolation region (2090) is formed around the break region which extends into the common source/drain regions (120B/130A) of the transistors ($T_B$, $T_A$) and into the source region (120A) of the transistor $T_A$. According to further embodiments of the present disclosure depicted in FIG. 21D, the isolation region (2090) fully extends through the source region (120A) to reach a boundary (2090) of such region and therefore breaks the source region (120A) into two distinct (separate left and right) source regions (120A), each isolated from the common source/drain regions (120B/130A). The isolation region (2090) of FIGS. 21B, 21D can be formed by removing (e.g. etching, oxidizing, etc.) the silicon from the region thereby creating a non-conductive region.

Figure 21C:
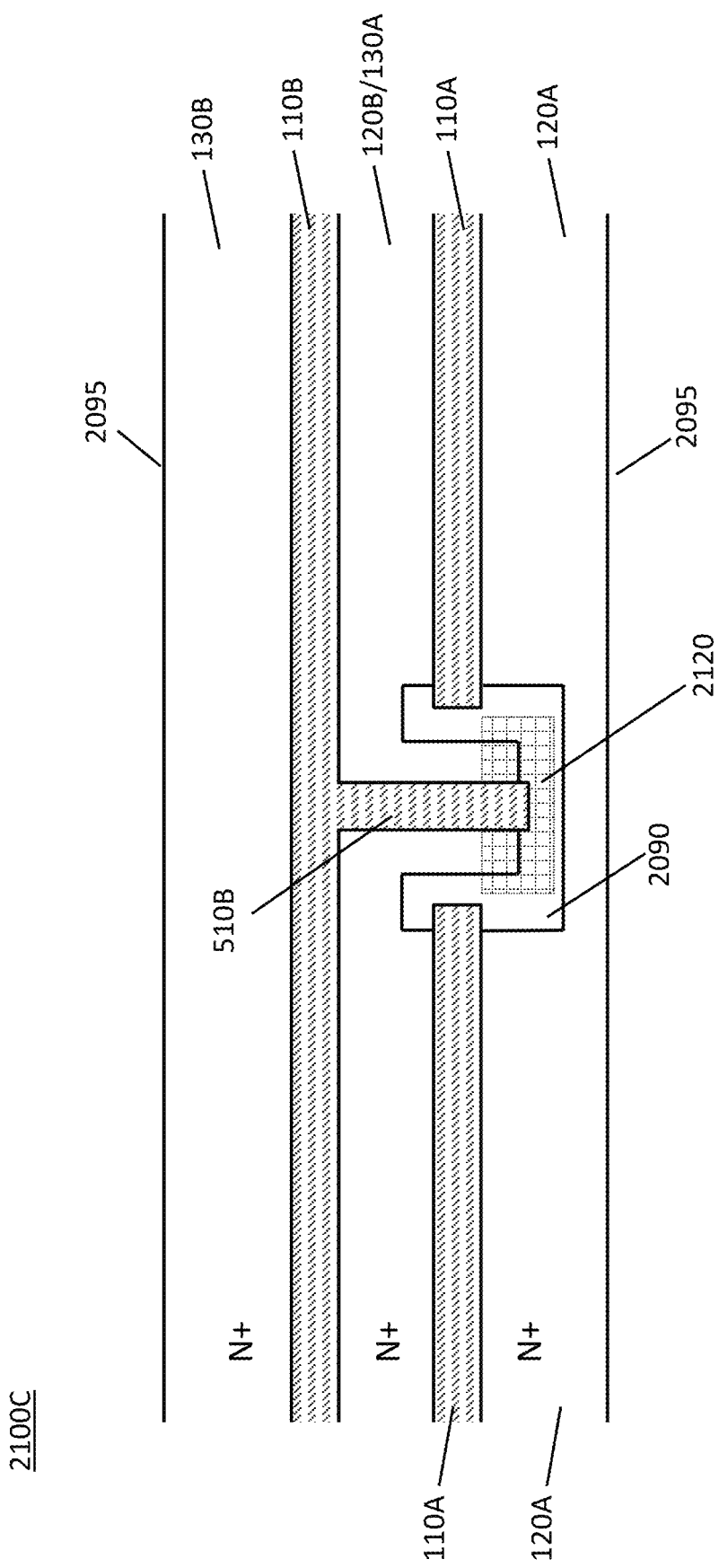
FIGS. 21C and 21E show methods for creating a body contact region for the butted body ties depicted in FIGS. 21B and 21D respectively.
Figure 21D:
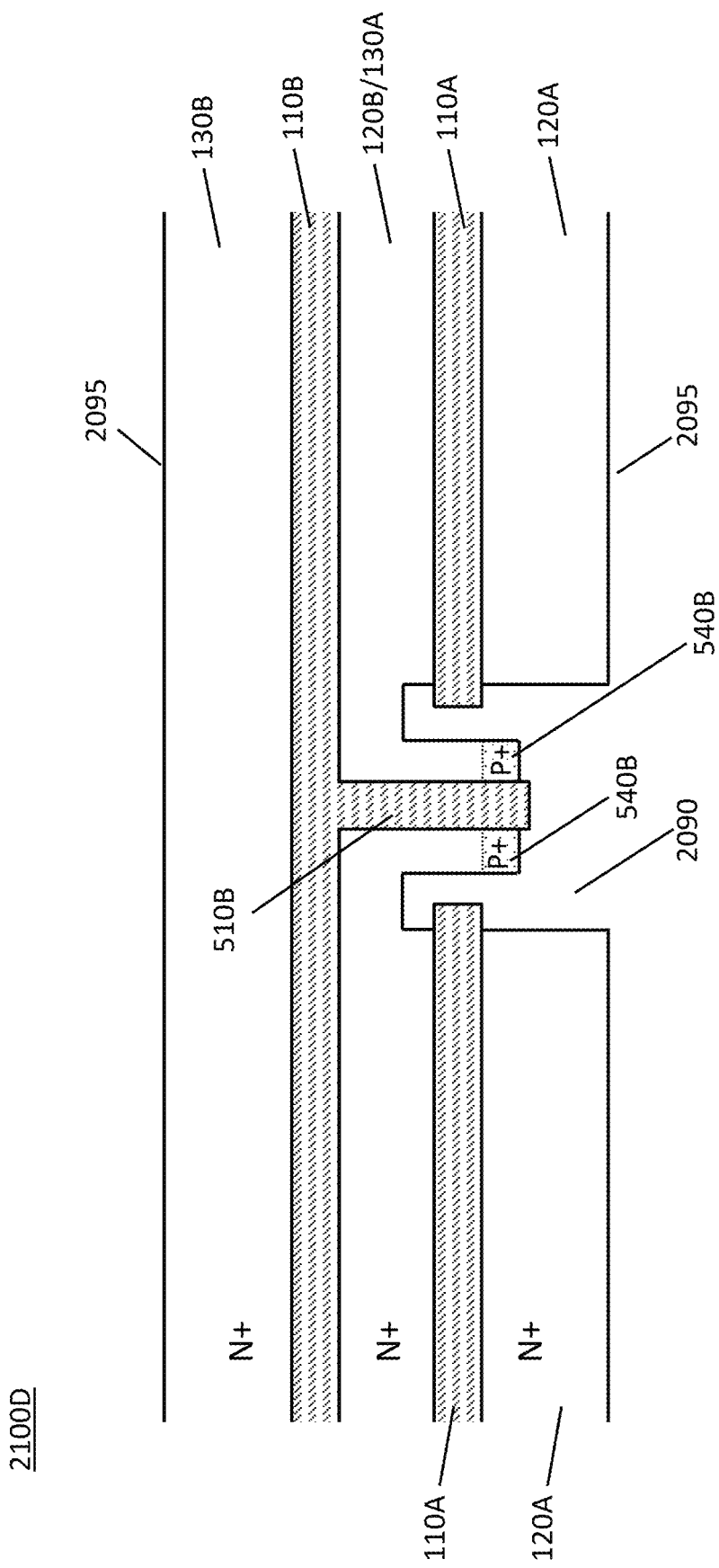

With further reference to the butted body ties (2100B, 2100D) of FIGS. 21B, 21D, the break in the gate polysilicon structure (110A) provides spacing for extension of the polysilicon tab (510B) beyond a distance corresponding to a spacing between the gate polysilicon structures (110A) and (110B), and the break in the source region (120A) formed by the isolation region (2090) provides a conduction channel for a body tab, defined by the polysilicon tab (510B), extending over a silicon region that would normally belong to the source region (120A). Additionally, as depicted in FIGS. 21B, 21D, a body contact region (540B) is formed in an area abutting the isolation region (2090) to provide a butted body tie (2100B) according to the present teachings to the transistor $T_B$ (defined by 110B, 120B, 130B). The body contact region (540B) makes contact with the body tab defined by the polysilicon tab (510B) at a distal end of the body tab away from the body region of the gate of transistor $T_B$ defined by the gate polysilicon structure (110B). The silicon region and polysilicon (gate and body tab) of the embodiment according to the present disclosure depicted in FIG. 21B are shaped such that the silicon region that forms the drain (130A) of transistor $T_A$ and the source (120B) of transistor $T_B$ is separated from the source (120A) of transistor $T_A$ but provides continuous silicon region to the body tab of transistor $T_B$ and to the region where the body tab of transistor $T_B$ extends into the body contact region (540B).

Figure 21E:
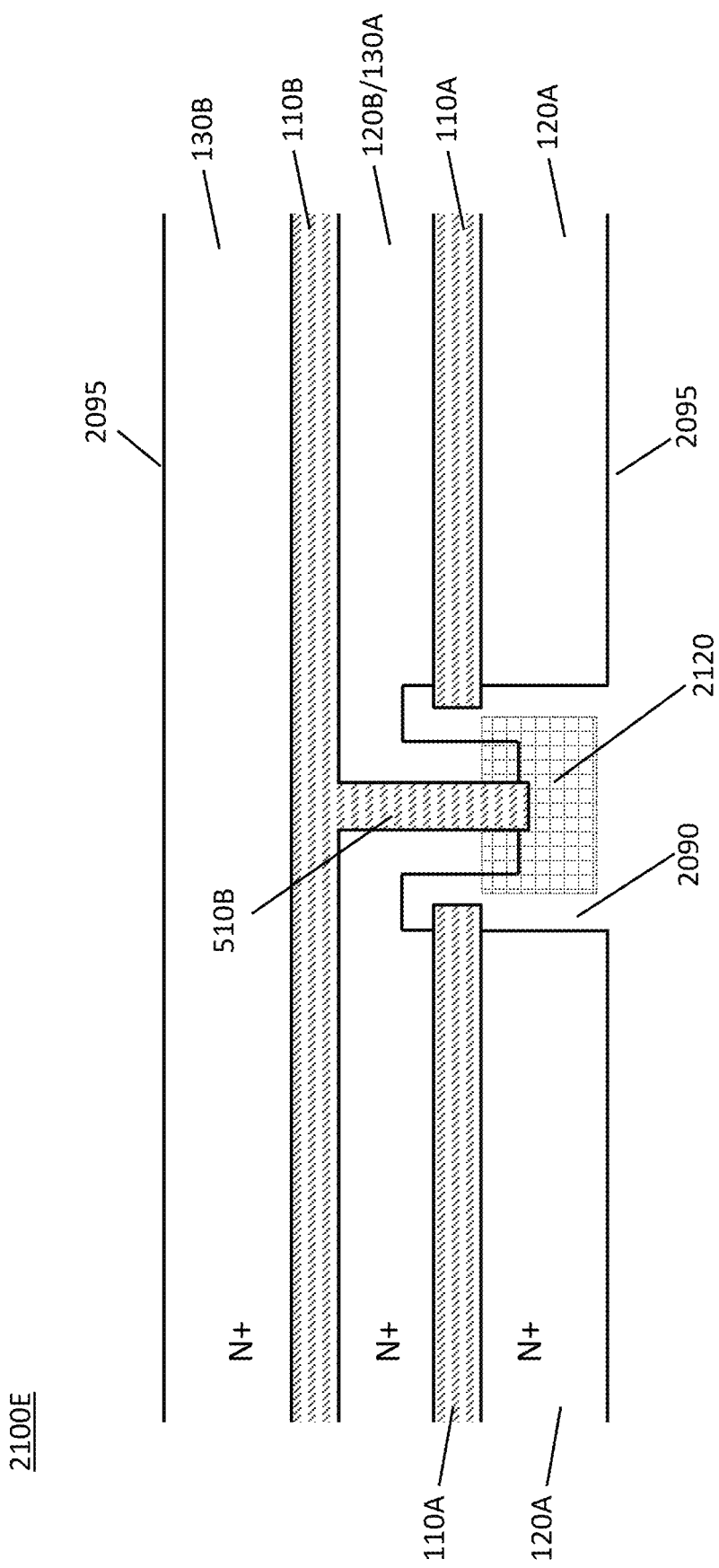

FIGS. 21C, 21E show exemplary methods according to the present disclosure to create the (P+ doped) body contact region (540B) using a target (2120) for implantation of P-type dopant. The polysilicon tab (510B) creating a barrier to the implantation of the dopant and the isolation area being devoid of silicon means that only the common area between the regions 120B/130A and the target (2120) is doped, thereby creating the body contact regions (540B) depicted in FIG. 21B. Any other methods known to a person skilled in the art can be used for creating the body contact regions (540B) according to the present teachings.

Figure 22:
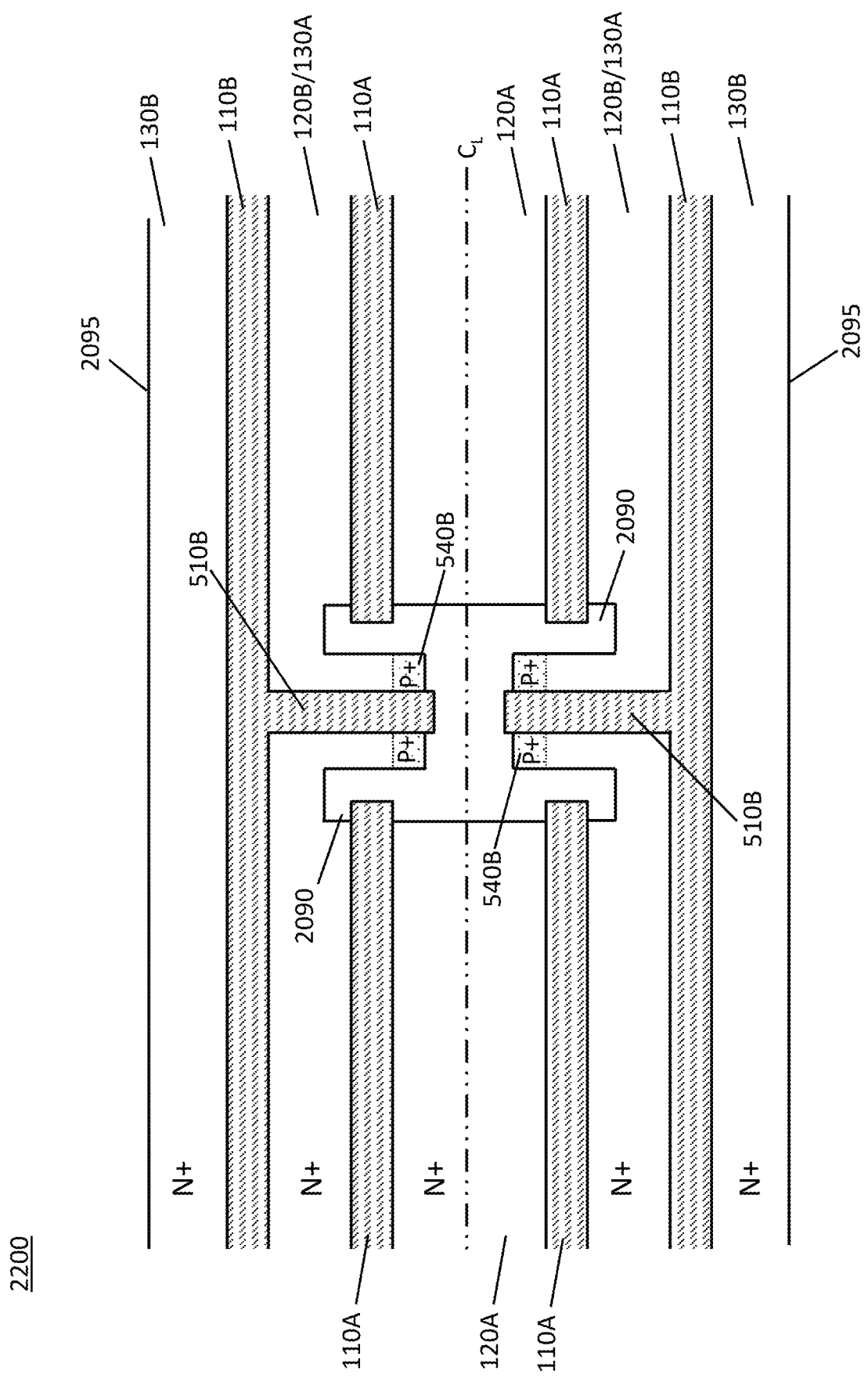
FIG. 22 shows space efficient butted body ties according to an embodiment of the present disclosure provided to the top transistor $T_B$ of the cascode configuration represented by FIG. 20A for a case where the transistors of the cascode configuration each have two fingers.

FIG. 22 shows a butted body tie implementation (2200) according to a further embodiment of the present disclosure for a case where the transistors $T_A$ and $T_B$ of the cascode configuration (2000A) each comprise more than one finger (e.g. two fingers, as defined, for example, by corresponding gate polysilicon structures (110A, 110B) of FIG. 22). The person skilled in the art will understand that the butted body tie configuration (2200) according to the present disclosure depicted in FIG. 22 is an extension of the teachings according to the embodiment (2100B, 2100D)) represented in FIG. 21B, 21D) for a case where each of the transistors ($T_A$, $T_B$) has more than one finger. FIG. 22 shows the two fingers of each of the two transistors ($T_A$, $T_B$) of the cascode configuration (2000A) mirrored about a centerline $C_L$ of the source (120A) of the transistor $T_A$ which is a common source to both fingers of the transistor. As can be seen in FIG. 22, transistor $T_A$ has two fingers mirrored around the centerline $C_L$ (each identified by a separate non-contiguous region (110A), where each separate non-contiguous region (110A) is broken at a region defined by the isolation region (2090)), each finger having similar regions (110A, 120A, 130A) mirrored about the centerline $C_L$ of the stack, the centerline $C_L$ passing through the center of the region (120A). Further away from the centerline $C_L$, and mirrored about the centerline, fingers of the transistor $T_B$ are placed, each finger having similar regions (110B, 120B, 130B), with regions (120B) being common with regions (130A) of the transistor $T_A$. Regions (130E) of the transistor $T_B$ end at areas marked by line (2095).

According to the embodiment (2200) depicted in FIG. 22, a total physical size of the cascode configuration (2000A) with a butted body tie to the top transistor $T_B$ can be reduced by creating a break region in the gate polysilicon structure (110A) of each of the fingers of the bottom transistor $T_A$, as shown in FIG. 22. The break region allows a polysilicon tab (510B) of each of the fingers of the transistor $T_B$ to extend through the break region beyond an area that would normally contain the gate polysilicon structure (110A) of an adjacent finger of the transistor $T_A$, and therefore the break region allows for a smaller spacing between the two gate polysilicon structures (110A) and (110B) of adjacent fingers while maintaining the desired physical size of the polysilicon tab (510B) and the contact region (540B) used to provide the butted body tie to each of the fingers of the transistor $T_B$. Therefore, as depicted in FIG. 22, each of the fingers (defined by gate polysilicon structures (110B)) of the top transistor $T_B$ is provided with a butted body tie defined by structures (510B, 540B) which according to an embodiment of the present disclosure can be symmetrically placed around the centerline $C_L$ of the structure (2200). It should be noted that FIG. 22 only shows butted body ties to fingers of the top transistor $T_B$ of the cascode configuration (2000A). Butted body ties to fingers of transistors of a cascode stack other than a top transistor can be seen, for example, in FIGS. 25-29B.

With further reference to the butted body tie (2200) of FIG. 22, in order to isolate the source region (120A) (common to both fingers) of each of the fingers (110A) of the bottom transistor $T_A$ of the cascode configuration (schematically represented by FIG. 20A) from each of the common source/drain regions (120B/130A), an isolation region (2090) is formed around the two break regions which breaks the source region (120A) common to both fingers (110A) of the transistor $T_A$ into two distinct (separate) source regions (120A), each isolated from both of the common source/drain regions (120B/130A). The isolation region (2090) can be formed by removing (e.g. etching, oxidizing, etc.) the silicon from the region thereby creating a non-conducting region.

With continued reference to FIG. 22, the breaks in the gate polysilicon structures (110A) provide spacing for extension of the polysilicon tabs (510B) beyond a distance corresponding to a spacing between adjacent gate polysilicon structures (110A) and (110B), and the break in the source region (120A) formed by the isolation region (2090) provides a conduction channel for a body tab defined by the polysilicon tab (510B) extending over a silicon region that would normally belong to the source region (120A). Additionally, a body contact region (540B) is formed in an area abutting the isolation region (2090) to provide a butted body tie according to the present teachings to each finger of the transistor $T_B$. The body contact region (540B) makes contact with the body tabs defined by the two polysilicon tabs (510B) at a distal end of the body tabs away from the body regions of the gates of transistor $T_B$ defined by the gate polysilicon structures (110B).

As seen in the configuration (2200) of FIG. 22, the silicon region and polysilicon structures (gates and body tabs) of the embodiment according to the present disclosure depicted in FIG. 22 are shaped such that, for each finger of the transistor $T_A$ and a corresponding adjacent finger of the transistor $T_B$, the silicon region that forms the drain (130A) of the finger of the transistor $T_A$ and the source (120B) of the adjacent finger of the transistor $T_B$ is separated from the source (120A) of transistor $T_A$ (common to both fingers of $T_A$) but at the same time provide a continuous silicon region to the body tab of the finger of transistor $T_B$ and to the region where the body tab extends into the body contact region (540B).

The butted body tie (2100B, 2200) according to the present teachings as depicted in FIG. 21B and FIG. 22 can be extended to cascode configurations with stacks higher than two, such as three, four and beyond, where breaks in gate polysilicon structures coupled with isolation areas (2090) as discussed above can be used to provide butted body ties to the transistors/fingers of the cascode stack.

Figure 23:
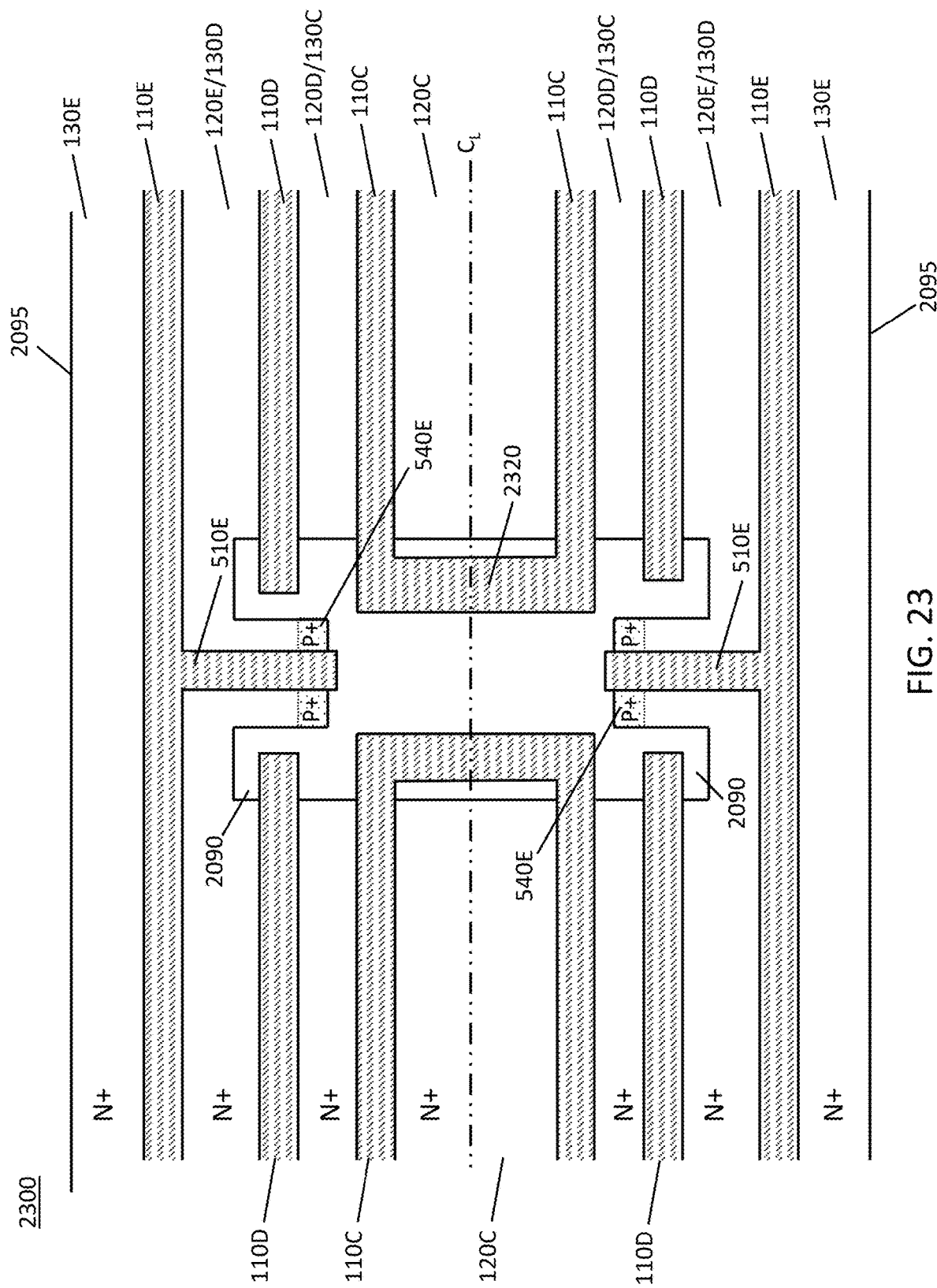
FIG. 23 shows space efficient butted body ties according to an embodiment of the present disclosure provided to the top transistor $T_E$ of the cascode configuration represented by FIG. 20B for a case where the transistors of the cascode configuration each have two fingers.

FIG. 23 shows a butted body tie implementation (2300) according to a further embodiment of the present disclosure for the three transistor ($T_C$, $T_D$, $T_E$) cascode configuration (2000B) depicted in FIG. 20B, where each transistor has at least two fingers. FIG. 23 shows two fingers of each of the three transistors ($T_C$, $T_D$, $T_E$) of the cascode configuration (2000B) mirrored about a centerline $C_L$ of the source (120C) of the (bottom) transistor $T_C$ which is a common source to both fingers of the transistor $T_C$, the common source region (120C) being interrupted by an isolation region (2090) at a central region of the source (120C). As can be seen in FIG. 23, transistor $T_C$ has two fingers mirrored around the centerline $C_L$ (each identified by a separate non-contiguous region (110C), where each separate non-contiguous region (110C) is broken at a region defined by the isolation region (2090)), each finger having similar regions (110C, 120C, 130C) mirrored about the centerline $C_L$ of the stack (the centerline passing through the center of the region (120C) along the width of the region). Further away from the centerline $C_L$, and mirrored about the centerline $C_L$, are fingers of the (middle) transistor $T_D$ (each finger identified by a separate non-contiguous region (110D), where each separate non-contiguous region (110D) is broken at a region defined by the isolation region (2090)) placed between the fingers of transistors (bottom) $T_C$ and (top) $T_E$, each finger having similar regions (110D, 120D, 130D), with regions (120D) being common with regions (130C) of the transistor $T_C$. Additionally, at the furthest ends from the centerline $C_L$ and mirrored about the centerline, are fingers of the (top) transistor $T_E$, (each finger identified by a separate contiguous region (110E)) adjacent to the fingers of the transistor $T_D$, each finger having similar regions (110E, 120E, 130E), with regions (120E) being common with regions (130D) of the transistor $T_D$, and regions (130E) ending at areas marked by lines (2095).

According to the butted body tie embodiment (2300) depicted in FIG. 23, a total physical size of the cascode configuration (2000B) with a butted body tie to the top transistor $T_E$ can be reduced by creating a break region in the gate polysilicon structure (110C, 110D) of each of the fingers of the transistors $T_C$, and $T_D$, as shown in FIG. 23. The break regions in fingers of transistor $T_D$ allow the polysilicon tabs (510E) of the fingers of the transistor $T_E$ to extend through the break regions beyond an area that would normally contain the gate polysilicon structures (110D) of the adjacent fingers of the transistor $T_D$. The break regions allow for a smaller spacing between the two gate polysilicon structures (110E) and (110D) of adjacent fingers while maintaining the desired physical size of the polysilicon tabs (510E) and the contact region (540E) used to provide the butted body tie to each of the fingers of the transistor $T_E$. As can be seen in FIG. 23, the break regions in the polysilicon gate structures (110D) and (110C) are substantially at a same position along the width of the fingers and are substantially of a same size along said width.

With further reference to FIG. 23, in order to isolate the source region (120C) (common to both fingers of $T_C$) of each of the fingers (110C) of the bottom transistor $T_C$ from each of the common source/drain regions (120E/130D) and (120D, 130C), an isolation region (2090) is formed in regions around the (four) break regions, thereby breaking the source region (120C) and the common source/drain regions (120D/130C). This can be seen in FIG. 23, where the isolation region (2090) breaks each of the common source/drain regions (120D/130C) and the common source region (120C) into two distinct (and isolated) regions (one on each side of the isolation region (2090)), each distinct region being isolated from all the other source and/or drain regions of the other fingers in the stack. Although not shown in FIG. 23, the person skilled in the art will realize that where required, electrical continuity amongst the regions broken by the isolation region (2090) can be provided by way of contacts (e.g. as exemplified by contacts 154, 155 of FIG. 6) in the broken regions and metal layers used to jumper such contacts. Also, it should be noted that electrical continuity across broken regions which are not to be tied to external signals, such as the broken common source/drain region (120D/130C) (with reference to the cascode configuration of FIG. 20B), need not be provided, as flow of current across the length of corresponding fingers is not prevented by the broken regions.

With continued reference to FIG. 23, the breaks in the gate polysilicon structures (110D) provide spacing for extension of the polysilicon tabs (510E) beyond a distance corresponding to a spacing between adjacent gate polysilicon structures (110E) and (110D), and the breaks in the common source/drain regions (120D/130C) and in the common source region (120C) formed by the isolation region (2090) provide a conduction channel for a body tab defined by each of the polysilicon tabs (510E) associated with each of the fingers of the transistor $T_E$, where the body tab extends over a silicon region that would normally belong to the common source/drain regions (120D/130C). Finally, a body contact region (540E), isolated from regions (120D/130C) and (120C), is formed in an area abutting the isolation region (2090) to provide a butted body tie according to the present teachings to each finger of the transistor $T_E$. The body contact region (540E) makes contact with the body tabs defined by the two polysilicon tabs (510E) at a distal end of the body tabs away from the body regions of the gates of the transistor $T_E$ defined by the gate polysilicon structures (110E).

As seen in the butted body tie configuration (2300) of FIG. 23, the silicon region and polysilicon structures (gates and body tabs) of the embodiment according to the present disclosure depicted in FIG. 23 are shaped such that, for fingers of the transistors $T_C$, $T_D$ and $T_E$ on a same side of the centerline $C_L$ of the configuration (2300), the silicon region that forms the drain region (130D) of the finger of the transistor $T_D$ and the source region (120E) of the finger of the transistor $T_E$, the silicon region that forms the drain region (130C) of the finger of the transistor $T_C$ and the source region (120D) of the finger of the transistor $T_D$, and the silicon region that forms the source region (120C) of the transistor $T_C$ (common to both fingers of $T_C$) are separated from each other, but at the same time provide a continuous silicon region to the body tab of the finger of transistor $T_E$ (defined by the polysilicon tab (510E)) and to the region where the body tab extends into the body contact region (540E).

With further reference to FIG. 23, as the breaks in the gate polysilicon structures (110C) create isolated gate body regions, vertical polysilicon structures (2320) can be used to join adjacent gate polysilicon structures on each side of the breaks and within the isolation region (2090). According to some embodiments of the present disclosure, such vertical polysilicon structures (2320) can be made wide enough to be fitted with contacts to metal layers (not shown in the figure) used to restore continuity to the broken gate polysilicon structure (e.g. via jumpering of the contacts), and thereby restoring a continuous gate channel for the transistor $T_C$. The person skilled in the art is well aware of the various methods and structures used to create such contacts to metal layers.

Figure 24:
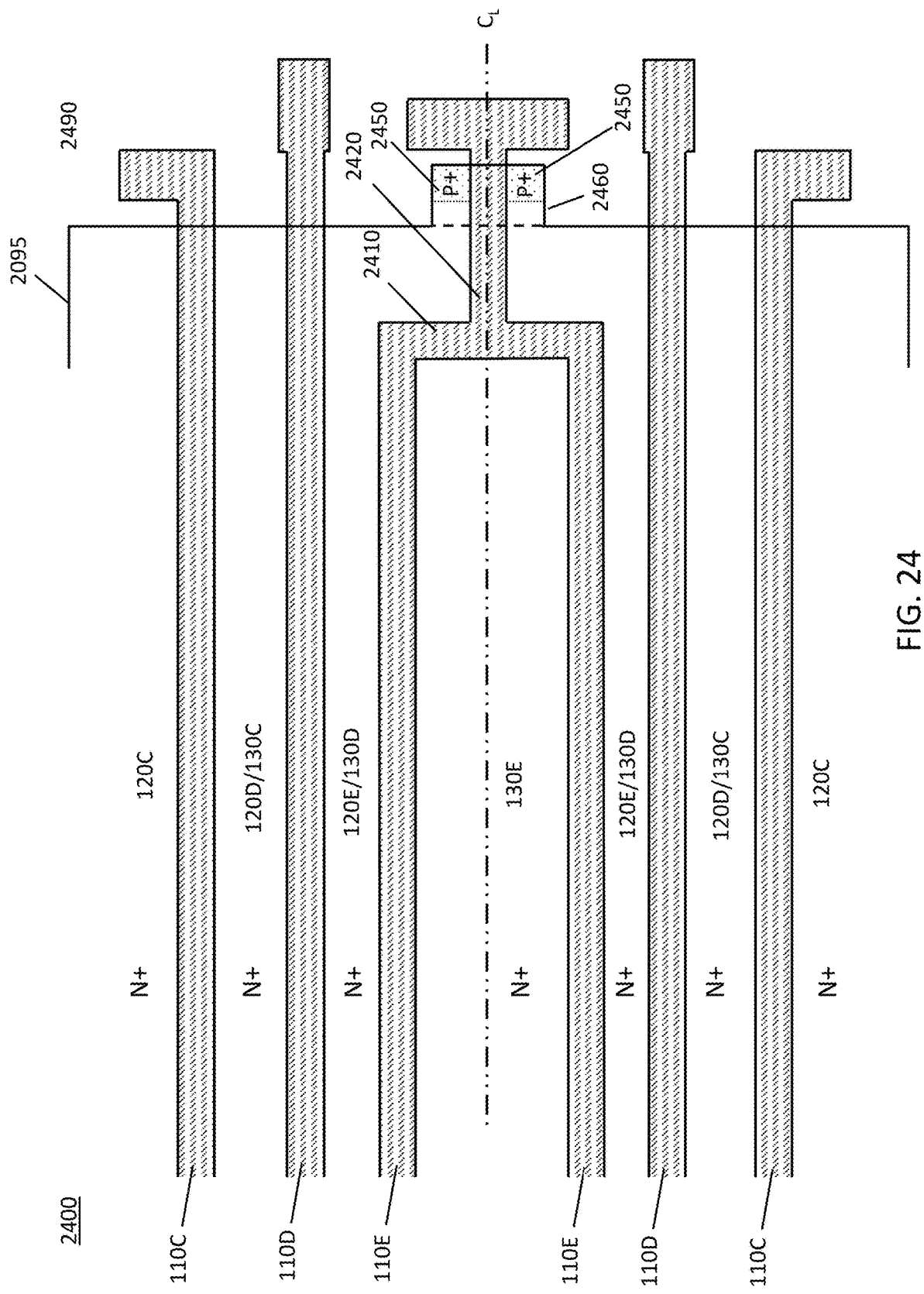
FIG. 24 shows butted body ties according to an embodiment of the present disclosure provided to fingers of the top transistor $T_E$ of the cascode configuration represented by FIG. 20B for a case where the transistors of the cascode configuration each have two fingers.

FIG. 24 shows a butted body tie implementation (2400) according to a further embodiment of the present disclosure for the top transistor $T_E$ of the three transistor ($T_C$, $T_D$, $T_E$) cascode configuration (2000B) depicted in FIG. 20B. FIG. 24 shows two fingers of each of the three transistors ($T_C$, $T_D$, $T_E$) of the cascode configuration (2000B) mirrored about a centerline $C_L$ of the drain region (130E) of the (top) transistor $T_E$ which is a common drain region to both fingers of the transistor $T_E$. As can be seen in FIG. 24, transistor $T_E$ has two fingers (each identified by a corresponding region (110E)), each finger having similar regions (110E, 120E, 130E) mirrored about the centerline $C_L$ (the centerline passing through the center of the region (130E) along the width of the region). Further away from the centerline $C_L$, and mirrored about the centerline $C_L$, are fingers of the (middle) transistor $T_D$ placed between the fingers of transistors (bottom) $T_C$ and (top) $T_E$, each finger having similar regions (110D, 120D, 130D), with regions (130D) being common with regions (120E) of the transistor $T_E$. Finally, at the furthest ends from the centerline $C_L$ and mirrored about the centerline, are fingers of the (bottom) transistor $T_C$, adjacent to the fingers of the transistor $T_D$, each finger having similar regions (110C, 120C, 130C), with regions (130C) being common with regions (120D) of the transistor $T_D$, and regions (120C) ending at areas marked by lines (2095). It should be noted that FIG. 24 only shows butted body ties to fingers of the top transistor $T_E$ of the cascode configuration (2000B). Butted body ties to fingers of transistors of a coscode configuration other than a top transistor can be seen, for example, in FIGS. 21A-21E, 22, and 25-29B described above.

The butted body tie (2400) according to the present disclosure depicted in FIG. 24 provides a common contact region (2450) (e.g. P+ doped) to the body regions of the fingers of the transistor $T_E$. As can be seen in FIG. 24, the two gate polysilicon structures (110E) are not each extended through the silicon region and across the boundary of the silicon region (defined by the outline (2095)) into the region (2490), but rather they are joined within an area of the silicon region, through a perpendicular polysilicon structure (2410) which defines an underlying common body region to the two body regions defined by the structures (110E). A horizontal polysilicon tab (2420) is then formed at a midpoint (or thereabouts) of the structure (2410) and extends horizontally towards the edge of the silicon region (area contained within the outline (2095)), to form an underlying region of a same type doping as the body regions. Similar to the body tabs discussed above, the horizontal polysilicon tab (2420) provides a low resistivity conduction path (e.g. body tab) between the body regions underneath the gate polysilicon regions (110E) and a body contact region (2450). According to an exemplary embodiment of the present disclosure, the silicon region surrounding the horizontal polysilicon tab (2420) at a vicinity of the boundary of the silicon region defined by the outline (2095) is extended to provide an extension region (2460) where a body contact region (2450) is formed. As can be seen in FIG. 24, the body contact region (2450) is formed at a distal end of the extension region (2460) and abuts the non-silicon region defined by the outline (2095) while making contact with the body tab defined by the horizontal polysilicon tab (2420). The dotted line in FIG. 24 on one side of the extension region defines a normal boundary of the silicon region without the extension region (2460).

Although the butted body ties according to the present teachings discussed above were described to provide a butted body tie to (fingers of) a top transistor of a cascoded configuration of stacked transistors, such as for transistor $T_B$ of FIG. 20A and transistor $T_E$ of FIG. 20B, such butted body ties can also be used, together, in a same cascoded configuration of stacked transistors comprising two, three, four or more stacked transistors (e.g. FIGS. 8I-8K and FIGS. 20A-20B), to provide butted body ties to fingers of the lower transistors of the stack as described with reference to FIGS. 25-29B described below. In cases where the transistors of the cascode stack comprise more than one finger, one or more fingers of a same transistor can be provided with such butted body ties, and/or one or more fingers of the same transistor can be provided without a butted body tie. Teachings according to the present disclosure provide methods and structures for forming such butted body ties using standard, known in the art, fabrication steps, which the person skilled in the art can use to satisfy his/her design requirements. In cases where space efficiency is a requirement, butted body ties (2100B, 2200, 2300, 2400) according to the present disclosure depicted in FIGS. 21B-24 can be used to reduce spacing between adjacent fingers.

Figure 25:
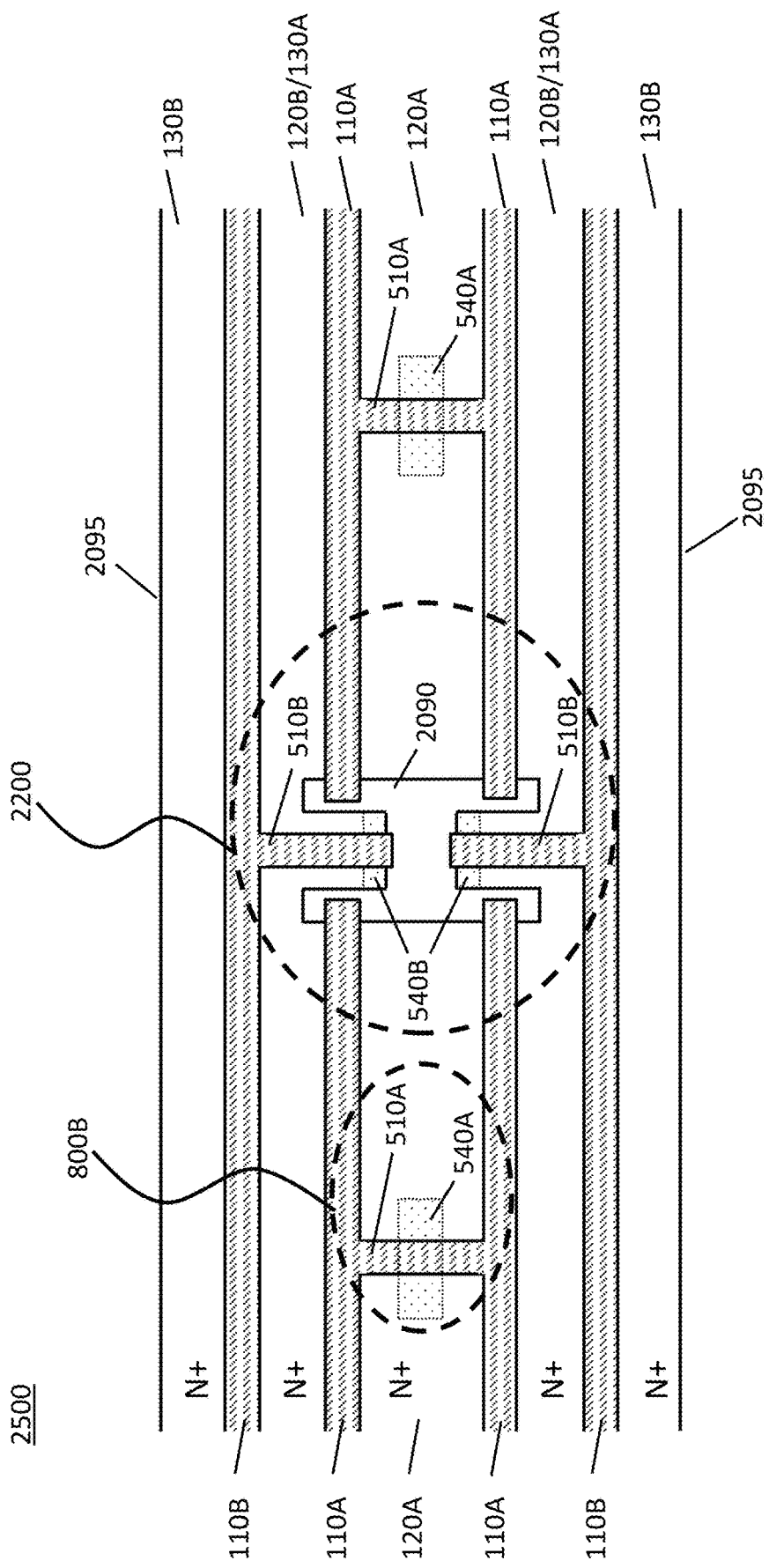
FIG. 25 shows a section of the cascode configuration represented by FIG. 20A with butted body ties according to FIG. 8B and FIG. 22 provided to the various fingers of the transistors of the cascode configuration.

FIG. 25 shows a section of a two transistor cascode stack (e.g. FIG. 20A) with butted body ties according to the present teachings described above. FIG. 25 shows two fingers of each of the transistors $T_A$ and $T_B$ mirrored about a centerline of a source region of the (bottom) transistor $T_A$. As can be seen in FIG. 25, a butted body tie (2200) according to the above described FIG. 22 is provided to the fingers of the top transistor $T_B$ (defined by date polysilicon structures (110B)), the butted body tie being formed by structures (510B, 540B, 2090). As previously described, the structures (510B) define underlying (low resistivity) conduction regions of a same doping as the body regions of the fingers that electrically connect the body regions of the fingers to the body contact region (540B). Butted body ties (800B) according to the above described FIG. 8B are provided to the bottom transistor $T_A$ of the cascoded stack, the butted body ties being defined by structures (510A, 540A).

Figure 26:
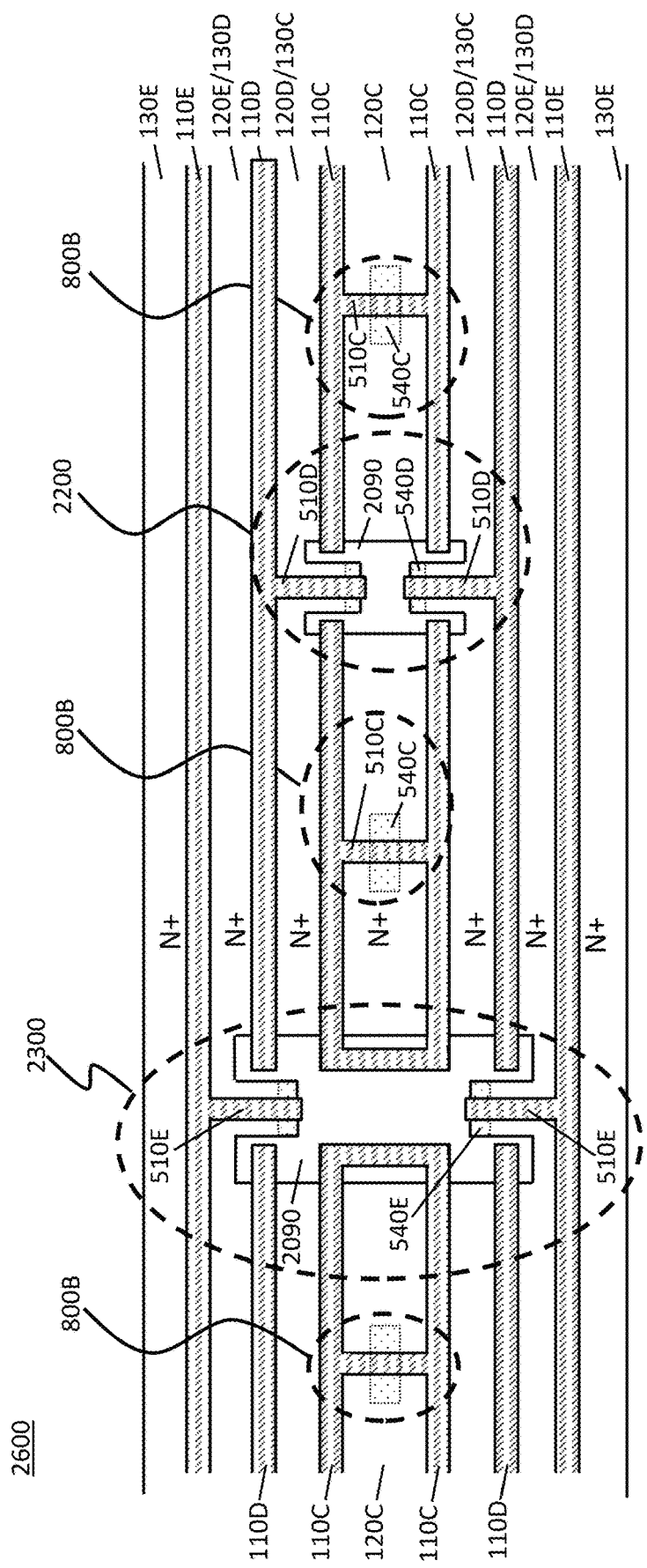
FIG. 26 shows a section of the cascode configuration represented by FIG. 20B with butted body ties according to FIG. 8B, FIG. 22 and FIG. 23 provided to the various fingers of the transistors of the cascode configuration.

FIG. 26 shows a section of a three transistor cascode stack (e.g. FIG. 20B) with butted body ties according to the present teachings described above. FIG. 26 shows two fingers of each of the transistors $T_C$, $T_D$ and $T_E$ mirrored about a centerline of a source region of the (bottom) transistor $T_C$. As can be seen in FIG. 26, a butted body (2300) tie according to the above described FIG. 23 is provided to the fingers of the top transistor $T_E$ (defined by date polysilicon structures (110E)), the butted body tie (2300) being formed by structures (510E, 540E, 2090). As previously described, the structures (510E) define underlying (low resistivity) conduction regions of a same doping as the body regions of the fingers that electrically connect the body regions of the fingers to the body contact region (540E). Butted body ties (2200) according to the above described FIG. 22 are provided to the fingers of the middle transistor $T_D$, the butted body ties (2200) being formed by structures (510D, 540D, 2090). Finally, butted body ties (800B) according to the above described FIG. 8B are provided to the bottom transistor $T_C$ of the cascoded stack of three, the butted body tie (800B) being defined by structures (510C, 540C).

Figure 27:
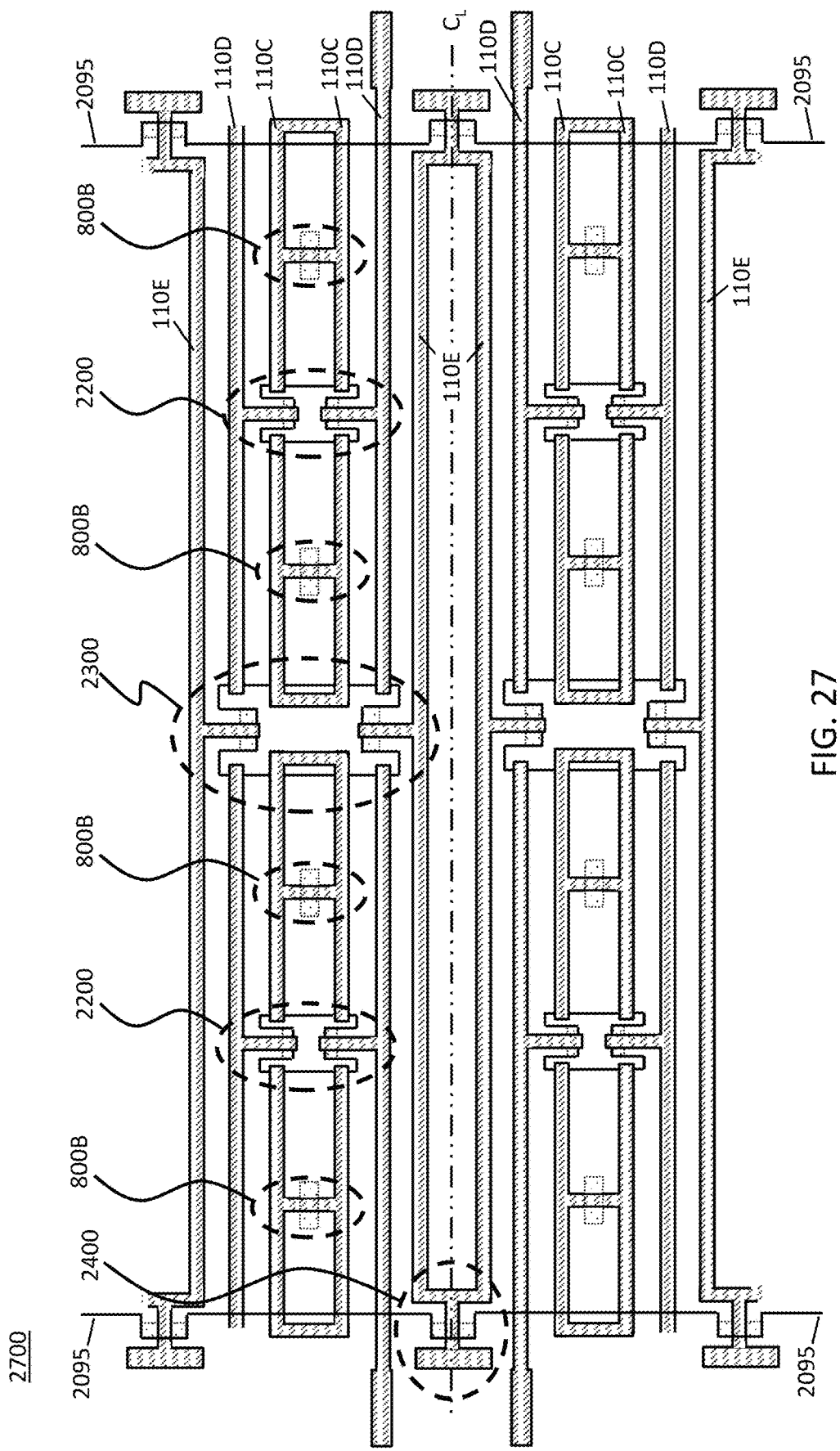
FIG. 27 shows a full width structure of the cascode configuration represented by FIG. 20B with butted body ties according to FIG. 8B, FIG. 22, FIG. 23 and FIG. 24 provided to the various fingers of the transistors of the cascode configuration.

FIG. 27 shows a full width structure (2700) of the three transistor cascode stack of FIG. 20B fitted with butted body ties according to the various teachings of the present disclosure for a reduced physical size of the cascode stack. FIG. 27 shows four fingers of each of the transistors $T_C$, $T_D$ and $T_E$ mirrored about a centerline of a drain region of the (top) transistor $T_E$, the top transistor being defined by gate polysilicon regions (110E). As can be seen in FIG. 27, the top two fingers of the transistors $T_C$, $T_D$ and $T_E$ are further mirrored about a centerline of a source region of the bottom transistor $T_C$, the source region being contained within a region defined by the two gate polysilicon structures (110C) of the bottom transistor $T_C$, and the bottom two fingers of the transistors $T_C$, $T_D$ and $T_E$ are further mirrored about a centerline of a source region of the bottom transistor $T_C$, the source region being contained within a region defined by the two gate polysilicon structures (110C) of the bottom transistor $T_C$.

With further reference to FIG. 27, each finger (defined by structure 110E) of the top transistor $T_E$ of the cascode stack is provided with one butted body tie structure (2300), each finger (defined by structure 110D) of the middle transistor $T_D$ is provided with two butted body tie structures (2200), and each finger (defined by structure 110C) of the bottom transistor $T_C$ is provided with four butted body tie structures (800B), where details of the butted body tie structures (800B, 2200, 2300) are provided above with reference to FIG. 26.

With continued reference to FIG. 27, butted body ties (2400) according to the teachings of the present disclosure discussed above with reference to FIG. 24 are provided to the fingers of the top transistor $T_E$ which define the centerline drain region of the (cascode) structure (2700) of FIG. 27. Such butted body tie (2400) comprises structures (2410, 2420, 2450, 2460) described above with reference to FIG. 24. The fingers of the top transistor $T_E$ which define the centerline drain region therefore have one butted body tie structure (2300) at a midpoint of the width of the structure (2700) and two butted body tie structures (2400) at the opposite extremes of the width.

Figure 28:
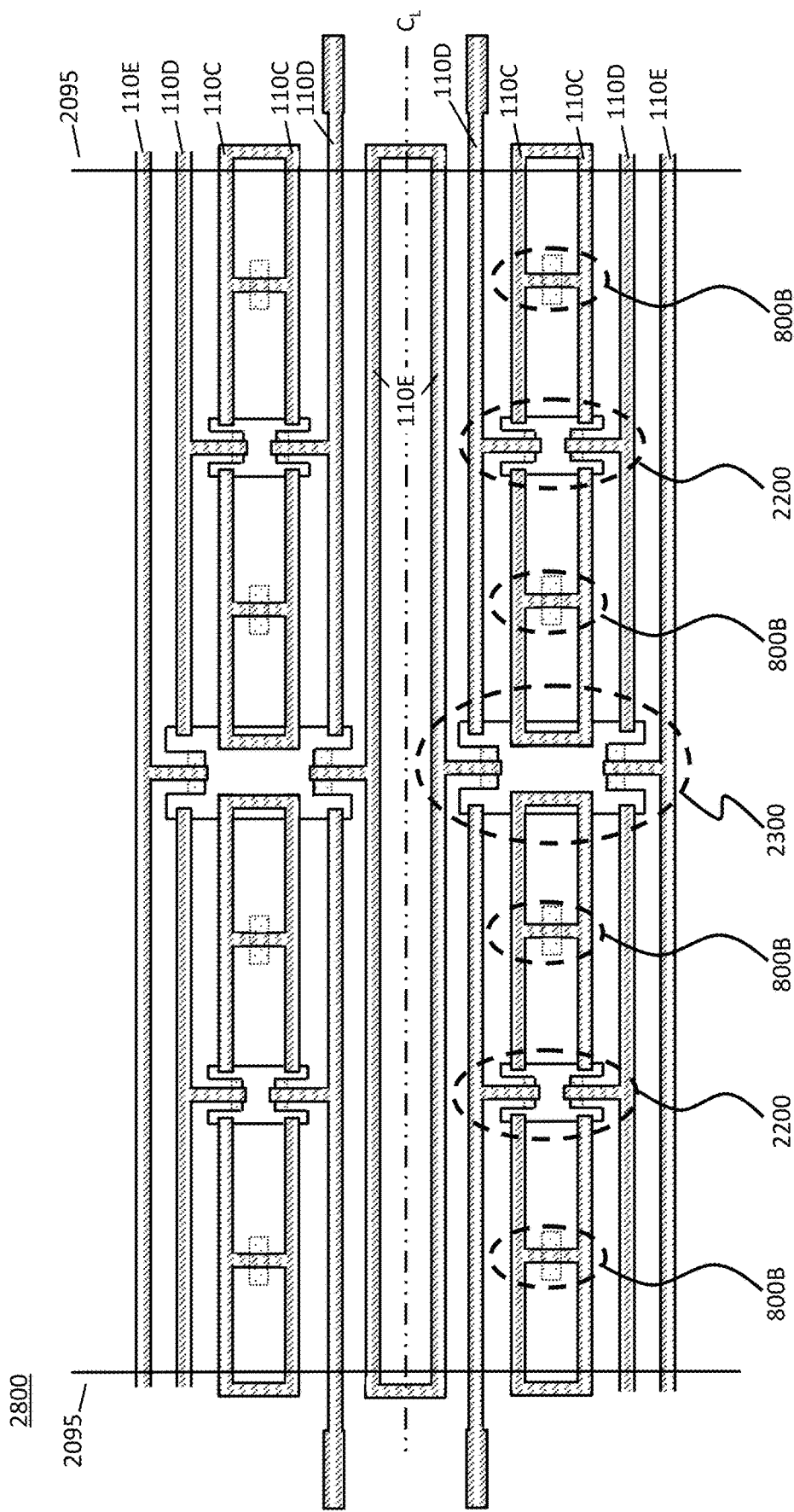
FIG. 28 shows a full width structure of the cascode configuration represented by FIG. 20B with butted body ties according to FIG. 8B, FIG. 22 and FIG. 23 provided to the various fingers of the transistors of the cascode configuration.

FIG. 28 shows the same full width structure of FIG. 27, with the exception that the butted body tie structures (2400) are removed, thereby leaving the fingers of the top transistor $T_E$ each with a single butted body tie structure (2300).

Figure 29A:
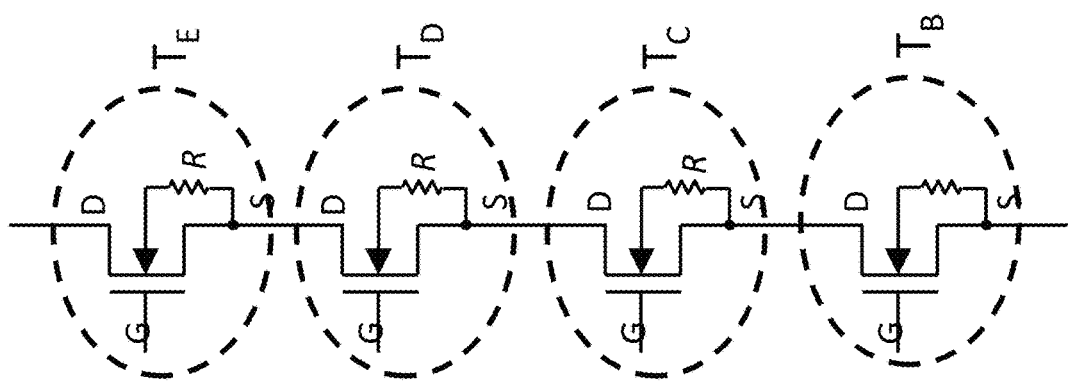
FIG. 29A shows a schematic representation of a cascode configuration comprising four stacked transistors.
Figure 29B:
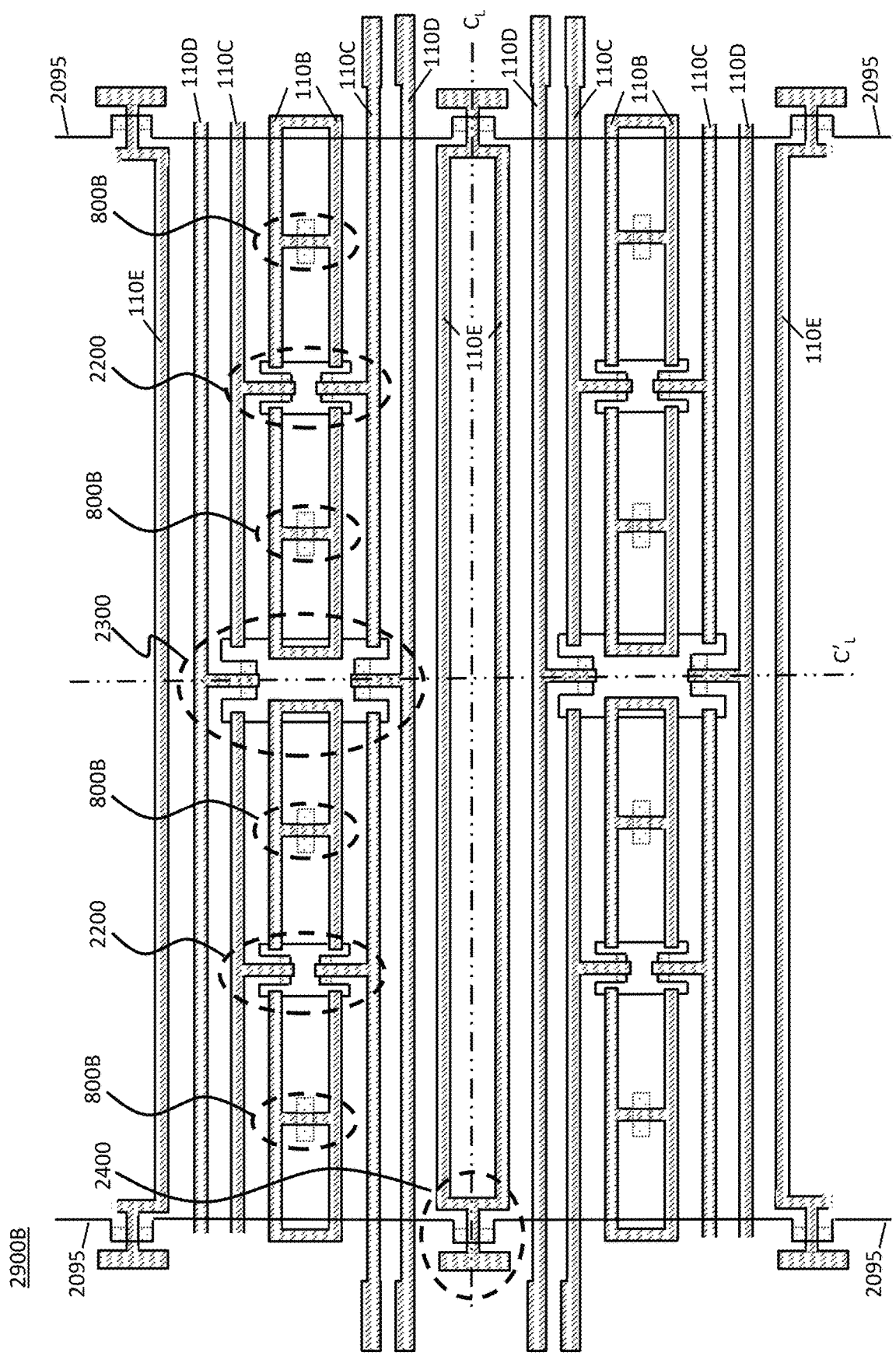
FIG. 29B shows a full width structure of the cascode configuration represented by FIG. 29A with butted body ties according to FIG. 8B, FIG. 22, FIG. 23 and FIG. 24, where butted body ties to the topmost transistor $T_E$ of the cascode configuration are according to the butted body tie of FIG. 24 only.

FIG. 29B shows a full width structure (2900B) of the four transistor cascode stack (2900A) of FIG. 29A fitted with body ties according to the various teachings of the present disclosure for a reduced physical size of the cascode stack. FIG. 29B shows four fingers of each of the transistors $T_B$, $T_C$, $T_D$ and $T_E$ mirrored about a centerline $C_L$ of a drain region of the (top) transistor $T_E$, the top transistor being defined by gate polysilicon regions (110E). As can be seen in FIG. 29B, the top two fingers of the transistors $T_B$, $T_C$, $T_D$ and $T_E$ are further mirrored about a centerline of a source region of the bottom transistor $T_B$, the source region being contained within a region defined by the two gate polysilicon structures (110B) of the bottom transistor $T_B$, and the bottom two fingers of the transistors $T_B$, $T_C$, $T_D$ and $T_E$ are further mirrored about a centerline of a source region of the bottom transistor $T_B$, the source region being contained within a region defined by the two gate polysilicon structures (110B) of the bottom transistor $T_B$.

With further reference to FIG. 29B, each finger (defined by structure 110E) of the top transistor $T_E$ of the cascode stack is provided with one butted body tie structure (2400), each finger (defined by structure 110D) of the transistor $T_D$ is provided with one butted body tie structures (2300), each finger (defined by structure 110C) of the transistor $T_C$ is provided with two butted body tie structures (2200), and each finger (defined by structure 110B) of the bottom transistor $T_B$ is provided with four butted body tie structures (800B), where details of the butted body tie structures (800B, 2200, 2300, 2400) are provided above with reference to FIG. 26 and FIG. 24. Contrary to the full width structure (2700) depicted in FIG. 27 described above, the full width structure (2900B) depicted in FIG. 29B provides only one type of butted body tie structure (structure 2400) to the top transistor of the cascode stack, as opposed to the two butted body ties structures (2300, 2400) provided to the top transistor of stack corresponding to the structure (2700).

As can be seen in FIG. 27, 28 and FIG. 29B, a body tab of a butted body tie structure (e.g. body tabs (510B, 510E) of body tie structures (2200, 2300) as shown in FIGS. 22-23) to a finger of a transistor (e.g. $T_E$, $T_D$) is provided by forming a break in a gate polysilicon structure of an adjacent finger of a next (lower) transistor (e.g. $T_D$, $T_C$). In turn, a body tab (e.g. 510D) of a butted body tie to the next transistor (e.g. $T_D$) is provided by forming a break in a gate polysilicon structure of an adjacent finger of a next (lower) transistor (e.g. $T_C$), and so on. Thereby, with each level, starting from a top transistor of a cascode stack of a plurality of transistors and going down to the bottom transistor of the cascode stack, the number of body tabs in a finger of a transistor of the cascode stack is doubled, as each segment of a broken gate polysilicon structure (110D . . . , 110C) can be provided with one body tab (of a butted body tie) which can require a break in an adjacent gate polysilicon structure. This is exemplified in FIG. 28, where a finger of the top transistor $T_E$ is provided with one butted body tie structure (2300) whose body tab (510E) is formed in a break region of the gate polysilicon structure (110D) of a finger of a next lower transistor $T_D$, thereby forming two distinct gate polysilicon structures (110D) on each side of the break, each, in turn, having one butted body tie structure (2200). The two butted body ties (2200) of the finger of the middle transistor $T_D$ in turn cause breaks in the gate polysilicon structures (110C), thereby forming, in conjunction with the break formed by the body tab (510E), four distinct (broken up) gate polysilicon structures (110C) for the finger of the lower transistor $T_C$. The person skilled in the art will realize that for cases where the cascode stack height is large, a large difference in number of breaks in gate polysilicon structures of fingers of lower transistors and higher transistors in the stack can exist. If desired, such large difference may be reduced by inserting butted body ties with no breaks in neighboring gate polysilicon structures, such as described above in relation to FIG. 21A, which effectively resets the above described doubling of the number of body tabs with each transistor level.

Finally, the person skilled in the art will understand that the various semiconductor structures depicted in the above figures can be physically laid out in a variety of patterns some of which may include symmetries with respect to various axis, as discussed, for example, with respect to the centerline $C_L$ of FIGS. 22-24, 27, 28 and 29B. According to some exemplary embodiments of the present disclosure, such semiconductor structures can (also) be symmetric with respect to a centerline C' L which passes through the center regions of the fingers of the cascoded transistors along the length of the fingers, as depicted in FIG. 29B.

The person skilled in the art will appreciate the cost advantages of the reduced physical size of the cascode configurations resulting from the smaller spacing allowed by the various butted body ties described above with reference to FIGS. 20A-28. Such reduction in physical size can also provide a performance advantage for RF circuits. For an application that requires a large number of transistor fingers, the closer proximity of the fingers allows shorter interconnect lengths to connect them. Excessive interconnect lengths needed to connect a large number of transistor fingers can introduce parasitic capacitance, resistance and inductance that can degrade RF performance.

Such semiconductors devices, including the cascoded configuration discussed above, fitted with the improved body tie construction according to the various teachings of the present disclosure can be used, for example, in radio frequency (RF) amplifiers, including, but not limited to, RF power amplifiers and cellular RF power amplifiers operating at various classes of operation, including, but not limited to, switching class D, E and F, saturated class B and C, and linear class A and A/B.

It should be noted that although the various exemplary embodiments according to the present disclosure were provided using an exemplary case of an N-type SOI MOSFET, such exemplary case was provided mainly for clarity purposes. The various embodiments of the butted body tie according to the present invention can be equally adapted to other transistor types and other transistor technologies, especially where the source and/or the drain regions extend down to an insulating layer such as a "BOX" layer of an SOI device.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures). Integrated circuit embodiments may be fabricated using any suitable substrates and processes, including but not limited to standard bulk silicon, silicon-on-insulator (SOI), silicon-on-sapphire (SOS), GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

It may be possible to execute the activities described herein in an order other than the order described. Various activities described with respect to the methods identified herein can be executed in repetitive, serial, or parallel fashion.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived there-from, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the present disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

The invention claimed is:

1. A semiconductor structure, comprising:
   a) a first transistor and a second transistor, each transistor of the first and second transistors comprising:
      a drain region having a first conductivity type;
      a source region having the first conductivity type;
      a body region having a second conductivity type;
      wherein the source region of the first transistor and the drain region of the second transistor are formed in a common source/drain region;
   b) at least one body contact region of the second conductivity type contained within the common source/drain region;
   c) an isolation region configured to electrically isolate the at least one body contact region from the common source/drain region; and
   d) at least one body tab of the second conductivity type configured to electrically connect the at least one body contact region to the body region of the first transistor.

2. The semiconductor structure according to claim 1, wherein:
   the at least one body tab comprises a first end that contacts the body region of the first transistor and a second end that contacts the at least one body contact region.

3. The semiconductor structure according to claim 1, wherein:
   the isolation region is of the second conductivity type.

4. The semiconductor structure according to claim 1, wherein:
   the isolation region is electrically connected to the body region of the first transistor.

5. The semiconductor structure according to claim 1, wherein:
   the isolation region is electrically connected to the body region of the first transistor through the at least one body tab.

6. The semiconductor structure according to claim 1, wherein:
   the at least one body contact region is fully contained within the common source/drain region.

7. The semiconductor structure according to claim 1, wherein:
   the at least one body contact region is fully surrounded by regions of the second conductivity type.

8. The semiconductor structure according to claim 1, wherein:
   the isolation region and the at least one body tab region are contiguous.

9. The semiconductor structure according to claim 1, further comprising:
   an additional body contact region of the second conductivity type contained within the source region of the second transistor; and
   an additional body tab of the second conductivity type in contact with the body region of the second transistor and the additional body contact region.

10. The semiconductor structure according to claim 9, wherein:
    the additional body tab is configured to electrically connect the additional body contact region to the body region of the second transistor.

11. The semiconductor structure according to claim 9, further comprising:
    a last body contact region of the second conductivity type fully contained within a region that abuts the source region of the second transistor; and
    a last body tab of the second conductivity type in contact with the body region of the second transistor and the last body contact region, the last body tab configured to electrically connect the last body contact region to the body region of the second transistor.

12. The semiconductor structure according to claim 1, further comprising:
    an additional one or more body tabs of the second conductivity type in contact with the body region of the first transistor and the at least one body contact region.

13. The semiconductor structure according to claim 12, wherein:
    the at least one body contact region comprises two or more body contact regions.

14. The semiconductor structure according to claim 1, further comprising:
    a conductive contact atop a portion of the at least one body contact region.

15. The semiconductor structure according to claim 1, wherein:
    the at least one body contact region is partially contained within the common source/drain region.

16. The semiconductor structure according to claim 1, wherein:
    the semiconductor structure further comprises a non-conductive isolation region formed in the common source/drain region, the non-conductive isolation region configured to form an interruption in a region of the body region of the second transistor to divide the body region into separate body regions.

17. The semiconductor structure according to claim 16, wherein:
    the non-conductive isolation region is further configured to extend the interruption into the source region of the second transistor.

18. The semiconductor structure according to claim 16, wherein:
    the at least one body contact region abuts the non-conductive isolation region.

19. The semiconductor structure according to claim 16, wherein:
    the interruption divides the source region of the second transistor into separate source regions.

20. The semiconductor structure according to claim 1, wherein:
    each transistor of the first and second transistors is a silicon-on-insulator (SOI) transistor, fabricated using a silicon-on-insulator (SOI) technology.

21. The semiconductor structure according to claim 20, wherein:
    a silicon layer of the SOI transistor is a thin-film silicon layer.

22. The semiconductor structure according to claim 20, further comprising:
    an insulating layer; and
    a silicon layer overlying the insulating layer,
    wherein the drain region, the source region and the body region of each transistor of the first and second transistors, the at least one body contact region, and the at least one body tab are formed in the silicon layer and extend through the silicon layer to reach the insulating layer.

23. The semiconductor structure according to claim 1, further comprising:
    at least one polysilicon tab configured to define the at least one body tab.

24. An amplifier circuit comprising the semiconductor structure according to claim 1.

* * * * *